(12) United States Patent
Zhang et al.

(10) Patent No.: US 10,970,441 B1
(45) Date of Patent: Apr. 6, 2021

(54) SYSTEM AND METHOD USING NEURAL NETWORKS FOR ANALOG-TO-INFORMATION PROCESSORS

(71) Applicant: Washington University, St. Louis, MO (US)

(72) Inventors: Xuan Zhang, St. Louis, MO (US); Ayan Chakrabarti, St. Louis, MO (US)

(73) Assignee: Washington University, St. Louis, MO (US)

( * ) Notice: Subject to any disclaimer, the term of this patent is extended or adjusted under 35 U.S.C. 154(b) by 0 days.

(21) Appl. No.: 16/285,985

(22) Filed: Feb. 26, 2019

Related U.S. Application Data

(60) Provisional application No. 62/635,200, filed on Feb. 26, 2018.

(51) Int. Cl.
| | | |
|---|---|---|
| *G06F 17/50* | (2006.01) | |
| *G06F 30/327* | (2020.01) | |
| *G06N 3/04* | (2006.01) | |
| *G06F 30/33* | (2020.01) | |
| *G06F 30/20* | (2020.01) | |
| *G06F 30/27* | (2020.01) | |

(52) U.S. Cl.
CPC ............ *G06F 30/327* (2020.01); *G06F 30/33* (2020.01); *G06N 3/0472* (2013.01); *G06F 30/20* (2020.01); *G06F 30/27* (2020.01)

(58) Field of Classification Search
CPC ........ G06F 30/327; G06F 30/33; G06F 30/20; G06F 30/27; G06N 3/0472
See application file for complete search history.

(56) References Cited

U.S. PATENT DOCUMENTS

| | | |
|---|---|---|
| 4,926,180 A | 5/1990 | Anastassiou |
| 5,068,662 A | 11/1991 | Guddanti et al. |
| 5,424,736 A | 6/1995 | Stryjewski |
| 5,455,583 A | 10/1995 | Stryjewski |
| 5,479,169 A | 12/1995 | Stryjewski |
| 5,742,741 A | 4/1998 | Chiueh et al. |
| 5,832,181 A | 11/1998 | Wang |
| 6,529,150 B1 | 3/2003 | Shoop et al. |
| 6,627,154 B1 | 9/2003 | Goodman et al. |

(Continued)

OTHER PUBLICATIONS

Hu et al. Memristor Crossbar-based Neuromorphic Computing System: A Case study, Oct. 2014, IEEE, vol. 25, pp. 1864-1878 (Year: 2014).*

*Primary Examiner* — Nghia M Doan
(74) *Attorney, Agent, or Firm* — Armstrong Teasdale LLP

(57) ABSTRACT

A neural network based learning system for designing a circuit, the design system including at least one memory, at least one processor in communication with said at least one memory, said at least one processor configured to generate a mathematical model of the circuit, determine a structural definition of the circuit from the mathematical model, define a mapping of a plurality of components of the circuit to a plurality of neurons representing the plurality of components of the circuit using at least the structural definition, synthesize, on a hardware substrate, the plurality of neurons, and execute, using the synthesized plurality of neurons on the hardware substrate, at least one test using at least one optimization constraint to determine an optimal arrangement of the plurality of components.

18 Claims, 33 Drawing Sheets

(56) References Cited

U.S. PATENT DOCUMENTS

| | | |
|---|---|---|
| 6,728,687 B2 | 4/2004 | Arena et al. |
| 6,803,956 B1 | 10/2004 | Hirono |
| 7,345,604 B2 | 3/2008 | Watson |
| 9,026,964 B2 * | 5/2015 | Mohanty .................. G06F 30/30 |
| | | 716/106 |
| 9,806,072 B2 | 10/2017 | Chang et al. |
| 10,055,434 B2 | 8/2018 | Birdwell et al. |
| 10,095,718 B2 | 10/2018 | Birdwell et al. |
| 10,127,494 B1 | 11/2018 | Cantin et al. |
| 10,141,069 B2 | 11/2018 | Ikeda et al. |
| 10,192,016 B2 * | 1/2019 | Ng ........................ G06F 30/327 |
| 2007/0236519 A1 | 10/2007 | Edelen et al. |
| 2008/0024345 A1 | 1/2008 | Watson |
| 2018/0181862 A1 | 6/2018 | Ikeda |
| 2019/0050719 A1 | 2/2019 | Cantin et al. |

* cited by examiner

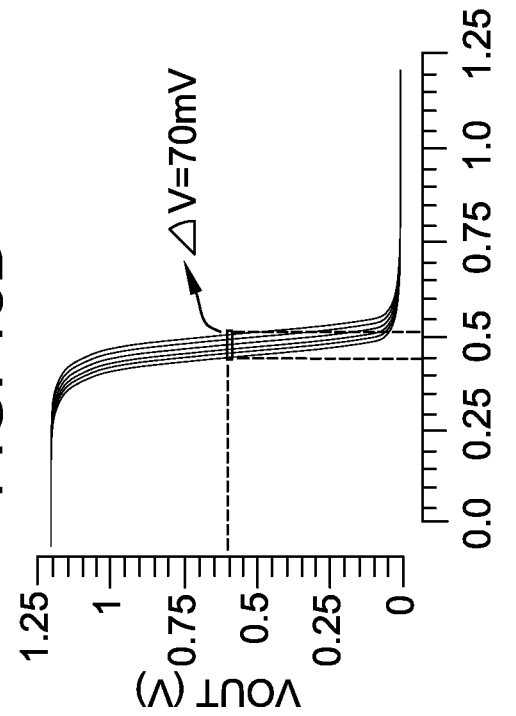
FIG. 18A
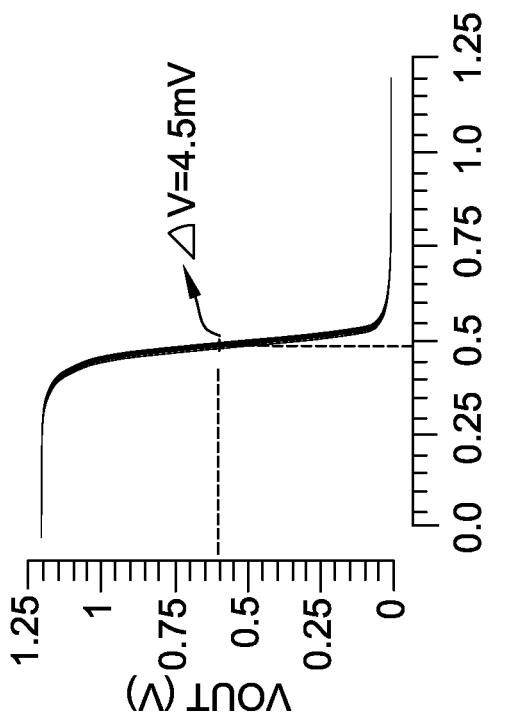
FIG. 18B
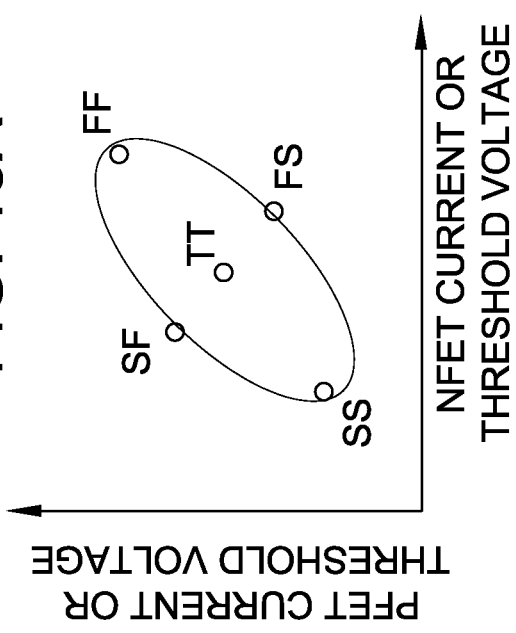
FIG. 18C
FIG. 18D

SYSTEM AND METHOD USING NEURAL NETWORKS FOR ANALOG-TO-INFORMATION PROCESSORS

CROSS-REFERENCE TO RELATED APPLICATION

This application claims priority to U.S. Provisional Application 62/635,200 filed on Feb. 26, 2018, the entirety of which is hereby incorporated by reference.

BACKGROUND

The field of the disclosure relates generally to analog-to-information processors.

Information is often processed and stored in a digital format. The physical world, however, is analog by nature. Whenever information about the physical world needs to be captured, data conversion is required. Creating a digital interface to the physical world requires identifying sources of data and extracting information from those signal sources. Analog-to-digital converters (ADC) along with their counterpart, digital-to-analog (DAC) converters therefore play an important role in connecting the physical world and the information world. These analog-to-digital circuit interface design is, however, a labor-intensive and time-consuming process involving many design iterations and substantial resources.

Current design objectives include building an ADC as close as possible to an ideal ADC model. But non-ideal factors, however, prevents ADC design from approximating an ideal model perfectly which leads to circuit failure. Furthermore, advances in technology such as autonomous systems, robotics, dense sensory arrays, energy limited devices, and high-speed and high-resolution scientific computing increases the demand for high performing ADCs. As the demand for processing bandwidth and speed increases, conventional ADC design models using pre-defined ideal parameters are unable to satisfy the analog-to-information processing requirements for target applications.

SUMMARY

In one aspect, a neural network based learning system for designing a circuit is provided. The design system including at least one memory, at least one processor in communication with the at least one memory, a mathematical model of the circuit, a structural definition of the circuit, a mapping of a plurality of components of the circuit to a plurality of neurons representing the plurality of components of the circuit, and at least one optimization constraint.

In another aspect, a neural network based learning system for designing a circuit is provided. The design system including at least one memory and at least one processor in communication with the at least one memory. The at least one processor is configured to generate a mathematical model of the circuit, determine a structural definition of the circuit from the mathematical model, define a mapping of a plurality of components of the circuit to a plurality of neurons representing the plurality of components of the circuit using at least the structural definition, synthesize, on a hardware substrate, the plurality of neurons, and execute, using the synthesized plurality of neurons on the hardware substrate, at least one test using at least one optimization constraint to determine an optimal arrangement of the plurality of components.

In a further aspect, a neural network based method for designing a circuit is provided. The method is implemented on a computer device including at least one processor in communication with at least one memory device. The method includes generating a mathematical model of the circuit, determining a structural definition of the circuit from the mathematical model, defining a mapping of a plurality of components of the circuit to a plurality of neurons representing the plurality of components of the circuit using at least the structural definition, synthesizing, on a hardware substrate, the plurality of neurons, and executing, using the synthesized plurality of neurons on the hardware substrate, at least one test using at least one optimization constraint to determine an optimal arrangement of the plurality of components.

BRIEF DESCRIPTION OF THE DRAWINGS

The following drawings illustrate various aspects of the disclosure.

FIG. 18(a) illustrates a graph of the feasible region to cover all five process corners variations in a corner plane;

FIG. 18(b) illustrates a graph of variation of a voltage transfer curve (VTC) under all five process corners by using a Monte Carlo simulation;

FIG. 18(c) illustrates a graph of a method to cover most region in the corner plane;

FIG. 18(d) illustrates a graph of variation of a VTC under a typical NMOS and PMOS corner by using a Monte Carlo simulation;

DETAILED DESCRIPTION

Figure 1:
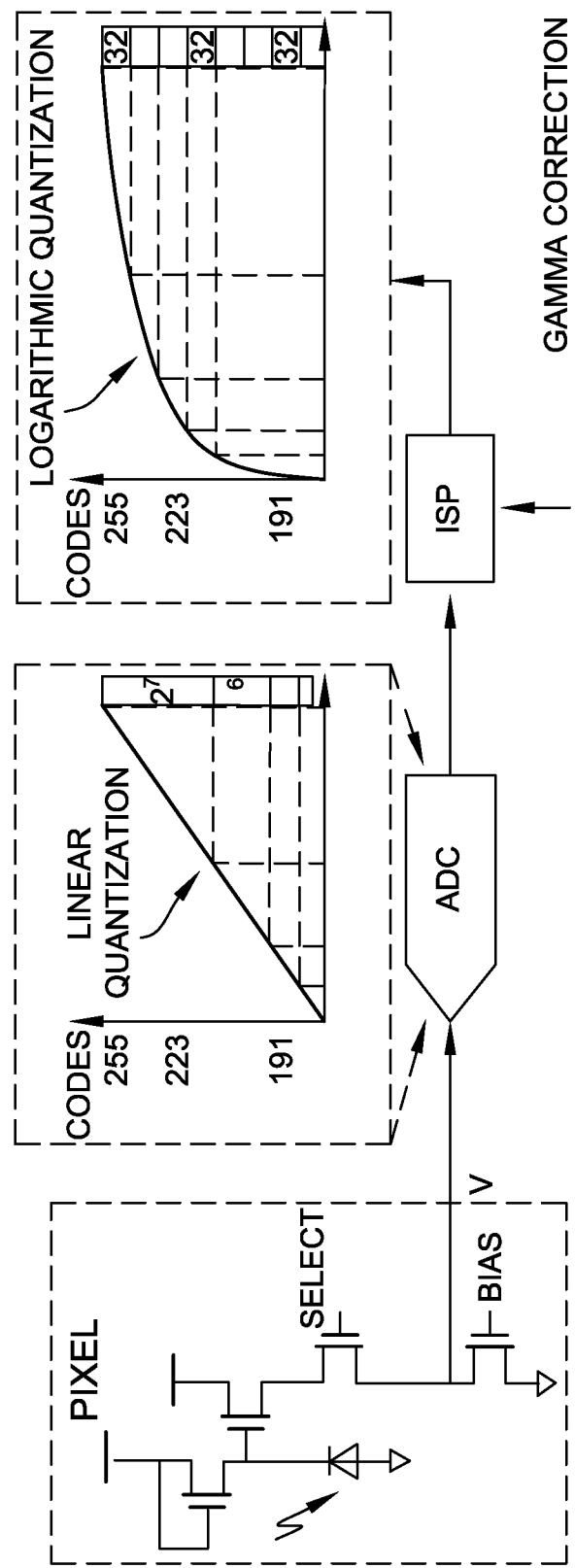
FIG. 1 illustrates an exemplary analog-to-digital converter (ADC) in an image sensor with linear quantization.

The systems and methods described herein relate to the design of analog-to-digital converters. Analog-to-digital converters (ADC) are a type of analog/mixed signal (AMS) circuits, and along with their counterpart digital-to-analog converters (DAC), are essential electronic interfaces connecting the physical world with the digital world. The various aspects, systems and methods for automated design of ADCs including machine learning on neural networks are disclosed.

Whenever a signal needs to cross the artificial divide from the natural to the digital, data conversion is required to bridge the analog-to-digital boundary. Use of ADCs and DACs are the quintessential electronic interfaces to connect the physical and the information worlds. Despite its crucial role, design and optimization of data converters remain largely a manual process involving time-consuming design iterations and expensive designer-hours.

Unlike digital circuits with well-automated design flow and optimization methodology, design of analog mixed-signal (AMS) circuits, such as ADCs and DACs, are treated more like an art than science, and often demands extensive training and years of hands-on experience of the circuit designers to learn the "dark magic" of their trade. The heavy reliance on human experts and the lack of design automation severely limit productivity improvement and performance enhancement for AMS circuits, causing a hindrance to the system development process.

In addition to the challenge of keeping up with the performance specifications under continued technology scaling and supply voltage reduction, analog-to-digital interfaces also face new demands from emerging applications due to their ubiquitous and indispensable presence in diverse electronic systems: For example, the burgeoning Internet-of-Things (IoT) prompt a proliferation of ultra low-power sensing and monitoring systems. To sustain a long battery life, they demand extreme energy efficiency beyond what can be achieved by modern ADCs. They also generate unprecedented amount of sensor data to be captured, processed, stored, and communicated, putting an emphasis on extracting useful information or signatures, rather than full reconstruction of the original signal waveforms. These emerging low power IoT applications call for alternative digitization schemes to minimize energy consumption, reduce communication bandwidth, and alleviate later-stage processing.

In other cases, smart and autonomous systems such as self-driving cars and unmanned aerial vehicles present different challenges for ADCs. Unlike the always-on reactive sensing in many IoT devices with modest latency requirements, robotic systems usually rely on high-bandwidth data streaming from multiple active sensors to drive their subsequent actions and decision makings. They employ a wide range of sensing modalities such as camera, LIDAR, and radar simultaneously and require low-latency real-time data conversion. Since signal and noise conditions vary under different operating scenarios and environmental circumstances, opportunities exist to exploit optimal information extraction across multiple sensor channels and modalities and optimize trade-off between performance and power. Such advanced capability can only be achieved by extremely versatile A/D interfaces that can learn from the sensor front-end. In other situations such as robotic systems, there is a heavy reliance on high-bandwidth data streaming from multiple active sensors for driving subsequent actions and decision makings. These systems employ a wide range of sensing modalities such as camera, LIDAR, and radar simultaneously and require low-latency real-time data conversion. Since signal and noise conditions vary under different operating scenarios and environmental circumstances, opportunities exist to exploit optimal information extraction across multiple sensor channels and modalities and optimize trade-off between performance and power. Such advanced capability can only be achieved with extremely versatile A/D interfaces that can learn from the sensor front-end.

These examples illustrate one recurring theme for next-generation analog-to-information interfaces that highlights the importance of optimizing for end-to-end performance and energy efficiency through tightly coupled vertical integration. Current standalone "blackbox" approaches have difficulty satisfying requirements. A new approach that blurs the previously rigid boundary between the sensor and AMS front-end and the digital processing and computation back-end is needed to merge the artificial divide across analog and digital domains to facilitate maximal information extraction and fluid signal flow. An automated process for designing the analog-to-information interfacing systems would substantially reduce the costs associated with designing optimized ADC tailored to specific applications. Furthermore, achieving design objectives that include optimization parameters unique to hardware limitations would improve the efficiency and performance of ADCs.

As integrated circuits scale to more advanced technology with lower supply voltage, many challenges arise in designing scalable analog and mixed-signal (AMS) circuits, such as reduced intrinsic device gain, decreased signal swing, and aggravated device mismatch. As one of the quintessential examples of AMS circuits, analog-to-digital converters (ADCs) face similar design challenges when being ported to smaller highly-scaled technology nodes. Traditional ADC circuits often require significant manual design iterations and re-spins to meet the desirable performance specifications in a new process. Previous research has explored synthesizable and scaling-compatible ADC topologies to automate this expensive and time-consuming design process. One example is the stochastic flash ADCs that make use of the intrinsic input offsets of minimum-sized digital comparators. However, stochastic ADCs require a large number of hardware resources (~3840 comparators) and work only at relatively modest sampling rate (~8 MS/s) and resolution (~5.3-bit).

Another example is synthesis-friendly time-domain delta-sigma ADCs, but they still require manual modifications of a standard cell and designer's knowledge for floor-planning. Despite its crucial role, the lack of effective design automation severely limits the productivity improvement and performance enhancement for the AMS circuits, causing major bottleneck in IC development.

In addition to the design automation challenge, ADCs also face new demands from many emerging applications. For example, in-memory computation in the analog domain using non-volatile memory (NVM) arrays has been proposed to accelerate neural network inference and training for deep learning applications, where ADCs play a critical role at the analog-to-digital (A/D) interface, yet few existing work specifically addresses the compatibility of ADC designs to NVM process. The ability to support flexible quantization schemes is another desirable property that can benefit a variety of sensor front-end interfaces where ADCs reside in. For instance, image sensors require logarithmic quantizations to realize uniform distribution of exposure. Traditionally, as shown in FIG. 1, the logarithmic quantization step is performed in the digital domain by the back-end image signal processor (ISP) through a specific Gamma Correction stage, as the standard ADCs used in the image sensor front-end only implements normal linear quantization. Therefore, a reconfigurable front-end ADC supporting different quantization schemes can obvi-ate the need to perform certain image processing steps such as Gamma Correction later in the digital domain, resulting in better preservation of useful information and improved power saving and energy efficiency.

This disclosure describes a novel design approach for automatic ADC synthesis that can address the aforementioned imminent challenges facing the traditional ADC design paradigm. As described herein, this new design is called NeuADC, as it is based on neural network (NN). The systems described herein are founded on a deep learning framework and implemented by using mixed-signal resistive random-access memory (RRAM) cross bar architecture, including RRAM, an NVM technology. In the exemplary embodiment, the RRAM is used as a testbed to facilitate the scaling-compatible and portability-friendly features of this system.

In the exemplary embodiment, the NeuADC framework formulates the ADC design as a NN learning problem, where the learning objective is to approximate multiple desirable quantization functions for A/D conversion. This NeuADC framework is compatible with many effective training techniques developed for deep learning and allows them to be seamlessly incorporated into ADC design automation.

The NeuADC framework includes an NN-inspired design methodology to model the A/D interfaces and transform the traditional ADC design problem into a learning problem. This approach allows for employing learning techniques in AMS design automation.

The NeuADC framework also includes a dual-path RRAM crossbar architecture to facilitate mixed-signal vector matrix multiplication (VMM) required by NeuADC in a scaling-compatible manner, along with an inverter voltage transfer curve (VTC) based activation function to implement the non-linear activation function (NAF).

The NeuADC framework further includes offline training techniques and a smooth bits encoding scheme to obtain robust trained weight parameters that account for device and circuit level non-idealities including process, supply voltage, and temperature variations (PVT) of the CMOS transistors and the limited resolution of the RRAM devices.

In addition, the NeuADC framework includes a fully-automated design flow to synthesize the proposed NeuADC circuits based on SPICE simulation results based on the automatically synthesized netlist. The SPICE simulation results are used to validate the competitive performance of the proposed NeuADC and its ability to support multiple reconfigurable quantization schemes, and also reveal the impacts on the ADC quantization quality from the NN-level parameters (i.e. hidden neuron sizes and number of output bits) and device-level characteristics, as well as the design trade-off between speed, power and area in a NeuADC circuit.

The design system automates the layout and design of ADCs for fabrication by embedding learning algorithms in the hardware substrate. A neural network model is generated for an ADC as a mathematical abstraction for the underlying analog and mixed-signal circuits. The neural network implements learning by executing signal tests and examining analog inputs and digital outputs. In some embodiments, the design system may be provided ideal inputs. Analysis of the analog inputs and digital outputs is used for learning and a mathematical model is generated from the learning.

The ADC can be automatically synthesized based on a mathematical model that is developed from the learning algorithm applied to the analog signal. The model formulates the ADC design optimization objective as a neural network learning problem. Hardware neurons are fabricated to perform the same computations in the mathematical model. A block of neurons implemented as an array of hardware neurons therefore perform the same tasks as what is performed computationally by the learning algorithm. The blocks of neurons are programmed to behave according to the learned "weights".

In some embodiments, the design system uses a synthesized neural network. A neural network, in the example embodiment, is defined by a set of neurons in communication. Synthesis of the neural network may be on a hardware substrate (e.g., ReRAM, etc.) or may be simulated on a computer system. A user may define optimization parameters for the ADC. Machine learning is then applied to the model.

Figure 2A:
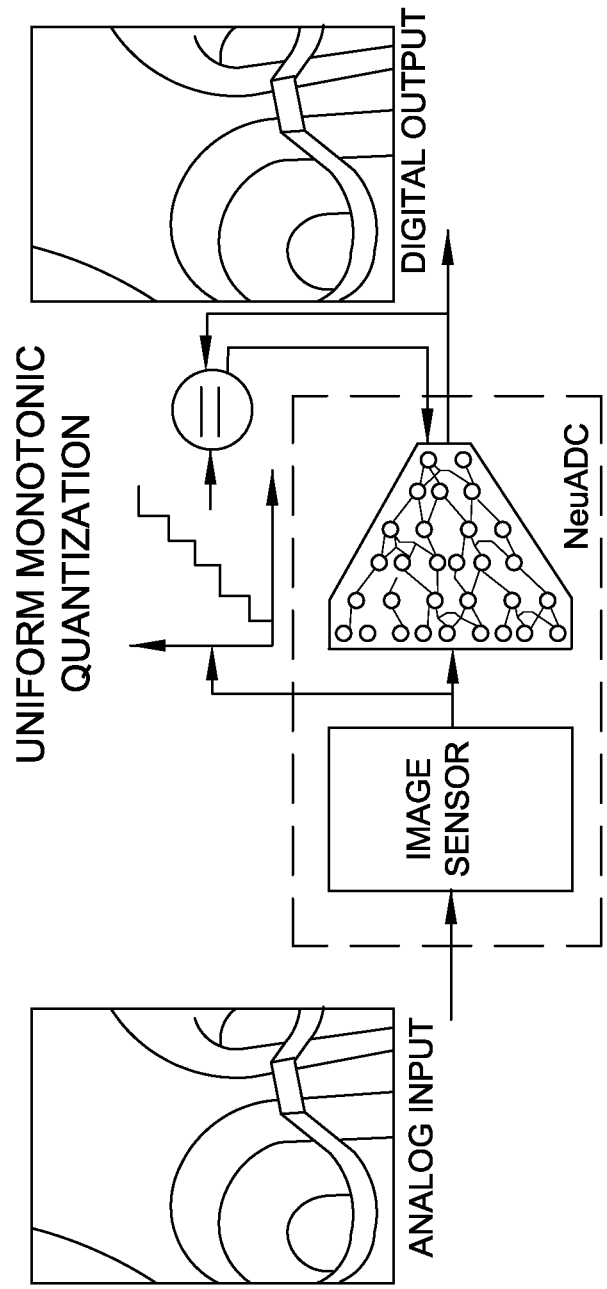
FIGS. 2A-2C each illustrates examples of design systems in accordance with one embodiment of the disclosure.
Figure 2B:
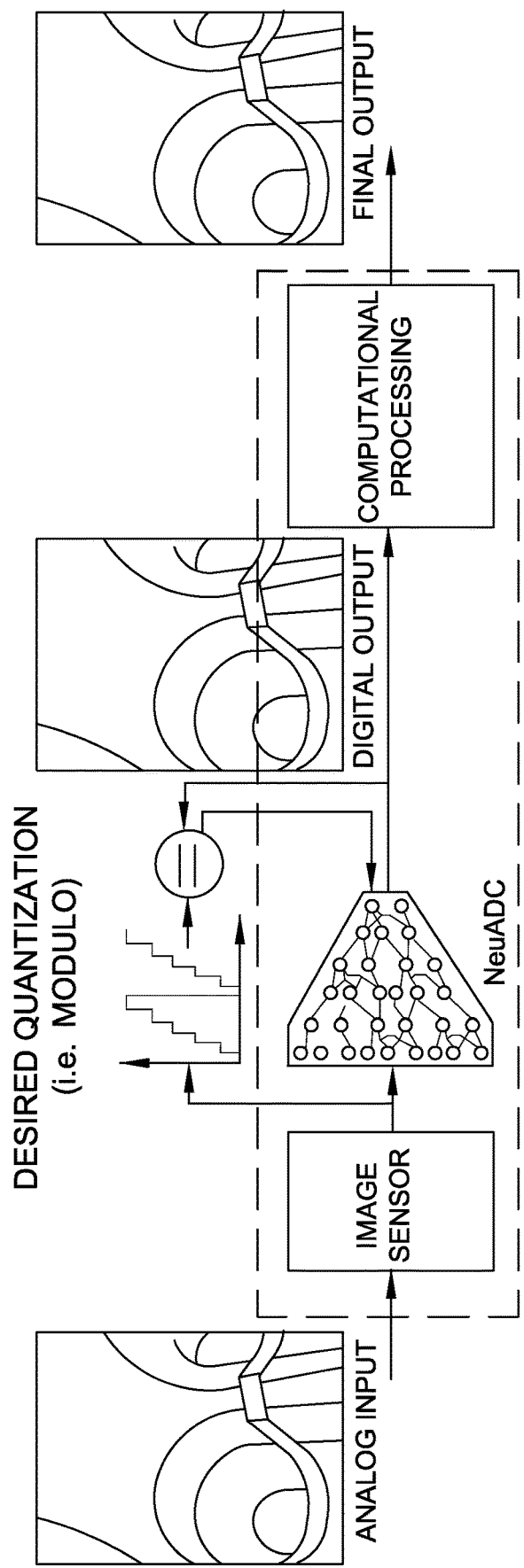

In the example embodiment, the ADC optimization objective is a quantization function. As shown in FIG. 2, the framework can be trained to implement both traditional monotonic quantization as shown in FIG. 2(a), or non-traditional quantization optimized for further processing as shown in FIG. 2(b). In some embodiments, the ADC may be further optimized by factors such as physical size, semiconductor materials characteristics, energy consumption, processing bandwidth, and computational performance (e.g., processing speed). The design system exploits the deep learning framework to unify design-time and deploy-time optimization across circuit, architecture, and algorithm layers in a vertically integrated system stack.

Neural network parameters are identified by using learning algorithms (e.g., stochastic gradient descent) as explained herein. The embodiments described herein include the use of simple circuit blocks idealized as neurons in a neural network. In this manner, a learning process may be efficiently applied to the neural network using a series of inputs and outputs to determine an optimal configuration of circuitry. The burden of optimization is therefore directed to the learning process to learn a weight for non-ideal factors. Adopting the native circuit is a key element in the advantages of the design system. For increasing complexity, scalable techniques are used to accommodate with size of the neural network. As the demands for a more complex ADC increases, the design system is able to scale without reduction in benefits from the optimization.

The block of neurons can be configured based on varying factors to achieve different performance characteristics. For example, the converter can be designed to be a fast but coarse (low resolution) converter or slow but very high resolution converter. Or, for example, an amplitude vs differential/derivative may be selected where the neural network may be fed a time sequence to achieve time derivative learned algorithm. The advantage is that reprogramming the neurons is not necessary.

In the example embodiment, non-idealities (e.g., noise, interference, etc.) are incorporated into the learning process. Neural network techniques such as Dropout, explained herein, for training deep neural networks may be used to improve robustness. Universal learning allows reprogramming the neurons using any analog input. Past methods provide a fixed analog input, however, the design system overcomes the limitation by providing a flexible approach.

The example embodiment described herein provides a unifying design and optimization paradigm for A/D interfaces that embeds intrinsic learning capability directly into the hardware substrate. The design system infuses learning into the AMS domain and enables intelligent and agile A/D interfaces with better performance, higher energy efficiency, and lower design cost, empowering myriad of electronic systems. The design system not only implements AMS design automation, one of the perennial challenges in the electronic design automation (EDA) community, but also transforms the role of ADCs by exposing their internal trade-offs for end-to-end optimization.

Data converter circuits that help bridge the analog and the digital domains belong to the most classic AMS circuits and have existed since the early days of integrated circuits. They are categorized into Nyquist-rate and oversampling converters and can be further broken down by architectures. For example, some of the most popular ADC architectures include flash ADCs, pipeline ADCs, successive approximation (SAR) ADCs, and sigma-delta (IA) ADCs. Each architecture exhibits its own idiosyncratic performance characteristics, hence one of the key steps in early design process is to determine the right architecture for the target application. This choice is fixed at design time, and cannot be reconfigured later.

Despite evolution of the converter architectures and circuits, the basic quality metrics used to evaluate data conversion stay relatively stable. Usually, the concept of an ideal quantization function is introduced, and the goal is to best approximate this ideal function. Widely-accepted performance metrics include signal to noise and distortion ratio (SNDR) and effective number of bits (ENOB) to depict resolution and differential nonlinearity (DNL) and integral nonlinearity (INL) to measure nonlinearity. Although a pre-determined ideal quantization provides clear definition of converter specification, it casts a negative effect on the classic converter design that is utterly shielded away from cross-block cross-layer system interactions.

Certain design trade-offs can be captured by various figure-of-merit (FoM). For instance, the Walden FoM, defined as $P/(fs*2^{ENOB})$) the ratio between power consumption and the product of sampling frequency and $2^{ENOB}$ reveals the fundamental tradeoff between adding an extra bit of resolution and doubling the bandwidth. This coarse level of information may offer some insight to human designers in a manual process, but it cannot be readily applied in an automated design flow. Use of the datasheet remains the dominant method to communicate circuit trade-offs by crudely listing various measured or simulated performance curves, be it for discrete components or third-party intellectual property (IP) blocks. Without intimate knowledge at the circuit level, it is extremely difficult, if not outright impossible, for system architects and algorithm developers to effectively leverage converter trade-off and explore cross-layer optimal solutions following current IC design practice.

Moreover, conventional converter design is an intensive manual process that requires designers to master a large body of domain knowledge. Many classic converter architectures also rely on high-performance analog blocks, such as operational amplifier and integrator, which exhibit severe performance degradation in highly scaled nanometer processes with significantly reduced voltage headroom. The result is a time-consuming and labor-intensive process to painstakingly craft custom converter circuits for even minute modifications to the specifications or assiduously porting existing design to advanced technology nodes for routine system upgrades.

At least some methods have been proposed to overcome the limitations of traditional ADC design. One approach includes replacing the scaling-unfriendly analog components in the converter circuits with digital-style components. An extreme example is stochastic flash ADC, which not only adopts minimum-sized digital-gate-style comparators, but also intentionally exploits the large standard deviation of comparator offsets. Another example of scaling-compatible/A converter uses voltage-controlled oscillator (VCO) as basic building block to circumvent the limitation of low supply voltage in advanced processes. These design strategies embrace digital-style circuits to alleviate the impact of scaling and lower supply power however they still treat data conversion as a stand-alone black-box. Their ad-hoc methods are confined within a specific architecture and therefore do not provide useful ways to merge the relationship between the architecture and algorithm layers.

The concept known as "analog-to-information" (AoI) is another trend that deals with A/D interfaces. AoI emerges with the introduction of a sub-Nyquist sampling technique called compressive sensing (CS) which exploits the sparsity of the signal waveforms resulting in a lower information rate than the typical Nyquist rate. Therefore, it is possible to significantly narrow down the analog bandwidth and hence the sampling frequency of the data converter to save power. CS techniques can be implemented in the analog domain through various non-uniform sampling and modulate-andintegrate schemes. In a similar vein, embedding basic arithmetic functions such as inner product directly within the converter architecture facilitates machine learning-based feature extraction and reduces the transmission bandwidth. The common thread is the explicit exploitation of algorithm advantage in circuit design by moving computation close to or even inside the data conversion circuits to gain performance improvement or energy efficiency. Yet, existing AoI methods focus on implementation of specific applications, assuming random CS matrices or hand-selected feature vectors. They fail to introduce a general framework that fully embraces the learning ability of cutting-edge artificial intelligence technology.

The present embodiment of data conversion performs ideal discretization of continuous analog signals using pre-defined ideal quantization, which results in huge volume of data from separate signal channels of extremely high bandwidth awaiting to be processed through their respective pipelines, exerting heavy computational demand. Such information bandwidth and processing demand often far exceed the communication and computing capacity available to the system. Future intelligent platforms of versatile applications, be it energy-harvesting IoT devices, agile autonomous drones, or dense detector arrays for ultra-fast super-resolution scientific imaging, require a more advanced design to bridge the A/D boundary.

The present embodiment described herein include A/D interfaces infused with the ability to learn the optimal quantization schemes across signal channel and sensing modalities in the context of a desirable target application, achieving end-to-end performance and efficiency. The example embodiment describes three essential components of the design system: (i) a deep learning framework that introduces a neuron network (NN) abstraction for AMS circuits and the formulation of approximating quantization functions which unifies design-time and deploy-time optimization across circuit, architecture, and algorithm layers in a vertically-integrated system stack; (ii) an automated design system that exploits the inherent error tolerance property of NNs to overcome circuit non-idealities and process variations on a robust scalable hardware substrate amenable to synthesis and compilation in which a malleable converter architecture is achieved through the composition of a network with reconfigurable topology and programmable weights, enabling automated generation of universal "general-purpose" A/D interfaces; and (iii) joint learning for computation and quantization with later-stage computation via backpropagation to obtain optimal information extraction for end-to-end performance and efficiency.

The following fundamental capabilities are achieved with the described design system: (i) automated design and optimization framework for universal analog-to-digital interfaces based on neural network inspired circuit abstraction of atomic building blocks in data converters; (ii) circuit-level implementation using a synthesis-friendly scalable hardware substrate; (iii) hardware architecture and algorithm co-design methodology using the underlying reconfigurable hardware fabrics to exploit application-specific malleable architecture with dynamic reconfiguration; and (iv) end-to-end learning of computation and quantization. The design system provides a streamlined design flow and development toolchain with both the hardware platform and the software tools to implement the proposed paradigm combining data conversion and learning, validated and evaluated experimentally with silicon prototypes across broad applications.

In various aspects, the design system generates a neural network model for an ADC as a mathematical abstraction of the underlying analog and mixed-signal circuits. The model formulates the ADC design optimization objective as a neural network learning problem. The design system uses a synthesized neural network defined by a set of neurons in communication. Additionally or alternatively, a user may define optimization parameters for the ADC.

In the example embodiment, the design framework includes machine learning techniques and optimization algorithms that have been successfully used to approximate complex computational tasks with deep neural networks. In addition, mathematical tools are used to build mathematical models and abstractions for circuit and device elements. The design system also includes optimization algorithms that are able to find high-fidelity approximations of idealized functional mappings (See FIGS. 3A and 3B) while satisfying different physical and resource constraints while remaining robust to process variations and external noises. These tools form the foundation of circuit implementation, architecture exploration, and computation co-design.

AMS circuits suffer from a lack of clear and expressive abstractions for design automation. There exists a rich set of tools to automatically decompose complex large-scale boolean functions into simple building blocks, which can then be composed hierarchically to automatically synthesize a circuit. AMS circuits, on the other hand, deal with continuous valued inputs and outputs, and building automated means of analyzing, decomposing, and implementing (even if approximately) complex continuous functions is far more challenging. AMS circuits are vulnerable to process variations (e.g., environment noise, etc.) unlike boolean gates with superior noise tolerance and logic regeneration property. While some circuit variations can be calibrated post-fabrication, these techniques are limited by on-chip resources and cannot scale to fully calibrate the vast design space of typical AMS circuits.

The example embodiment therefore includes deep neural networks. Deep neural networks are composed of a large number of neurons. Each neuron carries out relatively simple computations. In some embodiments, the neurons carryout a linear combination of a small number of inputs, followed by a non-linearity applied on that combination. Using these simple neurons as building blocks, and organizing them hierarchically into layers, approximate functions of immense complexity is achieved (e.g., language translation, visual object recognition). These networks can theoretically express these complex functions (established by the universal approximation theorem), but also practically solve the optimization problem required to find the network parameters that implement a specific desired function using stochastic gradient descent (SGD). In the example embodiment, the differentiable continuous-valued functions are beneficial as they admit gradient computation through backpropagation.

Given a desired quantization function the circuit is intended to implement, a "network architecture" or set of basic circuit blocks that are combined with a fixed connectivity structure. Each block has tunable parameters. The input-output relationship of each block as a function of the parameters is modeled, and then "learned" using the parameters to minimize the approximation error between the desired output and that produced by a hardware neuron network, over the range of possible inputs. This provides a functional description of the circuit as a neural network (NN). Gradients are computed through back-propagation provided the output of each block is a differentiable function of its inputs and the parameters. In the example embodiment, training is accomplished using SGD. The design system is feasible even when the functions are stochastic and therefore may be implemented in the presence of non-idealities (e.g., noise and variations) to overcome hardware limitations where other design methods may be deficient.

Figure 3A:
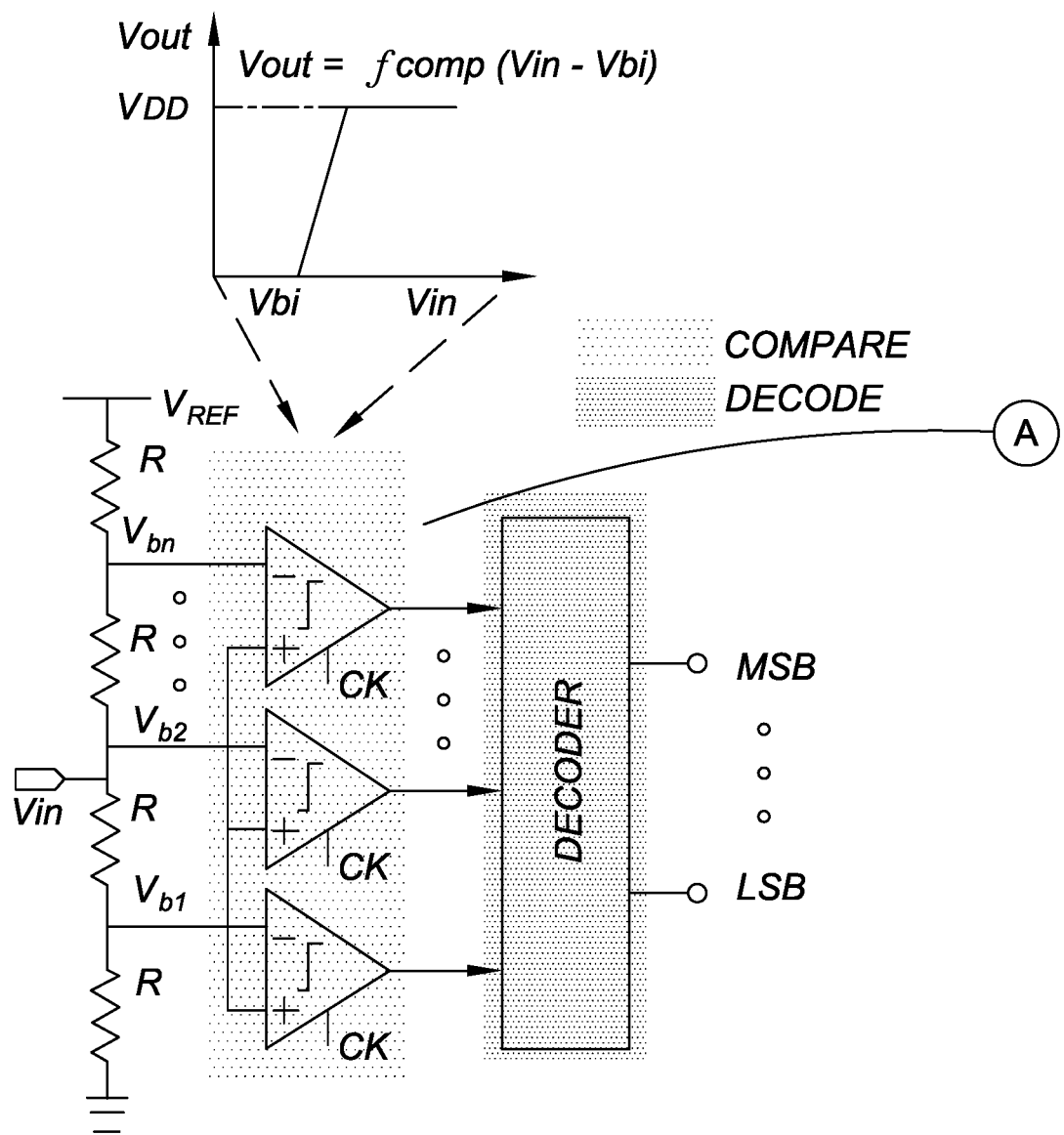
FIGS. 3A and 3B illustrate an example flowchart for mapping of components to neurons.
Figure 3B:
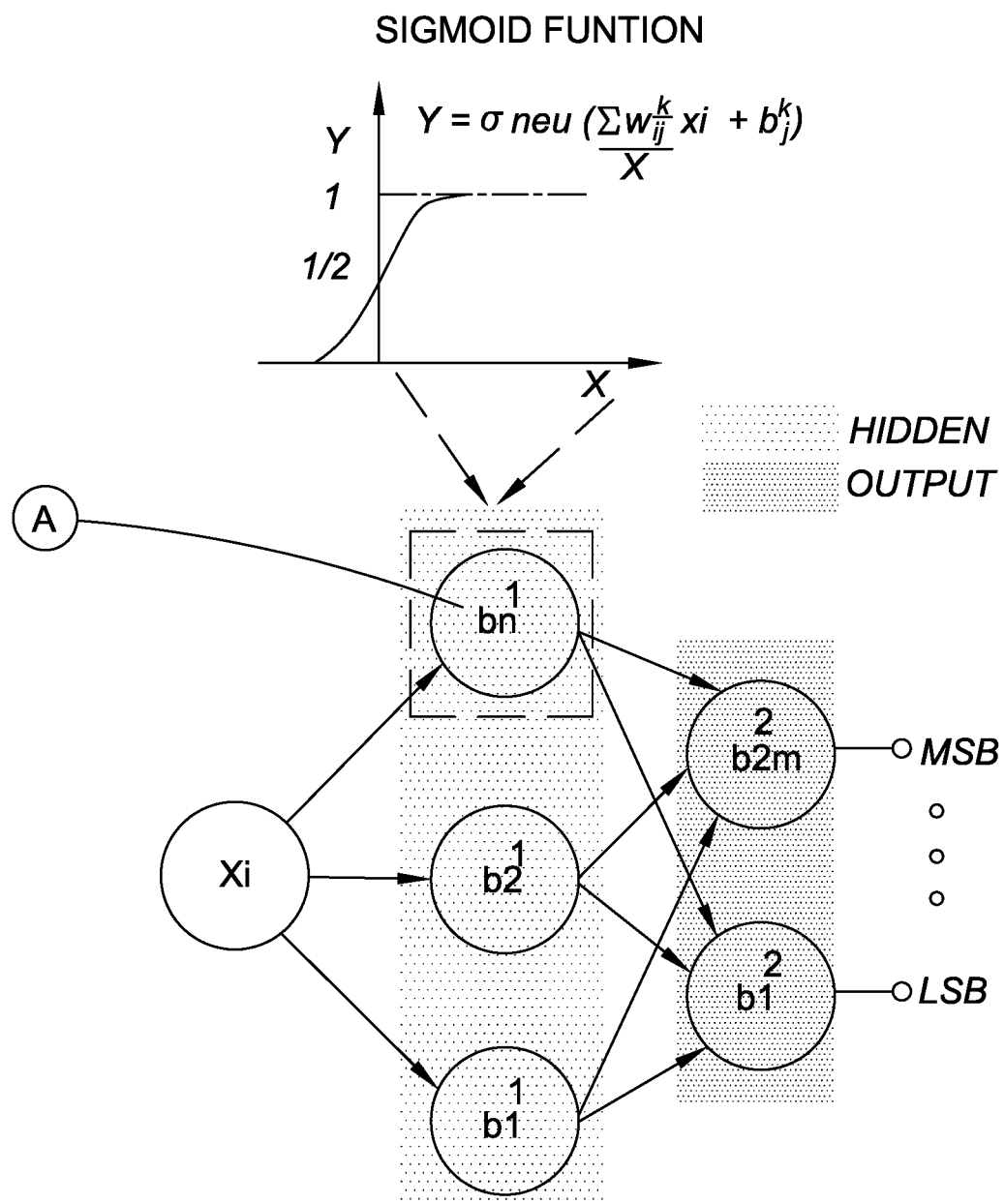

In other embodiments, a mathematical model with a straightforward mapping between a flash ADC is used (shown in FIGS. 3A and 3B). The model consists of a number of 1-bit comparators, and a NN with a single hidden layer (shown in FIGS. 3A and 3B). In the classic flash ADC implementation, the "weights" are all fixed a priori, they can be trained to implement a uniform quantization function following the optimization method in deep learning. The design system is able to learn different weights corresponding to ADCs with different number of output bits by training it with the ideal digitalization outputs. The design system sweeps the number of hidden-layer neurons to evaluate the quantization performance of the learned NN that behaves as an ADC. The accuracy of approximating a 2-bit quantization function with increasing number of neurons increases with the number of hidden neurons (shown in FIG. 5). In addition, the minimum number of hidden neurons required to realize ideal quantization of different ENOB is increased as the number of number of bits required for the desired quantization is increased (shown in FIG. 6).

The automatically learned design approximates the quantization function with increasing fidelity as circuit complexity increases. The number of bits that can be implemented increases linearly with the number of neurons. The result is preferred over classic or stochastic flash ADCs, both of which require an exponential number of comparators to achieve a given number of bits. The design system provides improved use of available circuit resources to maximize fidelity to the target function.

A key component of casting AMS circuit design as an optimization problem lies in selecting the optimization objective. Given a function (i.e. quantization) to be implemented, the circuit needs to be optimized to minimize some measure of approximation error. This error measure, or loss function, needs to have two properties. Firstly, during the initial iterations of training when the error is high, its gradients should provide a meaningful direction for the network to improve its performance. Secondly, towards the end of training, the loss function should promote a close approximation of the target function across its full range of inputs. In the example embodiments (shown in FIGS. 3A and 3B), use of squared error between desired and actual output values, averaged over the range of inputs. However, in some cases, the network learns to minimize this error by having extremely low-errors for most inputs, and significantly higher errors for a sparse set of input values—those corresponding to a sharp discontinuity in the target function. While this does minimize average error, occasional high magnitude errors may be unacceptable even if they are rare. Therefore in some embodiments, robust loss functions that promote good "worst case" performance, while also ensuring fast convergence with SGD are used.

While FIGS. 3A and 3B show a simple converter architecture, the design system can process a large number of hardware neuron elements, and build accurate model of their input-output relationships, and then learn their parameters through back-propagation. Different circuit elements will involve different kinds of intrinsic non-linearities (beyond the simple sigmoids). However, neural networks have been trained successfully with a variety of different activation functions (sigmoid, tan h, ReLU, PReLU, ELU, etc.), and the example embodiment uses a similar strategy. A potential challenge may be certain circuit elements where the defined parameters are discrete (for example, one of N configurations). In such cases, the output is not strictly a differentiable function of this parameter. However, such parameters can be learned with a real-valued relaxation of the discrete label as was used in previous work.

In other embodiments, the design system automatically learns the trade-off between function approximation quality and design complexity and resource constraints. Note that the architecture considered in FIGS. 3A and 3B has dense connections between all hidden units and the outputs and inputs. In practice, this may lead to designs that require larger fan-ins and fan-outs (or in the worst case, are infeasible to fabricate). On the other hand, a-priori limits to the connectivity of the circuit according to hand-crafted rules may prove to be sub-optimal. Therefore, where sparse connectivity is included as a part of the training objective the network will be initialized to have dense connections, but then add a weighted penalty to the training cost function on the number of connections that have non-zero weights. This will allow the network to automatically discover the optimal way to prune the set of possible connections, since zero-weight connections need not be fabricated. In some embodiments, connection penalties that are synergistic with compact layouts are used. For example, group sparsity penalties that promote dense connections between small groups of units rather than the same number of connections between arbitrary unit pairs, may be used if the designs are easier to implement.

One of the concerns in AMS circuits is the presence of process variations during fabrication, and other nonidealities (noise, interference, etc.) during operation. In some embodiments, analysis of the performance of the implemented function is further performed by adding random deviations in the neurons to simulate process variations. While this does degrade performance, the learned weights are already relatively robust for this simple network. Moreover, the proposed framework makes it easy to come up with circuit designs that are robust to such kinds of non-idealities. The design system incorporates non-idealities into the neuron models for circuit elements, where the neuron output is made to depend additionally on random variables that are sampled from a probability distribution that models the statistics of deviations due to these non-idealities. By instantiating different values of these variables in each iteration of training, the network will learn to minimize approximation error in the presence of these deviations, and converge to a circuit design that is robust to these deviations. The design system is motivated by the success of techniques (e.g., Dropout, etc.) for training deep neural networks, where significant noise is added to neuron activations during training, and leads to network models that are more robust.

The NN-inspired design abstraction described above provides signal digitalization by transforming it to training a multi-layer neural network to approximate the desired quantization function. The design system described herein also tackles the problem of realizing the NN in hardware in an efficient and scalable manner that leads naturally to automated synthesis and compilation.

Typical neural networks follow layer-wise composition, and the basic neuron model consists of two essential functions at its heart—vector matrix multiplication (VMM) and activation function. In the example embodiment, the design system uses a composable strategy by designing a generalized hardware substrate that can natively support computation of one neural network layer in the AMS mode. One distinctive feature that improves upon other design methods using AMS matrix multiplier is the use of analog mode to propagate through multiple neural network layers without converting it back to digital mode. It is critical to preserve useful information carried in the analog signal until it is fully assimilated by the network, thus avoiding the irreversible and abrupt loss of information at the A/D boundary when conventional data conversion is performed. Moreover, since many existing AMS multipliers are designed as an energy-efficient arithmetic building block inside a bigger machine learning core, they often ignore the implication of weight programming and storage, and assume they are provided externally. The example embodiment also differs from previous design systems on hardware analog neurons, which attempt to model the circuit after either the canonical mathematical form of ANN or the more bio-plausible spiking neuron model. These designs tend to involve complicated analog-style circuits or use transistors in the sub-threshold domain for its exponential property and high gain, but usually falter at large-scale integration and scale poorly at advanced technology nodes.

Figure 7:
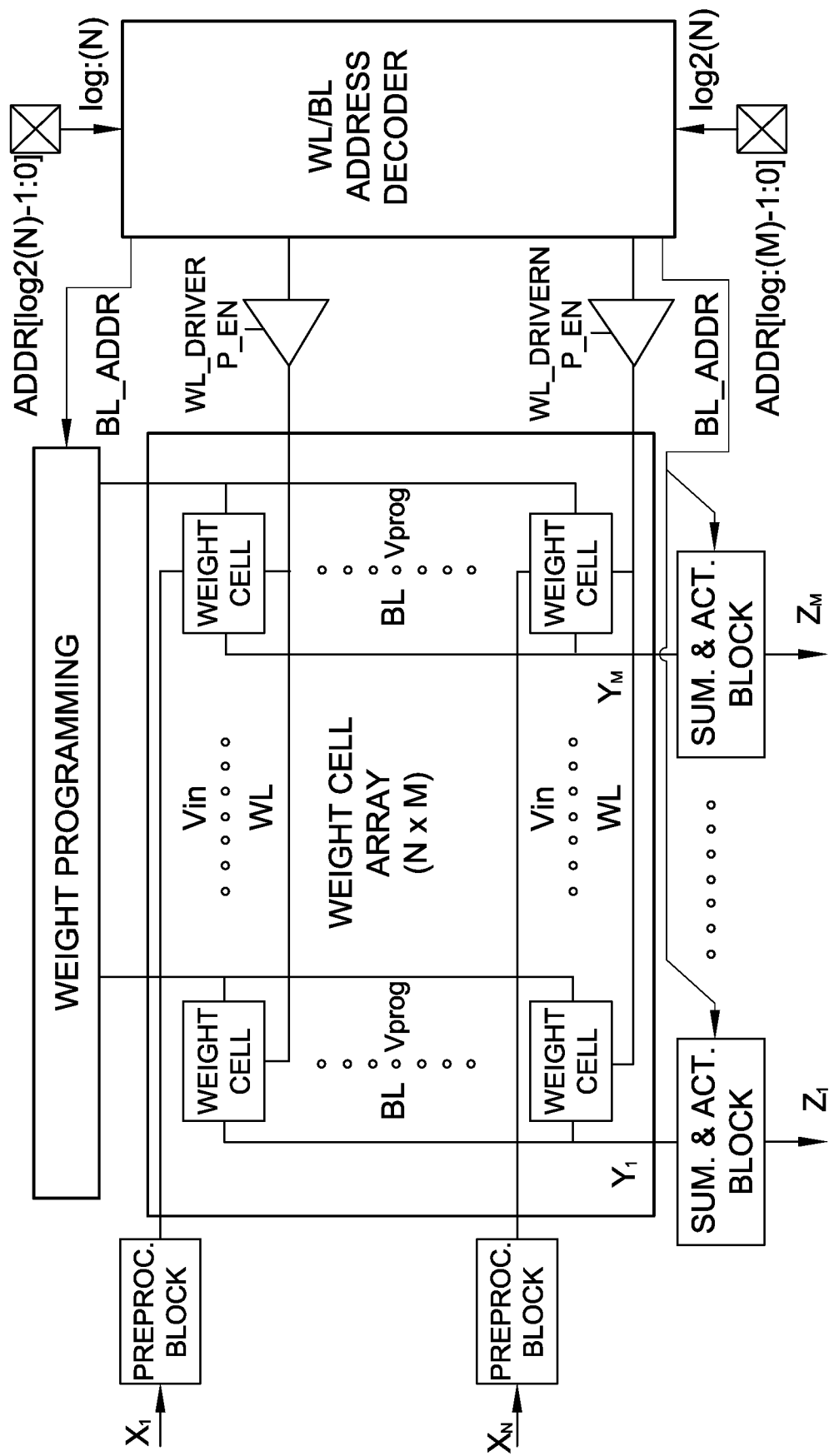
FIG. 7 illustrates an example architecture for a hardware substrate.

To address the challenge of storing large 2D weight matrix and performing a multitude of operations for multi-input-multi-output (MIMO) neural network layers simultaneously, a flexible yet efficient hardware substrate is used to realize a general NN engine by embracing in-memory computation. FIG. 7 illustrates the overall architecture of the proposed hardware substrate. The central component of the system is a N×M weight array that stores the 2D weight matrix for a fully-connected NN layer that consists of N input neurons and M output neurons. Typical address decoder circuits and column programming circuits are included to operate the weight array in programming/loading mode, when each weight value can be programmed according to the results from the training process. However, in addition to the normal memory mode, the weight array can operate in a computing mode that performs NN computation in the AMS domain. In the NN engine, computation is achieved on the shared bitline (BL) between the weight cells in the same column. Assuming that Xi, i=1, ... N, are the analog values representing the input vector from previous layer, they should be modulated (multiplied) by $W_{i,j}$, i=1, ... N, the values stored in the $j^{th}$ column, then summed together to derive $Y_j$, which is fed to the activation function to arrive at 4, the value at the $j^{th}$ output neuron. Since one of the most notable advantages of analog computing is the straightforward realization of multi-input summation by shorting the wires to combine currents/charges, it drives the design system to implement the matrix multiplication in the charge domain. Another contributing factor for charge-domain computation is its low-power potential to temporarily store, transfer, and propagate an analog value, as compared to the current-domain implementation which consumes static power.

Performing multiplication requires careful design consideration. Dictated by the fundamental physical laws governing the electron charges, there are three ways to realize multiplication—as a product of current and time (I*T), capacitance and voltage (C*V), and conductance and voltage over a fixed time (G*V*T). Although each implementation strategy may require different variations of per-row preprocessing blocks (PB) and per-column summation and activation blocks (SAB), they can be accommodated with a unified architecture in FIG. 7.

Floating-gate enabled IT multiplication: Floating-gate transistor is a technology widely used in non-volatile flash memory, and it has been previously demonstrated that a floating-gate memory cell can be reliably programmed and precisely tuned via ionized hot-electron injection (IHEI) and Fowler-Nordheim (FN) tunneling to deliver highly accurate current levels. If the weight parameters can be stored as current levels using floating-gate transistors in the weight array, the $X_i$ parameters are converted in the input vector to a timing pulse whose width is linearly proportional to $X_i$ (a voltage level). This voltage-to-time conversion is performed by PB, resulting in a timing pulse that controls the access transistor in the weight cell to charge BL. With this approach, SAB can be realized by the BL and the activation inverter with their associated parasitic capacitances.

Charge redistribution based CV multiplication: While the IT approach can encode an analog weight using the floating-gate current in a single weight cell, the CV approach embeds the weight as binary digital bits across multiple weight cells. The basic principle is to use the weight bits to control a digitally weighted capacitor array (CDAC) that is pre-charged to $X_i$ during the sampling phase and share its charge with all the cells in the $j_{th}$ column via BL during the redistribution phase. In the example embodiment, the design system, instead of using classic capacitive DAC that requires $2^{b-1}$ weighted capacitor in the weight cell stored the $b^{th}$ bit of the weight parameter, uses a C-2C capacitive DAC implementation that allows a unit-sized capacitor ($C_{bit}$) to be controlled by each bit and minimizes capacitor area. By storing the charge representing $Y_j$ at the input of the activation inverter, which can be sized up to drive multiple weight columns in the NN engine of the next layer, the use of power-hungry operational amplifiers needed for active charge transfer is eliminated, and instead the design system relies on passive charge redistribution to perform multiplication.

Figure 8:
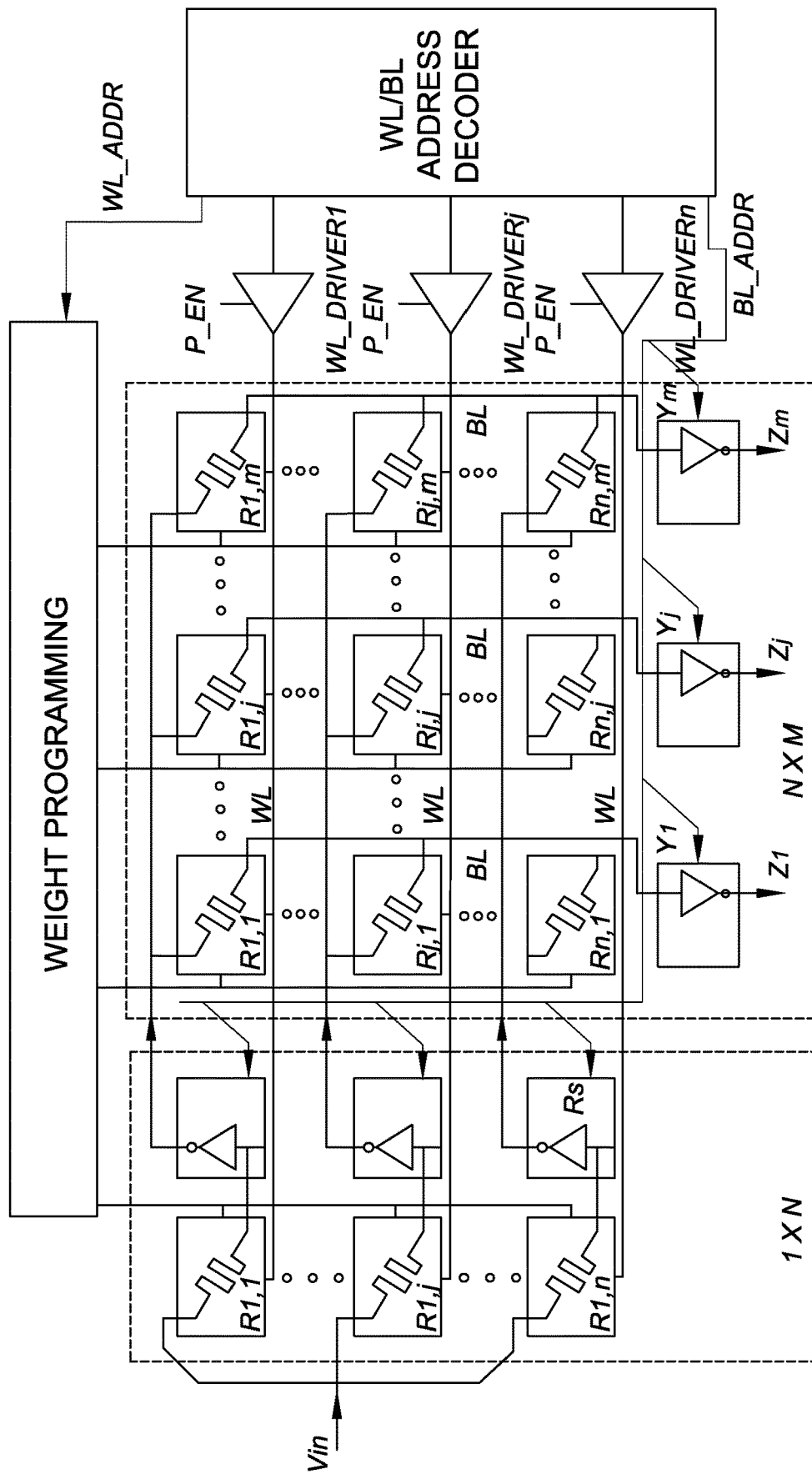
FIG. 8 illustrates a block diagram an example design system.

Efficient ReRAM compatible GVT multiplication: Finally, the BL computing architecture is also compatible with emerging ReRAM or memristor technology. Referred to as the GVT approach, the design system uses a ReRAM device to encode the analog weight as the conductance (G) or the inverse of the resistance (1/R) of the ReRAM device. ReRAM's ability to perform in-memory computation has been explored as NN accelerators, however, in the example embodiment, its application is in the context of data conversion. FIG. 8 shows an example ReRAM CROSSBAR™ architecture. Additionally or alternatively, while most previous systems use resistive current-to-voltage (I/V) converter techniques that consume static power, the design system deliberately replaces it with a capacitor and adopts charge pump techniques to save power.

To ensure logic level regeneration, one of the intrinsic properties of the digital logic is the S-shape of their voltage transfer characteristics (VTC). It suggests that a minimalistic implementation could directly use a single logic gate as simple as an inverter to accomplish the activation function. As discussed previously herein, the design system could customize the neural network algorithm by replacing the classic sigmoid or rectified linear unit (ReLU) functions with the native VTC curve of simple logic gates such as inverters or cross-coupled latch to minimize power, energy, and area. Compared to previous piecewise look-up table based activation function unit, the minimalistic logic gate implementation not only significantly reduces the hardware complexity, since exact mapping is not required, but it also emphasizes VTC's analog property to better preserve the original signal in the analog domain, making it unnecessary to achieve high voltage gain near the logic threshold and further loosen the performance requirements.

To summarize, the hardware substrate shown in FIG. 7 exhibits a number of unique and groundbreaking abilities: it is capable of fully performing the layer-wise MIMO NN operations in parallel; it supports processing-in-memory (PIM) with modular designs of per-row preprocessing and per-column summation and activation blocks; it is compatible with three different device technologies using the same unified system architecture; it employs minimalistic digital-style circuits and highly-regular memory-style architecture to achieve maximal level of scalability and resiliency in advanced sub-micron technology, commensurate with the most cutting-edge logic and memory processes. In some embodiments, the design system also includes automated schematic synthesizer and layout generator to compile the proposed hardware substrate based on high-level input of the neural network structure, such as the number of input/output neurons, the number of layers, and the network topology, much like the way memory IP is generated by modern memory compilers.

In some aspects, the design system includes methods to model, design, optimize, and implement the AMS core circuits to perform desirable quantization as a multi-layer neural network using a flexible hardware substrate as the per-layer NN engine. However, quantization is only the functional specification for converters, more importantly, performance metrics such as speed, resolution, and power/energy consumptions are demanded to satisfy the need of real-world applications. In the example embodiments described herein, the design system aim includes the methodology to construct malleable data conversion architectures based on the NN inspired framework that can demonstrate the ability to broadly traverse the design space of the A/D interface circuits and dynamically reconfigure network structure and update weight parameters for optimal "on-demand" performance trade-offs.

Conventional data converters employ different architectures to meet specific performance requirements of the target applications. Typically, the design space of ADC can be partitioned using the SNR metric—the high SNR space is dominated by $\Sigma\Delta$ ADC, whereas pipelined and flash architectures represent the moderate and low SNR spaces respectively. Since the underlying circuit implementations vary significantly, the choice of distinctive architecture has to be decided early in the design process and is irreversible at the post-fabrication stage. However, raw sensor signals from the physical world may span a much wider spectrum than a single circuit implementation of that a fixed converter architecture could accommodate. Moreover, the desirable performance trade-offs could vary dramatically in diverse applications under different use scenarios. Although some architectures may apply for a broad range of speed and resolution, such as pipeline and SAR, they rarely are accomplished by the same exact circuits, nor are they able to yield similar performance trade-offs, as is evident from the divergent figure-of-merit (FoM) numbers exhibited by converters with comparable speed and resolution. It further reveals a long-standing solution void in data conversion that no universal interfacing circuit exists to bridge the A/D boundary with broad coverage of the speed and resolution spectrum, as well as tunable performance trade-offs. Although previous works have enabled limited configurability within a single fixed converter architecture, none display the capability to cross the trade-off lines between heterogeneous architectures.

The design system described herein holds the key to unlocking this missing piece of a truly differentiating capability for data conversion. Given the generality of the model abstraction and the hardware substrate discussed previously herein, it is understood that the embodiments of the design system includes a universal interface that is achieved by exploring the reconfigurability of neural network topology and the programmability of the NN weight parameters. Further optimization of system-level trade-offs such as speed, resolution, and power/energy, can be obtained by enhancing modular blocks in the hardware substrate to exploit "just-in-time" performance trade-off.

A deeper look at different ADC architectures reveals that despite the disparity of their circuit implementations, the quantization step in these architectures is often performed by an ADC core that bears the resemblance of a low-resolution flash ADC. The previous discussion has established the methodology to build flash-style NeuADC using a feed-forward NN network. The example embodiment includes diverse ADC architectures that can be mapped to neural networks by varying their connectivity, beyond the multi-layer feed-forward topology. Using the pipeline ADC as an example, it is clear that its NeuADC equivalent preserves the core layers of a 2-bit flash ADC core, but extends the quantization over many more hidden layers to gradually digitize the succeeding bits from the most significant bit (MSB) to least significant bit (LSB). In this way, the intended performance trade-off in a pipeline architecture is reflected through the network topology. Such pipelined implementation of NeuADC can be trained to converge to ideal quantization with low error. In some embodiments, similar strategies can be used to sketch out the topology of the NeuADC equivalents for SAR and $\Sigma\Delta$ architectures as well. Both of them can be mapped to recurrent neural networks (RNN), where the network unfolds in time, but shares the weight parameters across time to minimize the network resources. Techniques such as dithering and noise shaping that are commonly used in oversampling ADCs can be readily incorporated into the RNN framework.

Figure 4A:
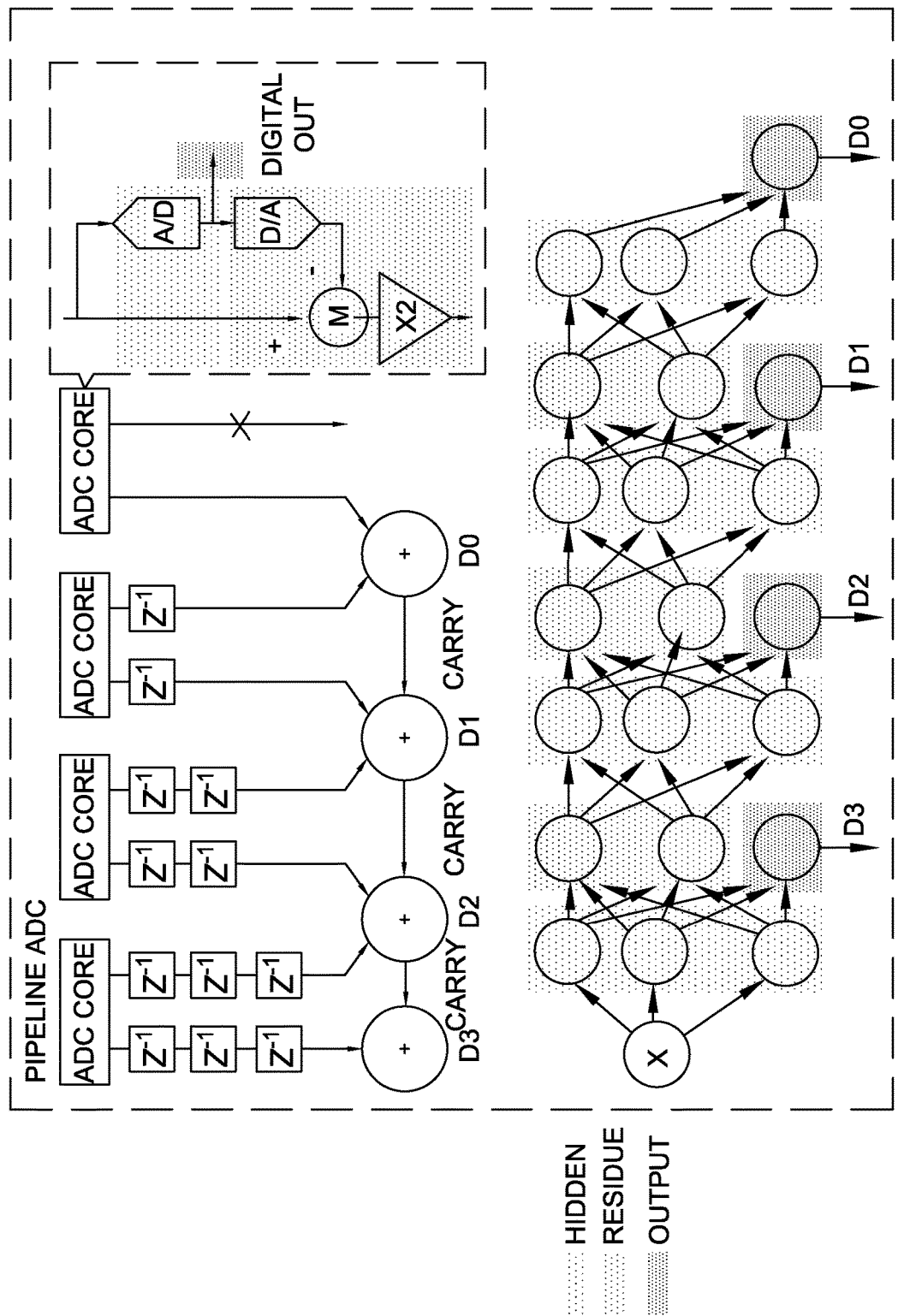
FIGS. 4A-4C illustrate flowcharts of example mapping results.
Figure 4B:
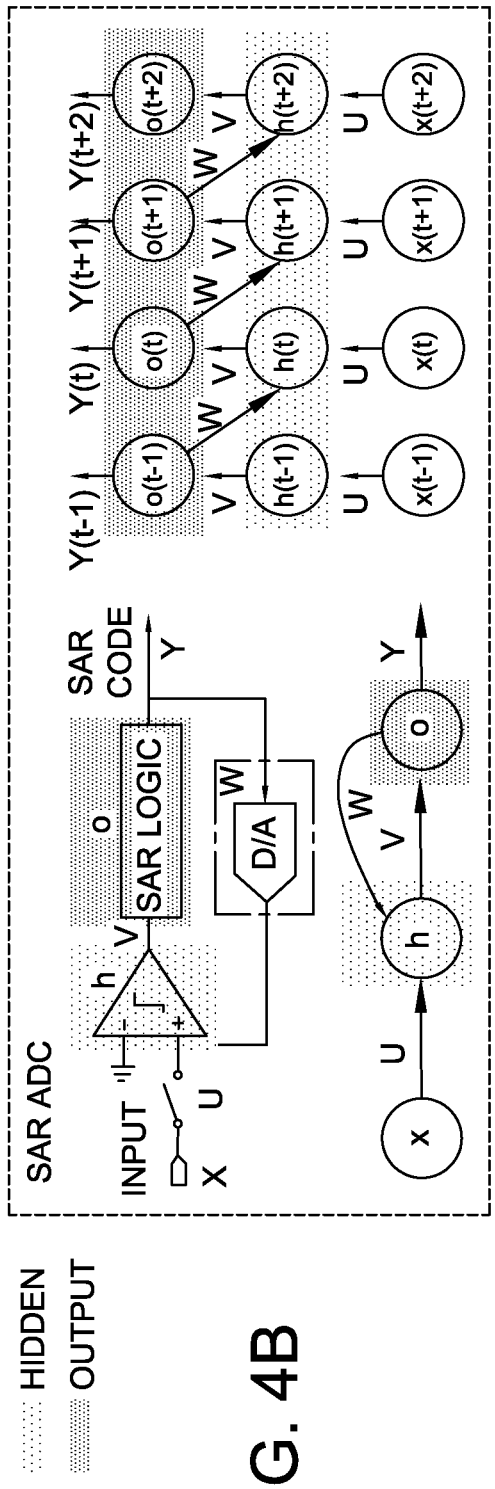
Figure 4C:
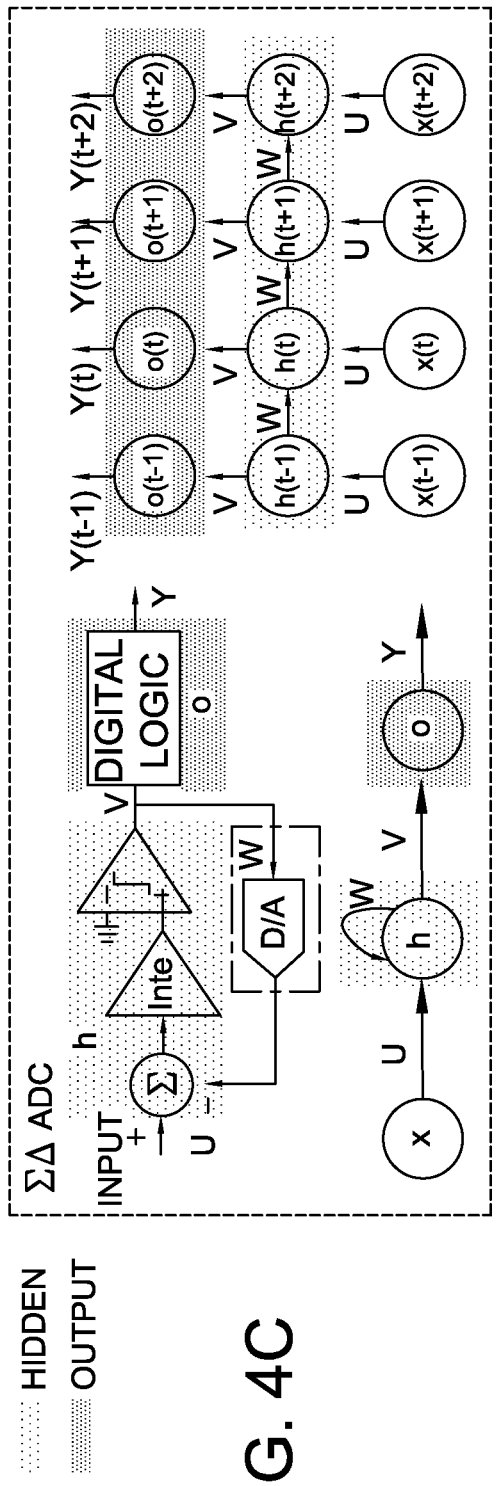

The mapping process illuminates idiosyncratic performance characteristics exhibited by different architectures that can be reflected in the neural network topology. For example, FIGS. 4A-4C show that using the pipeline ADC as an example, the NeuADC equivalent preserves the core layers of a 2-bit flash ADC core, but extends the quantization over many more hidden layers to gradually digitize the succeeding bits from the most significant bit to least significant bit. The performance trade-off in a pipeline architecture is reflected through the network topology. By reconfiguring the network topology, it is possible to achieve drastic performance trade-off across converter architectures. Note that based on the hardware substrate introduced above herein, topology reconfiguration can be accomplished with simple re-routing of input and output vectors of the NN engine. For instance, RNN requires only a slight modification of either directly feeding the output to the input or symmetrically flipping wordline and bitline. he implication of converter architecture reconfiguration is immense. It is conceivable that identical NeuADC chips with the same hardware substrate could traverse not only the full spectrum of conversion speed and resolution, but also the entire pareto frontier defined by versatile design optimization objectives, essentially serving as a universal "general-purpose" A/D interfaces.

Another property of NeuADC is the fine-grain incremental tunability of its hardware via dynamic weight reloading. Since NeuADC's hardware substrate follows regular patterns through automated synthesis, its timing, mismatch, noise, and power/energy consumption can be accurately predicted and tightly correlated with the network weight matrix. Compared with the method proposed earlier that only attempted to explore capacitor sizing in a fixed SRA ADC for mobile vision applications in image sensor, the NeuADC platform significantly enlarges the co-design space and flexibility and provides straightforward programming semantics via the weight matrix (see FIG. 7).

Several potential techniques can be used to deliver the proposed software-defined performance in a dynamic setting. For example, multiple sets of weights with different performance emphasis can be trained offline and stored online, so that they can be switched according to the use scenarios—higher sensitivity for low-light environment or wider dynamic range for high-light environment. In another case, quantization performance can be monitored in real-time and the training and learning of the weights can be performed online. Finally, in addition to the explicit weight parameters, other configuration bits embedded in the hardware substrate can be considered as meta-weights to be trained and reloaded in a similar manner. An example would be the configuration bits to determine the timing pulses/clocks for the sample-and-hold circuits, the quantizers, and the NN engine operations. Continuous time domain techniques such as pseudo clock, self-oscillating comparison, asynchronous delta modulation, can be also be explored.

While a major focus of the example design system is to exploit the design framework's versatility to instantiate traditional signal quantization, this versatility can also be applied to explore a far more general space of analog to digital mappings. Traditionally, the goal of quantization has been seen as achieving limited precision approximations of continuous-valued analog signals. Accordingly, most existing choices of quantization functions are monotonically increasing staircase functions, saturating at both ends of their range. These choices vary with respect to how the available precision is allocated to different parts of the signal range—e.g., having wider bins for higher values to maintain constant relative precision (i.e., ratio of approximation error to value). However, the fundamental assumption in all cases is that subsequent digital processing is best served by such a direct approximation of the analog signal's value.

Different applications have different sensitivities to errors or noise in signal values. For example, some tasks need accurate measurements of signal derivatives (e.g., time derivatives for audio, or spatial derivatives for images), where the signal itself has high dynamic range but is varying slowly, and signal derivative values are much smaller. In a traditional quantized representation, most of the information would then be in the least significant bits (LSBs) of pairs of signal values, because these determine the values of (small) derivatives. To ensure sufficient precision of the derivatives, monotonic quantization would have to allocate a large number of bits to represent the signal. Alternatively, a more efficient quantization strategy may be one that only retains the LSBs—corresponding to mappings of non-contiguous regions in the signal range to the same digital codeword. Derivatives can then be computed from these codewords, by resolving ambiguities with the assumption that the gradient is small. This strategy (implemented with a modified sensor and digital counter) is effective for high-dynamic range imaging.

The above example illustrates that adapting the quantization strategy to a specific task can assist the computational pipeline by preserving the most pertinent information content in the analog signal. Naturally, these strategies will vary from application to application, and the flexibility of the framework allows it to instantiate such non-traditional strategies, by simply setting up a different optimization problem.

Figure 2C:
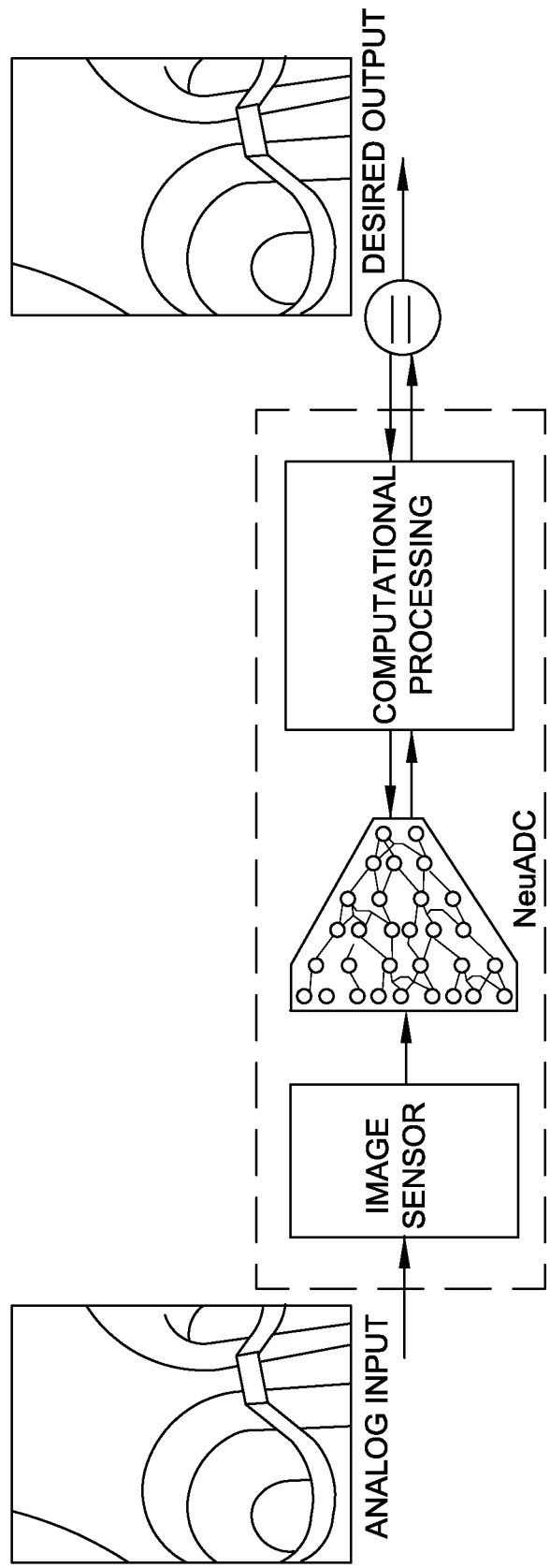

However, it is non-trivial to determine the optimal quantization strategy for a given task in the first place, since it requires expert intuition and domain knowledge of both the space of mappings that can be realized physically in hardware, and the space of computation strategies that will prove successful in software. The fact that design system framework learns to approximate a quantization function by back-propagation gives the design system the opportunity to, not just approximate a given quantization function, but also automatically "discover" quantization functions that are jointly optimal with the computational pipeline—by modeling the latter also as a neural network. This overall strategy is illustrated in FIGS. 2A-2C.

As a powerful tool for many signal processing, inference, and classification tasks in a variety of different domains NNs can be trained to match, if not exceed, the performance of algorithms hand-crafted by experts, given enough capacity and data. The standard setting involves a digital quantized numerical signal being provided as input to the neural network, which is then trained to produce some desired class label or numerical output. By training on a large number of examples of input-output pairs, the network learns to adapt to various kinds of noise and non-idealities that may exist (including those from quantization), and extract information useful to computing the output.

These NNs are trained by propagating gradients from an objective function based on the quality of the final output, back through multiple layers of the NNs. As discussed above, the design system uses an approach that synthesizes data converters by back-propagation, of gradients based on the quality of approximation to a given quantization function. A major thrust of this design system are the ways of jointly optimizing the NeuADC with the NN for computation—by back-propagating gradients of the quality of the final output, through the computation network, into the NeuADC network.

Conceptually, such an approach can be seen as simply training a larger network—the first half of which corresponds to quantization and will be instantiated using the AMS circuits, and the latter half corresponds to computation and will be instantiated by standard digital processors. This network would therefore provide a unified model for the overall mapping from the raw analog signal to the final processed output. And training this network, to determine the parameters of both the NeuADC and computation blocks, can be interpreted as doing a joint search over the design spaces of possible quantization and computation strategies. This will allow the design system to learn a quantization function that (a) is optimized to preserve information pertinent to the final output and (b) can actually be realized in hardware substrate introduced in Section 2.2.

Note that since the output of the quantization function is discrete, the function is strictly speaking non-differentiable and does not admit back-propagation. When learning only the quantization function (as discussed above), it is possible to replace the final output by the output of an approximate differentiable function. Unfortunately, this strategy is limited for joint training, because if the computation network is trained on approximate "soft" discretized inputs, it will perform poorly on actual discrete inputs. Therefore, one of the key challenges that the design system addresses are the design of optimization algorithms that are able to successfully carry out joint training over this discretization boundary. There are variants of annealing and sampling-based algorithms that have been used in other settings, for example, to learn networks with 1-bit activations. Co-PI Chakrabarti has also addressed similar discrete optimization challenges, when learning multiplexing patterns and discrete channel assignments jointly with neural networks for computation.

The use of joint training by the design system may yield better results in the presence of process variations. By providing samples that model process variations during training, both the NeuADC and the computation networks co-adapt to be robust to such variations. While process variations cause differences in the instantiated mapping function in different fabricated chips, this function then remains fixed for a particular unit. In some applications, it may be possible to carry out a calibration of individual units to characterize the actual realized function for each unit, and then provide this information to the computation pipeline. In order to learn strategies that can exploit this, variants of joint training where random process variation noise is added to the NeuADC are used, but the value of this random noise—for each training example—is also made available to the computation network. This gives the NeuADC greater opportunity to learn robustness to process variations—by choosing implementations where the effect of variations can be largely reversed by calibration.

In a general setting, the design system records multiple analog signals (for example, a large number of intensity measurements at each pixel in a camera), and requires precise computations of functions that depend on multiple signals at a time. Such settings bring up several avenues for maximizing performance under a fixed power or circuit complexity budget. In one embodiment, the design system, uses the same quantization function for every signal is optimal, or if there is any benefit to learning a different quantization function for each. For instance, in the derivative example, it may be beneficial to use a different quantization function for alternate signals that enables accurate computation of the difference between each pair. Moreover, the design system can instantiate an AMS circuit that operates on groups of signals jointly—and generates codewords that are functions of multiple signals at a time. Learning a NeuADC that can express such joint functions could allow some operations (in this case the derivative computation) to be shifted across the analog-digital boundary, from the computation network to the NeuADC. While complex processing steps are still best performed in the digital pipeline, the NeuADC may learn to carry out some simple but precision-sensitive computations in the AMS domain, prior to quantization.

As used herein, a multilayer perceptron MLP is a class of feedforward artificial neural network (ANN) which consists of, at least, three layers of nodes: an input layer, a hidden layer and an output layer. Except for the input nodes, each node is a neuron that uses a non-linear activation function (NAF). A simple model of a three-layer feedforward MLP with one hidden layer is illustrated in FIG. 8. The basic NN operations between neighbor layers can be expressed as:

$$y_j = \sigma_j\left(\sum_{i=1}^{n}(w_{ij}*x_i+b_j)\right) \quad \text{Equation 1}$$

where, $x_i$ is the input signal value of node i, i=1, 2, ..., n in the input layer, and $y_j$ is the output signal of node j, j=1, 2, ..., m in the hidden layer. $w_{ij}$ is the weight to connect input $x_i$ and output $y_j$. $b_j$ is the offset for $j^{th}$ neuron in hidden layer. $\sigma_j(x)$ is the NAF, e.g., a sigmoid function:

$$\sigma(x) = \frac{1}{1+e^{-x}} \quad \text{Equation 2}$$

In the exemplary embodiment, arbitrary decision regions can be arbitrarily well approximated by continuous feedforward NN with only a single hidden layer and any continuous sigmoid activation function. Therefore, in these embodiments, these operations can be implemented on hardware NN, where the NN are trained to approximate an ADC with different quantization schemes.

In the exemplary embodiment, the RRAM is used for implementing NN approximate computing engines and learning accelerators. This is possible due to its crossbar architecture enabling especially efficient in-memory matrix multiplication. A RRAM device is a passive two-terminal elements built on TiOx, WOx, HfOx[1] or other materials with variable resistance properties, with special advantages in small cell size ($4F^2$, F is the minimum feature size), excellent scalability (<10 nm), fast switching time (<10 ns), and good endurance (up to 1012 cycles). RRAM technology includes CMOS-compatible fabrication process and monolithic 3D integration. Therefore, RRAM cells can be organized into stackable and ultra-dense crossbar arrays at no extra area overhead.

Figure 9:
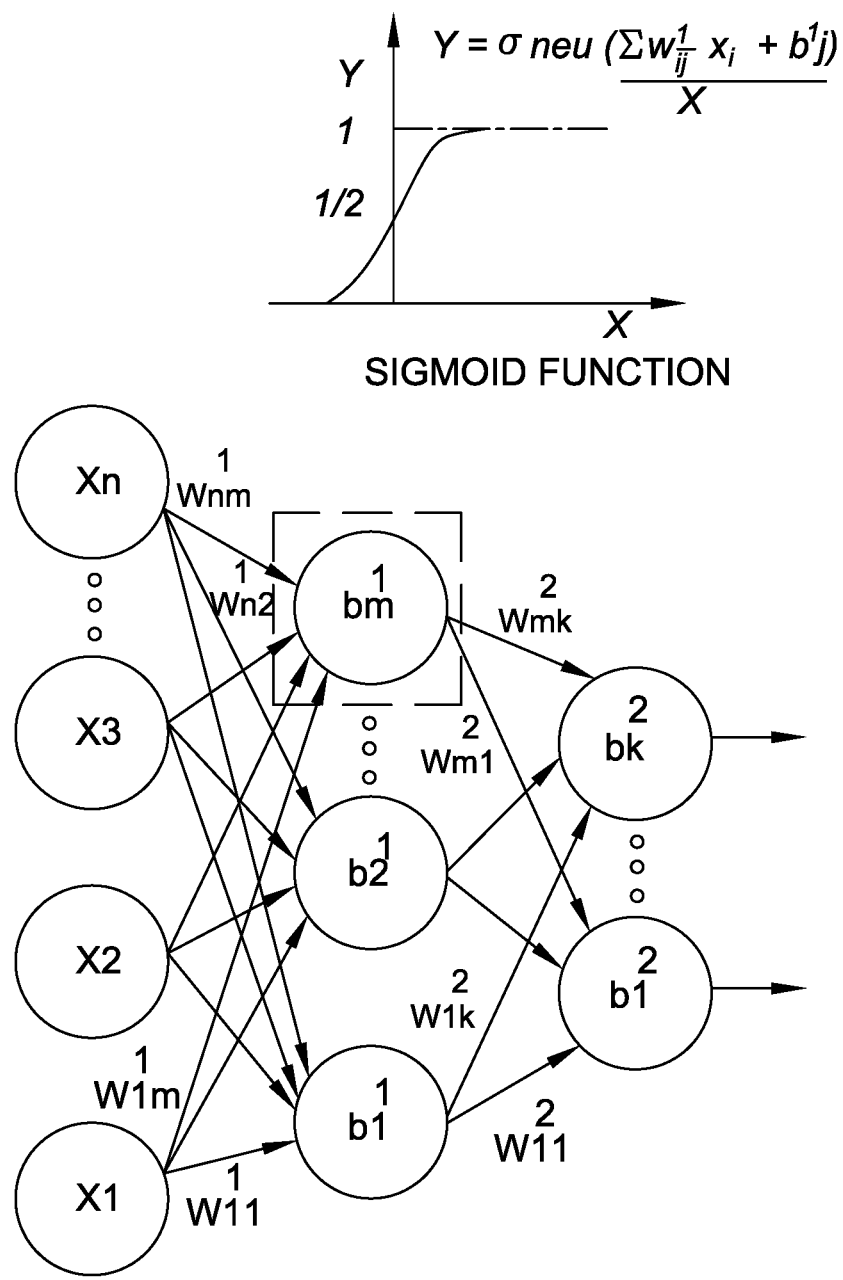
FIG. 9 illustrates a three-layer neural network universal approximator.
Figure 10:
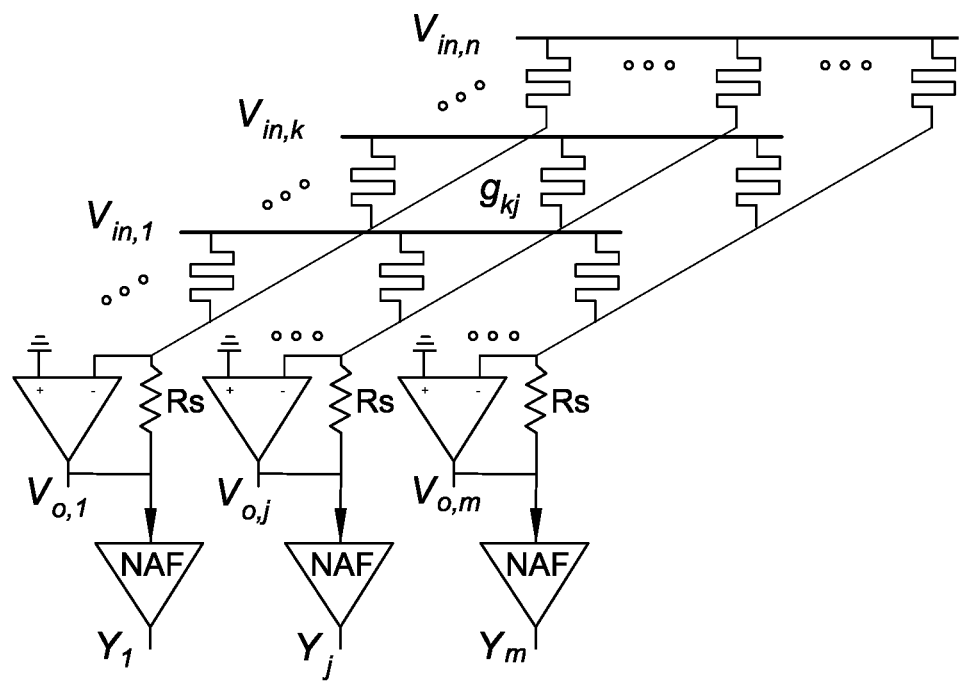
FIG. 10 illustrates a resistive random-access memory (RRAM) crossbar array with Op-Amps.
Figure 11:
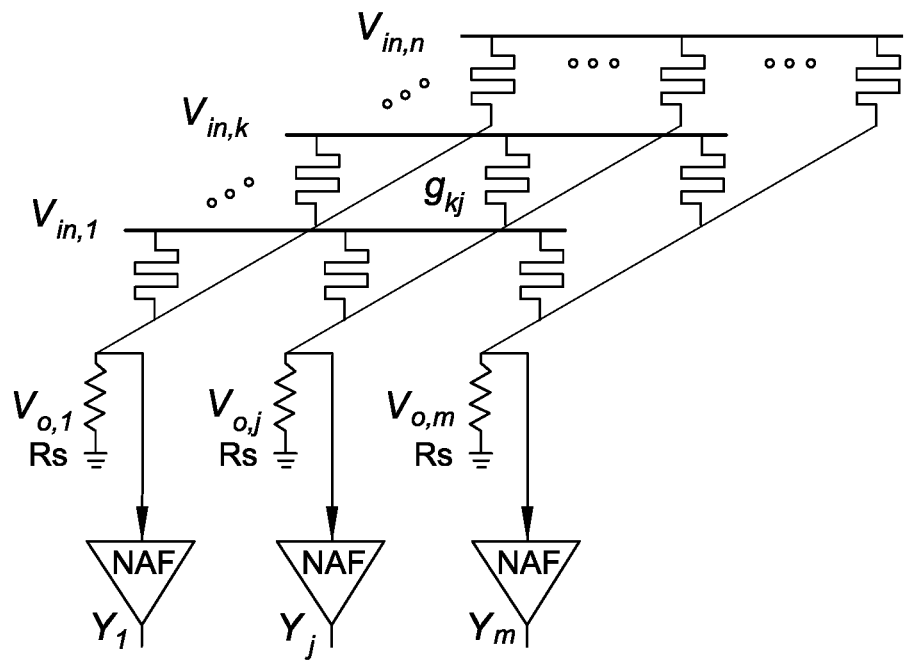
FIG. 11 illustrates a RRAM crossbar array without Op-Amps.

In the exemplary embodiment, RRAM crossbar array based NN computation consists of two essential functions: 1) a vector matrix multiplication (VMM) (Eq. (1)), to associate network weights with output from previous layer, and 2) a NAF (Eq. (2)), to convert the summation of current layer to the input of next layer. FIGS. 9 and 10 illustrate two common RRAM crossbar arrays to implement VMM on hardware, and the VMM computation between two adjacent layers are expressed as:

$$V_{o,j} = \sum_{i=1}^{n} c_{ij} * V_{in,i} \quad \text{Equation 3}$$

where, $V_{in,i}$ is the signal value of input node i, i=1, 2, ..., n, and $V_{o,j}$ is the signal of output node j, j=1, 2, ..., m; $c_{ij}$ is the weight to connect input $V_{in,i}$ and output $V_{o,j}$. In terms of the crossbar in FIG. 9 with operational amplifiers (Op-Amps), $c_{ij}$ is linear with the $g_{ij}$ and can be expressed as:

$$c_{ij} = -\frac{g_{ij}}{g_s} \quad \text{Equation 4}$$

While for the crossbar array in FIG. 10 without Op-Amps, the $c_{ij}$ can be expressed as:

$$c_{ij} = \frac{g_{ij}}{g_s + \sum_{k=1}^{n} g_{ik}} \quad \text{Equation 5}$$

where, $g_s$ is the conductance of summation resistor $R_s$ and the $g_{ij}$ is the conductance of memristor in the $i^{th}$ row and $j^{th}$ column of the crossbar array. After VMM, the output $V_{o,j}$ will be fed into a NAF, which usually is realized as piecewise look-up table or customized quasi-sigmoid function, to generate the input for next layer.

Figure 12:
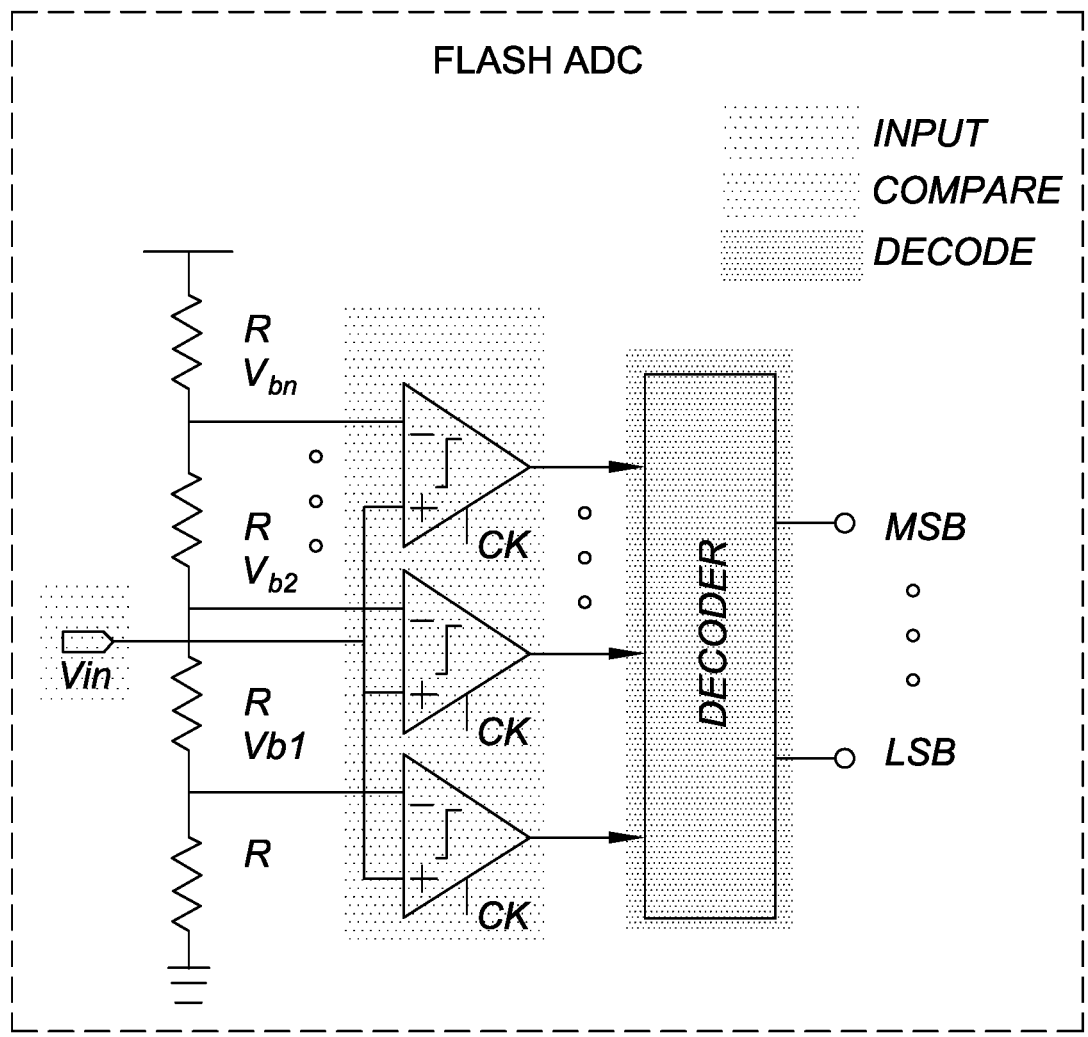
FIG. 12 illustrates an exemplary flash ADC architecture.

In the exemplary embodiment, the mapping methodology utilizes NN's ability to closely approximate general nonlinear functions. From a mathematical modeling perspective, an ideal ADC converts an analog-valued input $V_{in}$ into a digital bit-vector output according to the uniform staircase quantization function and the analytical expression for each bit can be obtained as a highly nonlinear function. For example, a typical flash ADC shown in FIG. 12 represents the straightforward circuit realization of the quantization using ideal comparators and a thermometer-to-binary decoder. The universal approximation theorem proves that a feed-forward NN with a single hidden layer, also known as MLP, can approximate arbitrary complex functions, given sufficient number of hidden neurons. Based on their respective structures, a straightforward architectural mapping between a flash ADC in FIG. 12 and a MLP with a single hidden layer in FIG. 14 can be intuitively obtained. A flash ADC typically consists of three stages—the first input stage takes analog signal from the previous sampling and holding circuit; the second compare stage employs a linear resistive voltage ladder to set trip points $V_{b,i}$ for a string of comparators; and the last decode stage converts the intermediate thermometer code into binary code. Structurally, the "input-compare-decode" three-stage architecture in the flash ADC resembles the "input-hidden-output" three-layer MLP. Accordingly, in an embodiment, a general NN hardware substrate can be implemented with its weights parameters based on off-line training such that the hardware NN approximates the ideal ADC quantization function.

Figure 13:
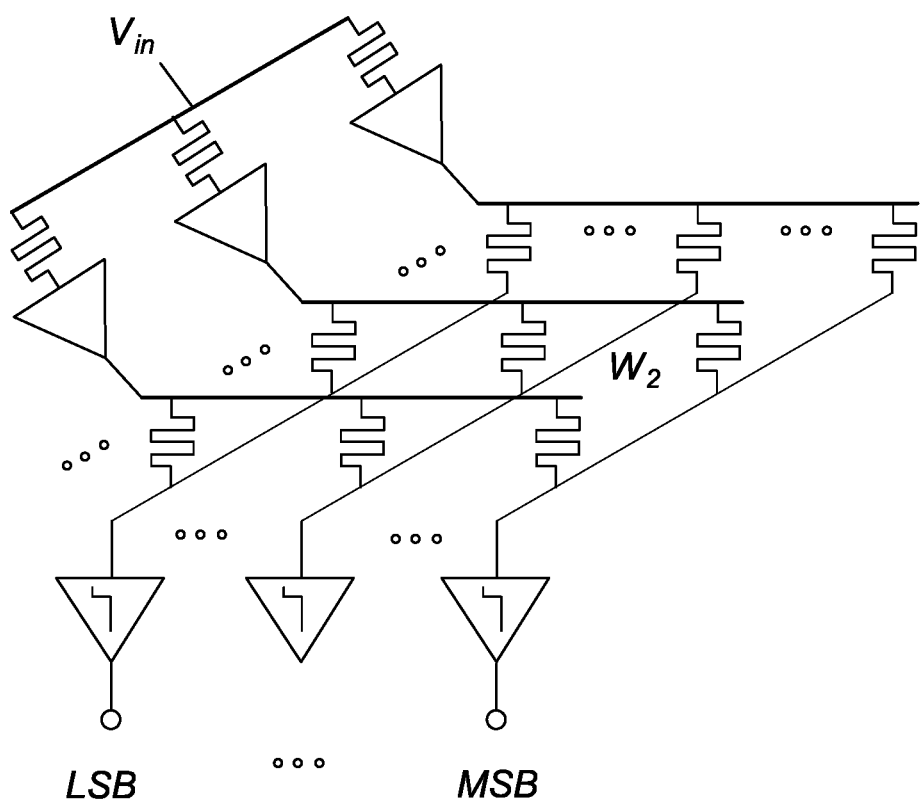
FIG. 13 illustrates an exemplary NeuADC hardware substrate based on an RRAM cross bar.
Figure 14:
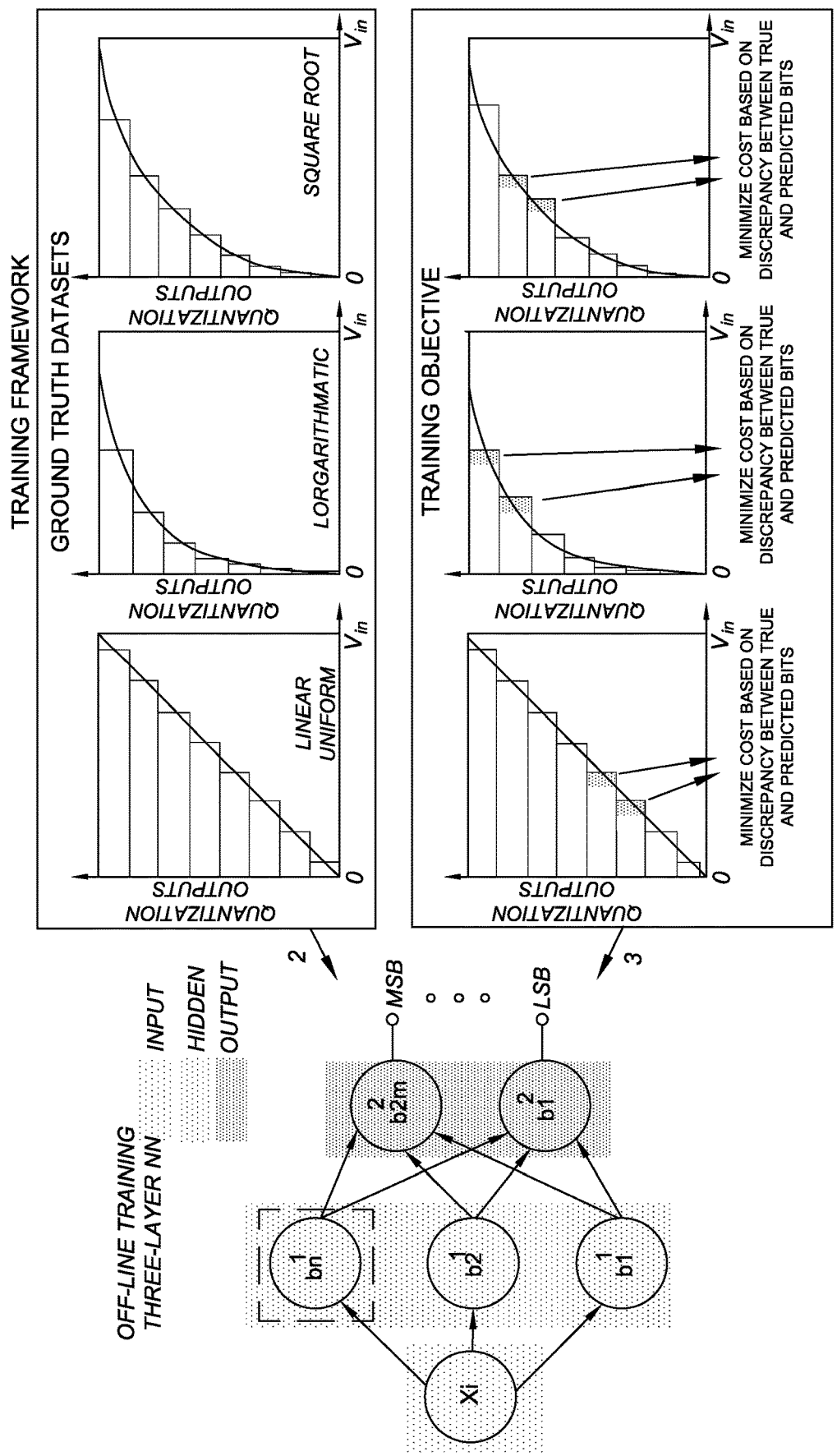
FIG. 14 illustrates an automated design flow of using ideal quantization datasets as inputs during off-line training to find the optimal set of weights and derive the RRAM resistances in order to minimize the cost function and best approximate the ideal quantization function.

FIGS. 12, 13, and 14 provide a conceptual overview of the design methodology founded on the aforementioned mapping between ADCs and NNs. The exemplary NeuADC consists of two integrated elements—a general NN hardware substrate and a hardware-oriented training framework, as illustrated in FIG. 13 and FIG. 14 respectively. In the exemplary embodiment, the RRAM crossbar array and inverter act as the hardware substrate to perform general NN operations, such as VMM and NAF. This hardware substrate operates in the mixed-signal domain to map the input analog signal to the output digital bits. The off-line training framework learns the appropriate design parameters for the NN hardware substrate to approximate the specific quantization behavior of an ADC. The overall design process can be summarized in four steps: 1) The behavior of the RRAM crossbar array based hardware substrate in FIG. 13 is modeled as a MLP, as indicated in FIG. 14; 2) The training datasets based on the desirable ideal quantization function are fed to the optimization algorithm, along with customized objective functions and constraints to accurately reflect the hardware characteristics of the underlying circuits; 3) The weights of the NN are iteratively trained through back-propagating the output errors; and 4) The off-line-trained weights are used to instantiate the corresponding design parameters in the hardware substrate. While the systems described herein use RRAM technology, the methods described herein may be broadly applied to many other technologies, such as, but not limited to, transistors, phase-change memory, spintronic transistors, and other technologies as would be known by one having skill in the art.

In the exemplary embodiment, different quantization schemes may be used, such as, but not limited to, linear uniform encoding, logarithmic encoding, and square root encoding. For each encoding scheme, a group of corresponding offline-trained weights can be obtained. These weights are then used to configure different RRAM resistance values to realize multiple signal quantization schemes on the same NeuADC hardware substrate.

Figure 15A:
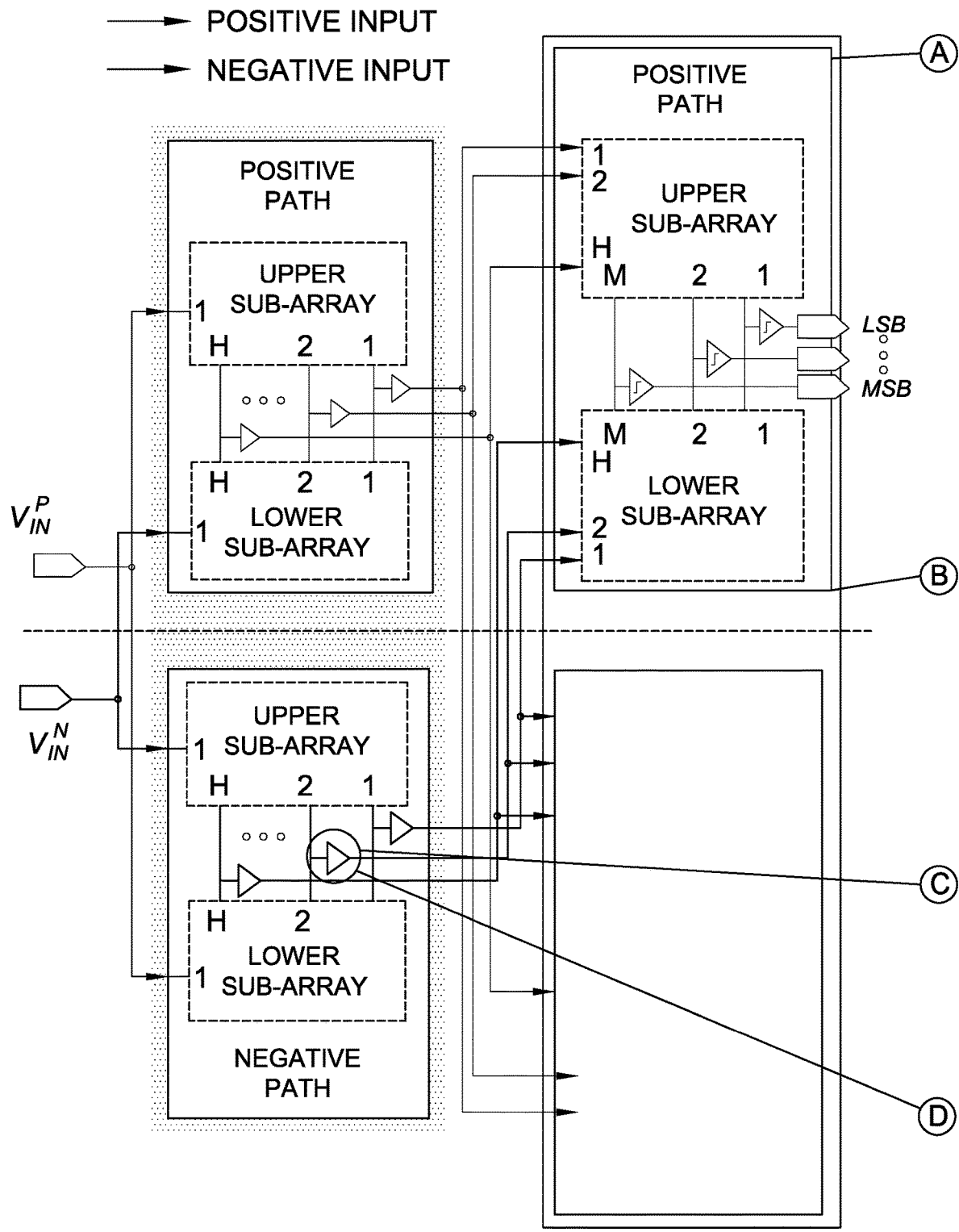
FIG. 15(a) illustrates a design of a system architecture of the NeuADC system including a dual-path architecture of the NeuADC.

The overall circuit architecture of the NeuADC framework that realizes a three-layer MLP is illustrated in FIG. 15(a). In this embodiment, RRAM crossbar arrays and inverter circuits are used at each layer to perform the basic NN operations (VMM and NAF) in the analog domain. The input analog signal represents the single "place holder" neuron in MLP's input layer. Hence, the weight matrix dimensions are 1×H between the input and the hidden layer and H×M between the hidden and the output layer, assuming there are H and M neurons in the hidden and output layers. These NN structure parameters determine the dimension of the RRAM crossbars at each layer. In order to accommodate negative weights, a new dual-path configuration may be used such that each NN layer consists of a positive path and a negative path and each path requires two RRAM sub-arrays, which we call the upper and the lower sub-array. The dual paths allow for generating a pair of complementary voltage signals to represent the output of the VMM computation in the analog domain from the complementary input voltages.

Figure 15B:
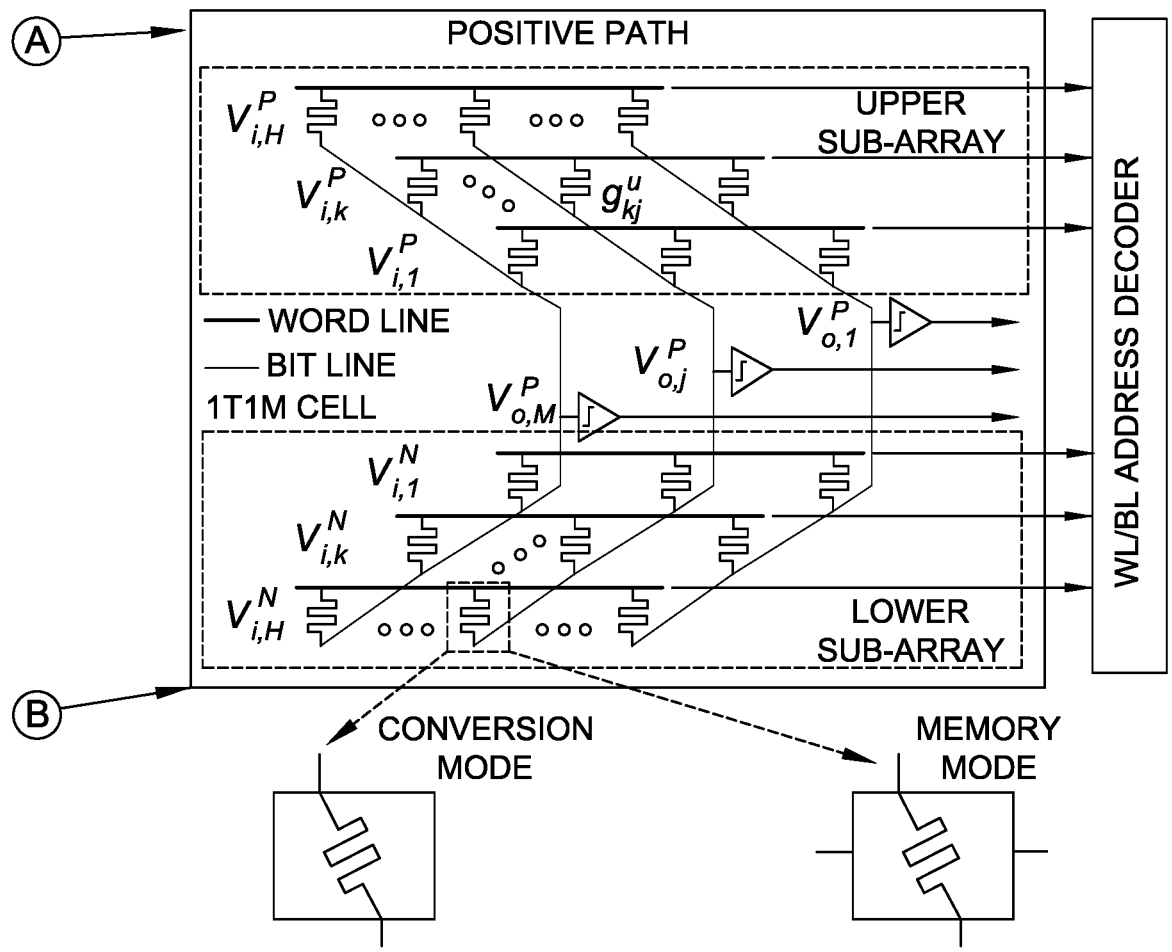
FIG. 15(b) illustrates a zoomed-in RRAM HxM crossbar sub-array of the NeuADC system.

A zoomed-in RRAM crossbar array is illustrated in FIG. 15(b). The 1×H complementary input vector represented by input voltages $V_{i,1}$ to $V_{i,H}$ are fed to each row on the word lines (WL) of the RRAM array, and each element in the weight matrix is stored as the conductance of the RRAM device in each weight cell. The computed VMM output vector appears as voltages at each column on the bit lines (BL). The weight cell consists of one-transistor and one RRAM device (1T1R) and can operate in both compute mode and program mode. In compute mode, the transistor switch is turned on and the RRAM crossbar array can perform the analog VMM computation by summing the current of the shared BL. In the program mode, the conductance of the RRAM device can be programmed to the desirable weight by programming circuits (PC) and the address decoders (AD-DEC) as in a typical RRAM configuration. In one embodiment, the tuning mechanism of the program-and-verify (P&V) method is used, which can significantly reduce power consumption and improve the tuning resolution. The RRAM crossbar implementation described herein obviates the use of analog-style circuits such as op-amps and analog inverters, hence this implementation is much more scaling-compatible and synthesis-friendly.

One critical difficulty of using RRAM crossbar as analog VMM is its inability to support negative weights, since the BL currents can only be added but not subtracted. Prior work proposes the use of analog inverters to circumvent this problem, but does not offer circuit implementation details. Instead of resorting to analog-style circuits, the implementation described herein uses a new dual-path configuration that uses a pair of complementary voltage signals with opposite polarity and two signal paths, each consisting of two RRAM crossbar sub-arrays to overcome the negative weight challenge. To explain the dual-path operation and derive the voltage signal expression, we use the positive path crossbar shown in FIG. 15(b) as an example. First, assume there are H pairs of complementary inputs:

$$V_{i,k}^P = V_{in,k},\ V_{i,k}^N = V_{DD} - V_{in,k} \qquad \text{Equation 6}$$

where VDD is the power supply, k=1, 2, . . . , H. The output voltages at the crossbar BL on the positive path are represented as $V^P$, and on the negative path are represented as $V^N$; hence, there are M pairs of outputs as j=1, 2, . . . , M. Each of $V^P$ and $V^N$ contributes to the output $V^P_{o,j}$ separately. Applying Thevenin Theorem, the contribution of each pair of inputs superimpose to obtain the output BL voltages:

$$V_{o,j}^P = \sum_{k=1}^{H} (W_{kj}^{PP} * V_{i,k}^P + W_{kj}^{PN} * V_{i,k}^N) \qquad \text{Equation 7}$$

where $$W_{kj}^{PP} = g_{kj}^U / \Sigma,\ W_{kj}^{PN} = g_{kj}^{UL} / \Sigma,\ \Sigma = \sum_{l=1}^{H} (g_{lj}^U + g_{lj}^L).$$

The first superscript of $W_{kj}^{PP}$ denotes which path the weight belongs to and the second superscript denotes which complementary input the weight acts upon. The superscript of $g_{kj}^U$ denotes which sub-array the conductance belongs to. By replacing $V_{i,k}^P$ and $V_{i,k}^N$ with Eq. 6, the output voltage of $V_{o,j}^P$ of the positive path in Eq. 7 can be derived as $$V_{o,j}^P = \sum_{k=1}^{H} W_{kj}^P * V_{in,k} + V_{off,j}^P.$$

Here, $$W_{kj}^P = W_{kj}^{PP} - W_{kj}^{PN} = \frac{g_{kj}^U - g_{kj}^L}{\Sigma} \qquad \text{Equation 8}$$

and $$V_{off,j}^P = \sum_{k=1}^{H} (W_{kj}^{PN} * V_{DD}) / \Sigma.$$

It shows that due to the complementary voltage inputs that act on the sub-arrays, the effective weight $W_{kj}^P$ is a subtraction of two conductances and thus can be negative. For the conductance subtraction methodology to work properly, $V_{o,j}^N$, the complementary version of $V_{o,j}^P$ needs to be generated, and it is achieved by incorporating the negative path where the polarity of the input voltage pair is flipped. Thus the expression of $V_{o,j}^N$ can be similarly derived as $$V_{o,j}^N = \sum_{k=1}^{H} W_{kj}^N * V_{in,k} + V_{off,j}^N.$$

Here:

$$W_{kj}^N = W_{kj}^{PN} - W_{kj}^{PP} = \frac{g_{kj}^L - g_{kj}^U}{\Sigma}. \qquad \text{Equation 9}$$

and $$V_{off,j}^N = \sum_{k=1}^{H} (W_{kj}^{PP} * V_{DD}) / \Sigma.$$

As FIG. 15(a) illustrates, in the exemplary embodiment, a negative path is not needed at the output layer, accordingly, the negative path of the output layer is greyed out.

Figure 15C:
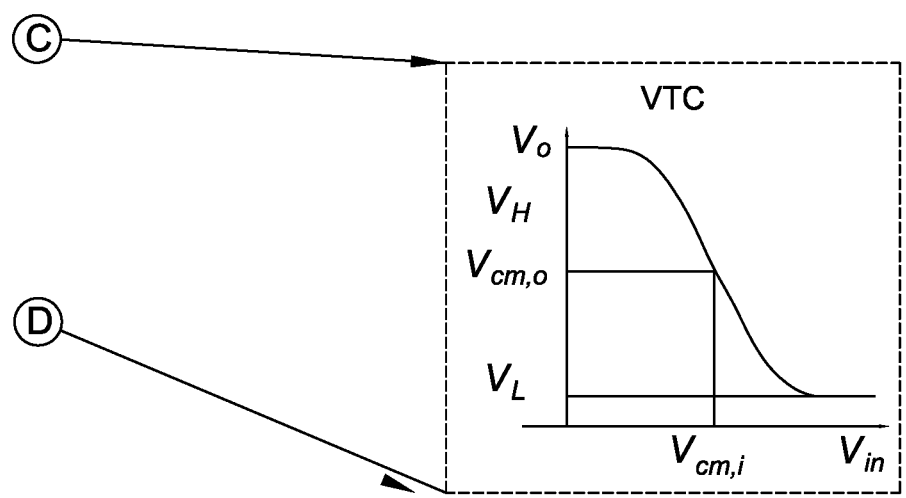
FIG. 15(c) illustrates an inverter VTC of the NeuADC system.

Past implementations of hardware NN circuits often use digital look-up table or custom-designed analog neurons to approximate the ideal sigmoid function. In at least one embodiment, the native VTC curve of CMOS logic circuits is leveraged to perform the NAF function in the NN hardware substrate, which effectively reduces the hardware complexity compared to traditional neurons. As depicted in FIG. 15(c), VTC exhibits saturation at both ends of the input range, and can be considered as a flipped-and-shifted version of a general S-shaped curve, similar to the commonly-used sigmoid function. To provide flexibility to the training process, current-starved inverters are used as the NAF in the hidden layer, because it allows the VTC curve to float in a range defined by $V_H$ and $V_L$. Here, $V_H$ and $V_L$ are the highest and lowest voltage of VTC. The synthesizable comparators implemented with a three-input NAND gate are used in the output layer, since final digitalization of output has to be performed. Both the inverter and the three-input NAND comparator based neuron implementations are scaling-compatible and synthesis-friendly, thus significantly reduce the circuit complexity.

In the exemplary embodiment, the hardware substrate is designed to express a general class of NN functions. Next an off-line training procedure is introduced that can automatically discover the circuit-level design parameters—namely the RRAM conductances—so that the circuit instantiates a function that well approximates the ideal quantization, to convert the input analog voltage to the correct output digital codes. To do this, a NN model is defined that corresponds to the hardware substrate. The associated feasibility constraints are identified on the NN weights to ensure they can be translated to a physically realizable circuit. Next a new bit-encoding scheme is added that allows the hardware substrate to achieve finer quantization levels with alleviated circuit complexity. Next, a method for optimizing these weights using a largely standard approach to gradient descent-based learning is used, but with modifications to enforce the feasibility constraints unique to the setting. In some embodiments, non-idealities of devices are introduced into training to make NeuADC robust to the variation of process, supply voltage, and temperature (PVT). Finally, the methodology instantiates RRAM conductance from the trained parameters.

In at least one embodiment, the input-output relationship of the NeuADC hardware substrate as a three-layer MLP with a single hidden layer could be modeled as:

$$\tilde{h} = L_1(V_{in}; \theta_1), h = \sigma_{VTC}(\tilde{h}) \quad \text{Equation 10}$$
$$\tilde{b} = L_2(h; \theta_2), b = \tilde{b} > 0$$

Here, $V_{in}$ is the scalar input signal and b is the final vector of output bits; $\tilde{h}$ denote voltages at the output of the first crossbar layer, and modeled as a linear function $L_1$ of $V_{in}$ with parameters $\theta_1$ which corresponds to crossbar conductances. Each of these voltages is passed through an inverter, whose input-output relationship is modeled by the nonlinear function $\sigma_{VTC}(\bullet)$, to yield the vector h. The linear function $L_2$ models the second layer of the crossbar to produce another vector $\tilde{b}$, of size equal to the number of output bits. The final output bit-vector b is obtained by thresholding: yielding 0 for each element of $\tilde{b}$ that is below 0 and 1 otherwise.

The learning objective is to find optimal $\theta_1$, $\theta_2$ such that for all values of $V_{in}$ in the input range, NeuADC yields the corresponding bit-vectors b equal or close to the desired "ground-truth" vectors $b_{GT}$. A cost function measures the discrepancy between predicted b and true $b_{GT}$. The hard-thresholding that yields b from $\tilde{b}$ in Eq. (10) is non-differentiable, which prevents propagating gradients to the parameters $\theta 1$, $\theta 2$. Therefore, a differentiable cost $C(\tilde{b}, b_{GT})$ defined in terms of the un-thresholded bit-vector $\tilde{b}$. Now, given a set $\{V_{in}^t, b_{GT}^t\}_t$ of pairs of signal and bit-vector values, the goal of training can be formally stated as solving the following optimization problem:

$$[\theta_{1,2}] = \operatorname{argmin} \sum C(L_2(\sigma_{VTC}(L_1(V_{in}^t, \theta_1)), \theta_2), b_{GT}^t) \quad \text{Equation 11}$$

The model in Eq. (10) models the hardware substrate described above. The first layer in the crossbar model has dual paths, each with H outputs. These outputs are denoted as vectors $\tilde{p}$ and $\tilde{n}$ with $\tilde{h}=[\tilde{p}^T,\tilde{n}^T]^T$ being a 2H dimensional vector. The linear relationship $L_1$ between these outputs is defined as $\tilde{p}=W_1*V_{in}+V_1$, $\tilde{n}=V_{DD}+\tilde{p}$, which is equivalent to:

$$\tilde{p} = \max(0, W_1) * V_{in} + \max(0, -W_1) * (V_{DD} - V_{in}) + (V_1 - \max(0, -W_1) * V_{DD})$$

$$\tilde{n} = \max(0, -W_1) * V_{in} + \max(0, W_1) * (V_{DD} - V_{in}) + (V_{DD} - V_1 - \max(0, W_1) * V_{DD}) \quad \text{Equation 12}$$

for the dual-path crossbar model. Here, the learnable parameters are $\theta_1 = \{W_1, V_1\}$, where $W_1$ and $V_1$ are both 1×H dimensional vectors. Additionally, since these models will be instantiated using the RRAM crossbar array, it has the following practical feasibility constraints on $W_1$ and $V_1$:

$$0 \leq V_1 - \max(0, -W_1) \times V_{DD} \leq V_{DD} \times (1. - \operatorname{abs}(W_1))$$

$$0 \leq V_{DD} - V_1 - \max(0, -W_1) \times V_{DD} \leq V_{DD} \times (1. - \operatorname{abs}(W_1)) \quad \text{Equation 13}$$

In order to obtain a high-fidelity VTC that matches well with the circuit-level behavior of the inverter, a SPICE simulation was performed at finely-sampled input voltages. The function σVTC is formulated through linear interpolation between these sampled points, which ensures both a value and a gradient for any input to the function. The final output function $L_2$ simply maps the inverter outputs $p=\sigma_{VTC}(\tilde{p})$ and $n=\sigma_{VTC}(\tilde{n})$ to the un-thresholded bit vector $\tilde{b}$ as:

$$\tilde{b} = \max(0, W_2)(p - V_{cm,o}) + \max(0, -W_2)(n - V_{cm,o}) + V_2 \quad \text{Equation 14}$$

with learnable parameters $\theta_2 = \{W_2, V_2\}$, where $W_2$ is an M×H matrix and $V_2$ is an M-dimensional vector, with M the number of output bits. In this embodiment, the parameters are defined with respect to the hidden activations p and n after subtracting the mid-point voltage $V_{cm,o}$ of the inverter output range, to lead to more stable convergence during training. In this embodiment, no additional feasibility constraints are required for $\theta_2$.

In this application, bits encoding and decoding refer to the mapping of the analog input voltage levels to a specific digital code and converting it back to an analog value. In some embodiments, the encoding scheme may play an important role in determining the convergence of the training process and ultimately the quantization quality of the NeuADC circuits.

Standard binary encoding is a straightforward way to define the "ground-truth" vectors $b_{GT}$:

$$\sum_{i=1}^{M} 2^{i-1} * b_{GTi} = \operatorname{round}\left(\frac{V_{in} - V_{min}}{V_{max} - V_{max}} \times (2^M - 1)\right) \quad \text{Equation 15}$$

where, $V_{in}$ is the encoded form of input signal $V_{in}$; $V_{imin}$ and $V_{imax}$ are the minimum and maximum values of the scalar encoded input signal $V_{in}$. A naive way to train the network is to interpret this as a classification task, and use a cross-entropy loss (i.e., interpret $\tilde{b}$ as logits and maximize log-likelihood) as:

$$C(\tilde{b}, b_{GT}) = \sum_{i=1}^{M} b_{GTi} \log(1 + e^{-\tilde{b}i}) + (1 - b_{GTi}) \log(1 + e^{\tilde{b}i}) \quad \text{Equation 16}$$

However, this ignores the desire for an accurate reconstruction of $V_{in}$ as Eq. (15), and the accuracy of different weights have different effect on this accuracy. Based on this, two modified versions of the loss are defined. The first simply weights each element of the standard loss by the contribution to the reconstruction of $V_{in}$:

$$C_1(\tilde{b}, b_{GT}) = \quad \text{Equation 17}$$
$$\sum_i 2^{i-1}\left[b_{GTi}\log(1 + e^{-\tilde{b}i}) + (1 - b_{GTi})\log(1 + e^{\tilde{b}i})\right]$$

The second accounts for the fact that for some signal $V_{in}$, if a higher significant bit is incorrect and can not be corrected, flipping the values of the lower significant bits may lead to a better approximation (e.g., for ideal $b_{GT}=1000$ and the most significant bits (MSB) of b stuck at 0, it is better to produce 0111 than 0000). This effect is defined as $E_i(\tilde{b}, V_{in}) = |\hat{V}_{in} - b/i - 2^{i-1}| - |\hat{V}_{in} - b/i - 2^{i-1}|$, where $$\hat{V}_{in} = \left(\frac{V_{in} - V_{min}}{V_{max} - V_{min}} \times 2^B\right) - 0.5 \quad \text{Equation 18}$$

$$\frac{b}{i} = \sum_{i' \neq i} 2^{i'-1}(\tilde{b}_i > 0)$$

Then the second loss on $\tilde{b}$ may be defined as:

$$C_2(\tilde{b}, V_{in}) = \sum_i \left[ \max(0, -E_i(\tilde{b}, V_{in}))^2 \log(1 + e^{-\tilde{b}i}) + \max(0, E_1(\tilde{b}, V_{in}))^2 \log(1 + e^{-\tilde{b}i}) \right]$$

Equation 19

Figure 16A:
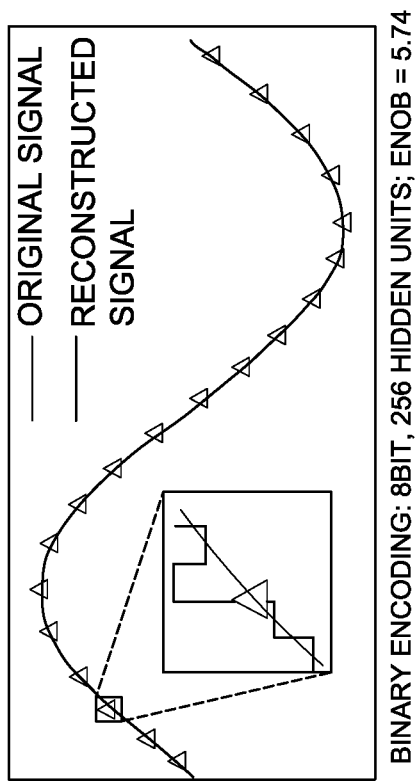
FIG. 16(a) illustrates a graph of the transition of different bits in a binary code as its digital value changes.

Note that this second loss is defined in terms of the true signal $V_{in}$ and not its binary encoding $b_{GT}$, although it implicitly assumes that b represents a binary encoding of $V_{in}$. In this setting, the network is trained to minimize a weighted sum of the two losses ($\alpha^*C_1+C_2$), with more weight placed on the second loss ($\alpha<1$), while the first loss mainly serves to guide training in initial iterations. In some embodiments, the modified cost function modestly improves the training, it remains quite hard to find a good approximation to this mapping (from $V_{in}$ to its binary encoding vector) using a circuit with a limited number of hidden units. This is because, as depicted in FIG. 16(a), the binary encoding corresponds to a high-frequency target function for the least significant bits (LSB), which must change signs $2^M$ times in the input range. Moreover, small errors in any of the more significant bits can cause large deviations in the reconstructed analog value.

Figure 16B:
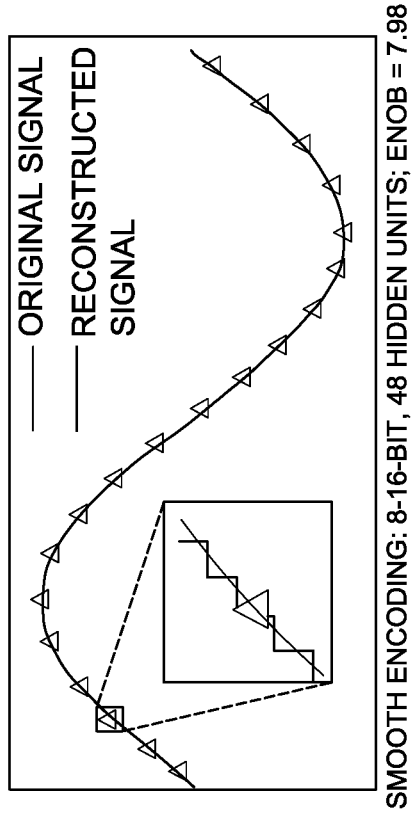
FIG. 16(b) illustrates a graph of an example of a reconstructed waveform from NeuADC outputs trained with binary bits encoding.
Figure 16C:
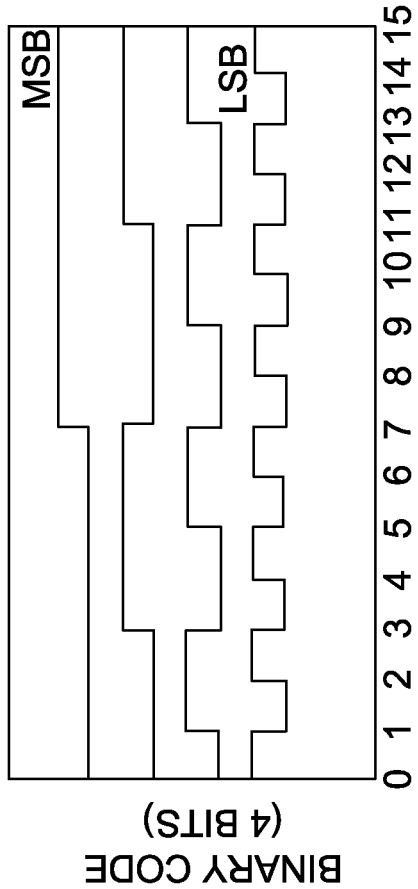
FIG. 16(c) illustrates a graph of the transition of different bits using an exemplary smooth code.
Figure 16D:
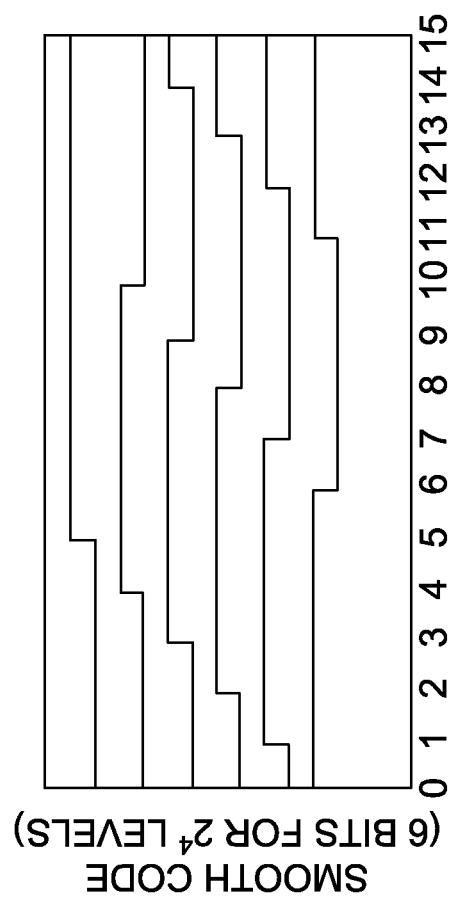
FIG. 16(d) illustrates a graph of an example of a reconstructed waveform from NeuADC outputs trained with smooth bits encoding.

Smooth encoding use "smooth" A→B codes that replace an A-bit binary encoding with B>A bits. These codes represent each of the $2^A$ levels with B-bit unique codewords that have the following two properties: 1) only one bit changes between subsequent levels (this property is similar to those of "Gray codes") and 2) each bit flips a minimum number of times. Given parameters A and B, these codewords are automatically constructed by beginning with an all-zero codeword for the lowest level, and then for each subsequent level, choosing to flip the bit that was least recently flipped. This leads to smoother bit functions with fewer transitions as shown in FIG. 16(c). FIGS. 16(b) and 16(d) show some example of reconstructed waveforms of an input sinusoidal signal by the circuits learned with binary and smooth codes respectively. Figure shows that that the binary encoding is able to achieve reasonable but mediocre reconstructions with a large number of hidden units (~256), whereas given a wide-enough bit-vector, smooth encoding can accurately reconstruct with far fewer hidden units (~48). This encoding is trained with the simple cross-entropy loss defined in Eq. 16. In some embodiments, a squared version (after summing over bits) may be used to emphasize the penalty for multiple errors in the same sample.

Given a trained circuit that produces bit-vectors b for different inputs $V_{in}$, a simple decoding scheme that essentially corresponds to constructing a look-up table (LUT) may be used to find the corresponding analog value of each possible bit-vector.

Figure 17:
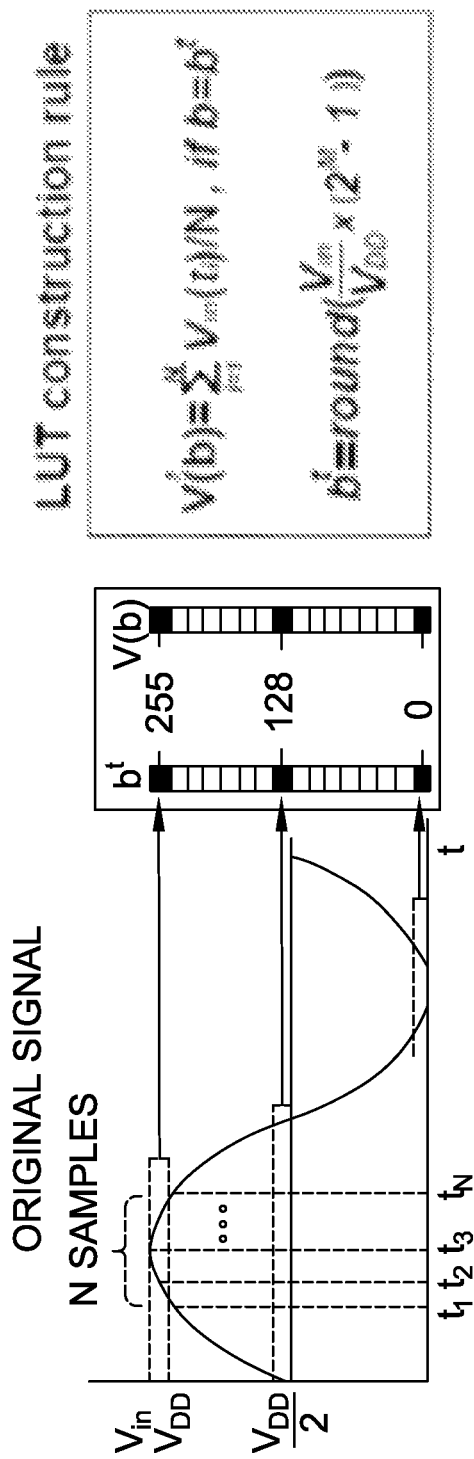
FIG. 17 illustrates a graph of a decoding scheme and the rule of constructing a look-up table (LUT)

For the purposes of explanation an 8-bit ADC is used to explain the concept and the proposed decoding scheme, as illustrated in FIG. 17. First, the final learned parameters are used to compute the sets $\{V_{in}, b\}$ for a finely-sampled set of values $V_{in}$. In terms of an 8-bit ADC, there are 256 distinct bit-vectors b[i], i=0, 1, 2, ..., 255 in b, and each b[i] corresponds to $N_i$ finely-sampled analog input $V_{in}(t_j)$, j=1, 2, ..., $N_i$. Therefore the corresponding analog value of $b_{[i]}^t$ can be calculated as $$V'_{b,i} = \sum_{j=1}^{N_i} V_{in}(t_j) / N_i.$$

The same procedure is repeated to all of the $b_{[i]}^t$ to construct the LUT$\{V'_b, b\}$ for each $b_{[i]}$ in b. This is then applied for circuits trained with both binary and smooth codes, to help calibrate for deviations in the learned mapping.

Having defined the mapping from $V_{in}$ to the circuit output $\tilde{b}$, and a differentiable cost $C(\tilde{b}, b_{GT})$ on these outputs, the system is now able to train the parameters using stochastic gradient descent. For example, the parameters $\theta_1$, $\theta_2$ may be initialized randomly, and updated iteratively based on gradients computed on mini-batches of $\{(V_{in}, b_{GT})\}$ pairs randomly sampled from the input range. However, this standard approach to NN training does not account for the feasibility constraints on $\theta_1$ in Eq. (13). To enforce these constraints, the following steps are applied. In each iteration of training, the positive and negative path biases (the third term in Eq. (12)) are adjusted to match Eq. (13) such that the final layer does not learn to depend on an infeasible combination of inputs. Further, periodically (every 256 iterations) the parameters themselves are adjusted to the feasible set, by adjusting all values of $W_1$ between [−0.5, 0.5] and scaling $V_1$ accordingly.

Another issue that needs to be dealt with is that the input-output relationship of the inverters depends on its loading impedance, which is determined by the conductances of the second layer. In other words, the exact curve of the $\sigma_{VTC}$ function differs as the values of $\theta_2$ vary, and this can only be determined through simulations. To deal with it, first $\sigma_{VTC}$ is obtained assuming no loading impedance, and then train the circuit with a fixed $\sigma_{VTC}$. Then a is updated by performing a second simulation, this time based on the current values of the learned parameters $\theta_2$. Then training is continued for a few more iterations, using the updated av,c. In some embodiments, two rounds of this iteration is sufficient to yield circuit parameters that perform well with actual loading during simulations.

All circuits may be subjected to non-idealities. PVT variations degrade the performance of CMOS devices; meanwhile, RRAM devices may also experience limited resistance resolution and stochastic variations. All these non-idealities could result in the poor quantization quality in practical application of NeuADC. The robustness of NeuADC may be further improved by incorporating the PVT variations of CMOS devices and the limited resolution of RRAM resistance into training, which may result in a group of robust trained parameters to design a hardware substrate that is immune to variations.

In some embodiments, it is implicitly assumed that all the hidden layer neurons have the same VTC. In reality, neurons on the same hardware substrate experience different PVT variations, and it results in variations in the real VTC of different neurons, which makes the practical VMM computation on the hardware substrate mismatched with the simulation results of off-line NN model and eventually leads to wrongly-flipped digital bits in the output layer. To overcome the effect of PVT variations, a naive way is to incorporate as many VTCs as possible into training, covering all the process corners as illustrated in FIG. 18(a). Assume that N groups of VTCs obtained from global Monte Carlo simulation form an indexable high-dimension array $A_{VTC}$, then let each neuron in Eq. 10 randomly pick up a VTC from $A_{VTC}$ during each epoch training, which is $$\sigma_{VTC}^i = A_{VTC}[\text{randint}(N)], i=1,2,\ldots,H$$

Equation 20

In some embodiments, it hard to achieve a good training performance with a reasonable size of NN due to the large variation of all the VTCs. For example, FIG. 18(b) only shows the variation of VTCs at supply voltage $V_{DD}$=[1.17V, 1.23V] and temperature range T=[−40° C., 80° C.] by running global Monte Carlo simulation for 100 times, where variation of the switching threshold is more than 70 mV. Overcoming such great variations requires a huge number of neurons in the hidden layer.

In some embodiments, it is possible to figure out which process corner each chip belongs to through post-fabrication binning. Based on this fact, there is a way to find several local optima to overcome the PVT variations with much less hardware resources and shorter training time. For example, given that the chip is in TT (typical NMOS and typical PMOS) corner, first a local Monte Carlo simulation is used to find as many VTCs as possible in this local region, as shown in FIG. 18(d). Since the switching threshold variation of VTCs at TT corner is only 4.5 mV, a group of local optimal design parameters with much less size and shorter training time ma be found by incorporating these VTCs into training using the procedure in Eq. 20. The same procedure is repeated for the local region under each process corners in FIG. 18(c). In some embodiments, only five LUTs are needed to cover the regions across all process corners.

Some RRAM devices have limited programming resolution and experience stochastic variations causing the final programmed resistance to vary according to a log-normal distribution. The limited RRAM resistance resolution corresponds to the limited resolution of weights. In one embodiment, this issue may be solved by constraining the resolution of weight during training, that is, in each epoch training, clipping the updated weight into N-bit. After training, instantiated the trained parameters into N-bit RRAM. Regarding the issue of RRAM process variations, analyze the median ENOB of different NeuADC circuits when perturbing their conductances with log-normal noise of different standard deviations σ—i.e., multiplying them by exp(ϵ) where ϵ~N (0, σ²). Thus these circuits are designed by the trained parameters which incorporate CMOS device variation and RRAM limited resolution into training.

Figure 19A:
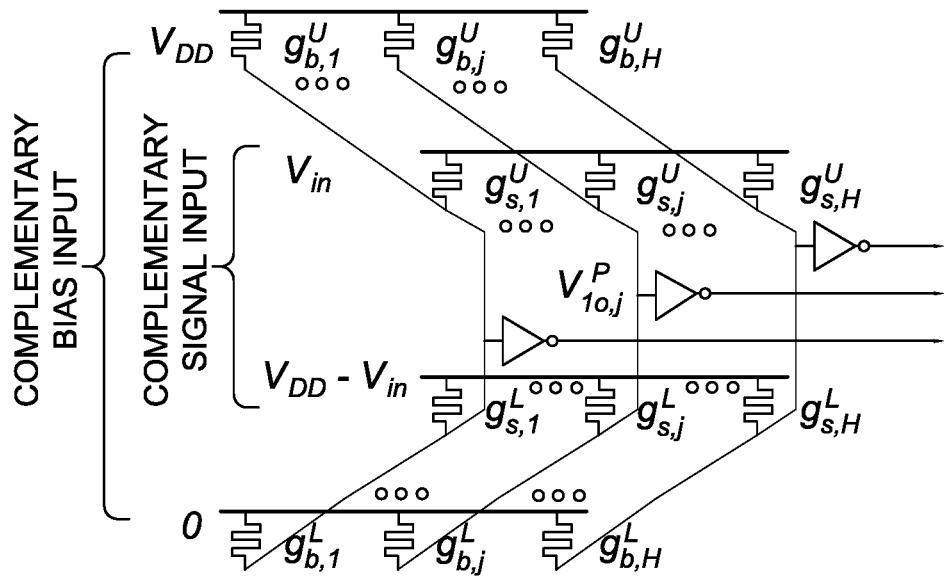
FIG. 19(a) illustrates an exemplary hardware model to map with a training displaying a crossbar array of a positive path for the first layer.
Figure 19B:
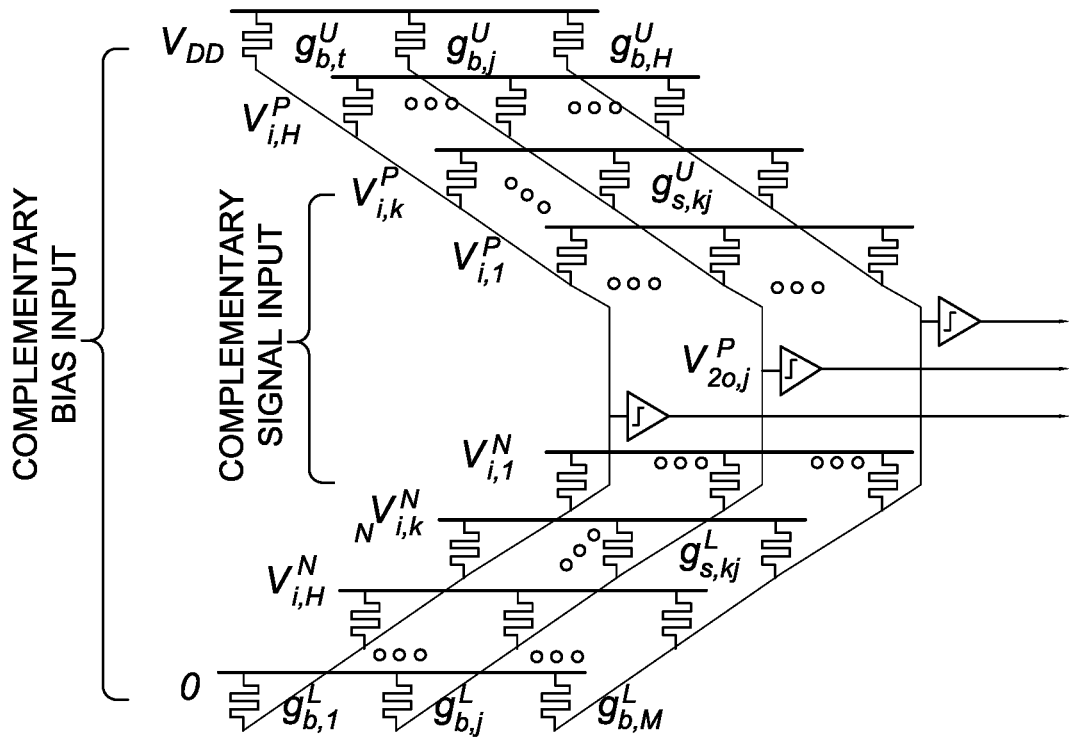
FIG. 19(b) illustrates an exemplary hardware model to map with a training displaying a crossbar array of a positive path for the second layer.

After learning the optimal parameters $\theta_1$, $\theta_2$ through the hardware-oriented training process, translate these into RRAM conductance values. Begin by considering the first layer, and relate the positive and negative-path equations in Eq. (12) to the expression for output voltages in Eq. (7). Since in addition to the weights, precisely-trained bias need to be realized, add an extra row (WL) in the RRAM crossbar in both the hidden layer and the output layer as illustrated in FIG. 19. Instantiate the biases in Eq. (12) by providing the supply voltage $V_{DD}$ as an input, in addition to the signal inputs $V_{in}$ and $V_{DD}-V_{in}$. As an example, for each output of the positive path, i.e., $\tilde{p}_i$, $i\in\{1, \ldots H\}$, denote $g_{s,i}^U$, $g_{s,i}^L$, $g_{b,i}^U$, and $g_{b,i}^L$ as the conductances connecting the output to $V_{in}$, $V_{DD}-V_{in}$, the supply $V_{DD}$ and ground as illustrated in FIG. 19(a). After accounting for this modification to the original crossbar architecture, Eq. (7) may be written as:

$$V_{1o,j}^P = W_3^{PP} * V_{in} + W_j^{PN} * (V_{DD} - V_{in}) + W_j^b * V_{DD} \quad \text{Equation 21}$$

Here $W_j^{PP}=g_{s,j}^U/C_1$, $w_j^{PN}=g_{s,j}^L/C_1$, $W_j^b=g_{b,j}^U/C_1$, and $C_1=g_{s,j}^U+g_{s,j}^L+g_{b,j}^U+g_{b,j}^L$. Combine Eq. (12) to Eq. (21), these conductances can be related to learned weights $W_1$ and $V_1$ as:

$$g_{s,j}^U = C_1 \times \max(0, W_{1,j}) \quad \text{Equation 22}$$

$$g_{s,j}^L = C_1 \times \max(0, -W_{i,j})$$

$$g_{b,j}^U = C_1 \times (V_1 - \max(0, -W_1) \times V_{DD})/V_{DD}$$

$$g_{b,j}^L = C_1 - g_{s,j}^U - g_{s,j}^L - g_{b,j}^U)$$

Since $C_1$ is a scaling factor, it may be chosen to ensure the RRAM conductances fall into a reasonable range. The same process can be repeated to instantiate the conductances for the negative path in the first layer.

For the second layer, a similar strategy may be adopted after normalizing both $W_2$ (and proportionally $V_2$) such that the sum of the positive and negative values across all columns is less than magnitude 1:

$$W_2' = \frac{W2}{\beta * \Sigma(\text{abs}(W_2), 0)}, V_2' = \frac{V2}{\beta * \Sigma(\text{abs}(W_2), 0)} \quad \text{Equation 23}$$

Where, $\Sigma(\text{abs}(W_2), 0)$ means the summation of all the elements (their absolute value) in the same column; $\beta$ is a scaling factor large than 1. The second layer conductances can then be computed as:

$$g_{s,j}^U = C_2 \times \max(0, W'_{2,kj}) \quad \text{Equation 24}$$

$$g_{s,j}^L = C_2 \times \max(0, -W'_{2,kji,i})$$

$$g_{b,j}^U = \frac{C_2 \times \left(-\sum_k (W'_{2,kj} \times V_{cm,o}) + V'_{2,j} + V_{cm,i}\right)}{V_{DD}}$$

$$g_{b,j}^L = C_2 - g_{s,kj}^U - g_{s,kj}^L - g_{b,j'}^U)$$

where, $V_{cm,i}$ and $V_{cm,o}$ are input and output mid-point voltage of the inverter input and output range, respectively. $C_2$ is also a scaling factor chosen to ensure the RRAM conductances fall into a reasonable range.

The above describes the NeuADC design as a learning problem with the objective of minimizing a cost function. The same training framework may be extended beyond the normal linear uniform quantization scheme to learn parameters for other quantization schemes tailored to the desired precision requirements for specific applications. To accommodate alternative schemes, the only update needed is changing the definition of $b_{GT}$ in Eq. (15) by using a function of $V_{in}$ instead of $V_{in}$ itself. For logarithmic encoding, $V_{in}$ is defined as:

$$V_{in,log}=c*\log_2(a*V_{in}+b)+d \quad \text{Equation 25}$$

whereas for the square root encoding, $V_{in}$ is defined as:

$$V_{in,sq} = c * \sqrt{a * V_{in} + b} + d \quad \text{Equation 26}$$

Here, a, b, c and d are the quantization encoding coefficients. Note that the encoding coefficients should make sure that $V_{in,log}$, $V_{in,sq}$ have the same dynamic range as $V_{in}$ and increase monotonously with $V_{in}$. The detailed value of these coefficients for different encoding schemes are listed in Table 1.

TABLE I

Experimental Configuration Parameters

| | Description |
|---|---|
| Training Parameters | |
| Optimizer | Adam |
| Batch size | 4096 |
| Projection step | 256 |
| # of iterations | $5.12 \times 10^4$ |
| Learning rate | $[10^{-3}, 10^{-4}]$ |
| Training constant α (binary encoding) | 0.125, 0.25, 0.5 |
| Encoding coefficient (logarithmic) | a = b = c = 1, d = 0 |
| Encoding coefficient (square-root) | a = c = 1, b = d = 0 |
| Technology Parameters | |
| CMOS technology | CMOS 130 nm |
| Process variation | ss/tt/ff/sf/fs |
| Voltage variation | 1.17 V~1.23 V |
| Temperature variation | −40° C.~80° C. |
| RRAM technology | HfOx-based RRAM |
| RRAM tunneling gap | 0.2 nm~1.9 nm |
| RRAM resistance resolution | 5-bit~10-bit, step = 1-bit |
| RRAM resistance range | 290Ω~500 kΩ |
| RRAM resistance variation (σ) | [0, 0.1], step = 0.025 |

Figure 20:
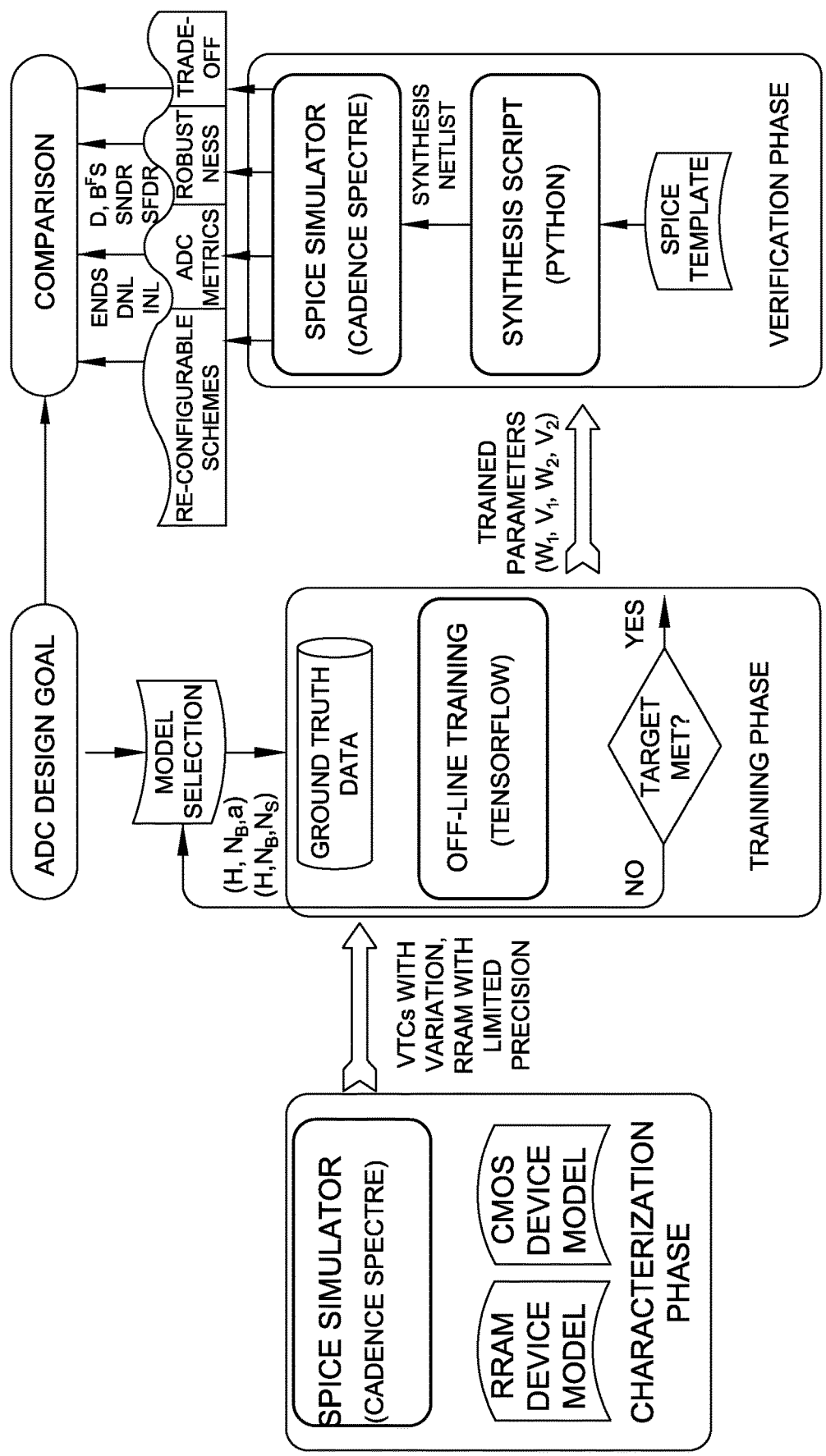
FIG. 20 illustrates an exemplary design automation flow.

The fully-automated design flow based on the NeuADC design approach is presented in FIG. 20, which consists of three phases—characterization, training and verification.

The first phase is the Characterization phase. Once the RRAM device model and CMOS device model are prepared, basic characterization at device and circuit level is first performed on a commercial simulator (e.g. Cadence Spectre). By simulation, the characterization data, such as RRAM conductance/resistance precision and CMOS inverter VTCs with variation, are extracted. The RRAM resistance resolution is set between 5-bit and 10-bit, with 1-bit step. VTCs are obtained by running 1000 times Monto Carlo simulation with supply voltage $V_{DD}$=[1.17V, 1.23V] and temperature T=[−40° C., 80° C.] for each process corner. Then, this characterization data is fed to the training framework. During the training, VTCs are utilized as the NAF, while the RRAM conductance/resistance precision is applied to constrain the precision of weights.

The next phase is the Training phase. Given the desired ADC goals, the NN model of the NeuADC circuit can be fully captured by a group of hyper-parameters based on the proposed NN-inspired realization of A/D converters. For binary-encoding, the hyper-parameters are (H, $N_B$, a). For smooth-encoding, the hyper-parameters are (H, $N_B$, $N_S$). Here, H denotes the number of hidden neurons; $N_B$, $N_S$ denotes the number of binary bits and the number of smooth bits, a is training constant for binary-encoding. Through the desired ADC resolution $\frac{1}{2}^{N_B}$, the ground truth datasets can be generated according to the desirable A/D quantization. The off-training framework then uses the datasets together with the device variation statistics to train the MLP network that models the behavior of the NeuADC circuit for each quantization scheme. During the training, the VTC of each neuron is randomly picked in per epoch. The training iterations are monitored to ensure the convergence of the learning. The reconstruction quality is verified at the end of each training. If the reconstructed signals match well with the labeled ground-truth signals, the trained model parameters ($W_1$, $V_1$, $W_2$, $V_2$) are saved for later verification using SPICE simulation. Otherwise, updated hyper-parameters will be used to train a new model until satisfactory performance is met.

Last is the Verification phase. After training, the trained model parameters ($W_1$, $V_1$, $W_2$, $V_2$) are fed into the synthesis script. Then the synthesis script instantiates the device/circuit design parameters, such as RRAM conductance and inverter sizes based on the device simulation template, so that the simulation netlist of NeuADC is automatically synthesized. The synthesized netlist allows us to perform a comprehensive sets of circuit analysis using the simulator (e.g. Cadence Spectre) to rigorously evaluate and verify the performance of the NeuADC circuits. In our experiments, we first evaluate the reconfigurable quantization schemes of NeuADC. Then, the typical ADC metrics, such as effective number of bits (ENOB), differential non-linearity (DNL), integral non-linearity (INL), frequency spectrum analysis, signal to noise and distortion ra-tio (SNDR) are evaluated. Thirdly, we assess the robustness of NeuADC against device non-idealities such as PVT variations and limited RRAM precision. Finally, these simulation metrics are compared with initial design goals to help optimize design parameters.

Next the NN is set-up for training. The NeuADC NN model is trained via stochastic gradient descent with the Adam optimizer. For the examples described herein, the batch-size is 4096 samples, and applys the projection step performed on the weights $W_1$, $V_1$ every 256 iterations. In this example, the NN is trained for a total of $5.12 \times 10^4$ iterations (except for certain smooth code NeuADC models that converge much faster), varying the learning rate from $10^{-3}$ to $10^{-4}$ across iterations. For the binary encoding models, three versions of each NeuADC circuit are trained with α=0.125, 0.25, and 0.5, and the one that yields the best results is chosen. Encoding coefficients for logarithmic encoding are set as a=b=c=1, d=0, while for square-root encoding, the coefficients are set as a=c=1, b=d=0.

Technology model: RRAM and CMOS transistors are the two device elements used in the exemplary NeuADC hardware substrate. In at least one embodiment, HfOx-based RRAM device model is used to implement the crossbar array. In this example, the transistor model is based on a 130 nm CMOS technology. The inverters, the output comparators, and the transistor switches in the RRAM crossbars are all simulated with the 130 nm transistor model in Cadence Spectre. CMOS and RRAM device resolution and variation are included into training. Configuration parameters from both the training setup and the technology model are summarized in Table 1.

In one example, a comprehensive set of experiments using the methodology explained above were performed. For the purposes of these examples, some experiments are performed considering only PVT condition (TT, 1.2V, 27° C.) with fixed RRAM resolution (9-bit) and minor RRAM stochas-tic variation (σ=0.025), whereas the robustness evaluation in other experiments look at the performance spread under all PVT conditions.

Figure 21:
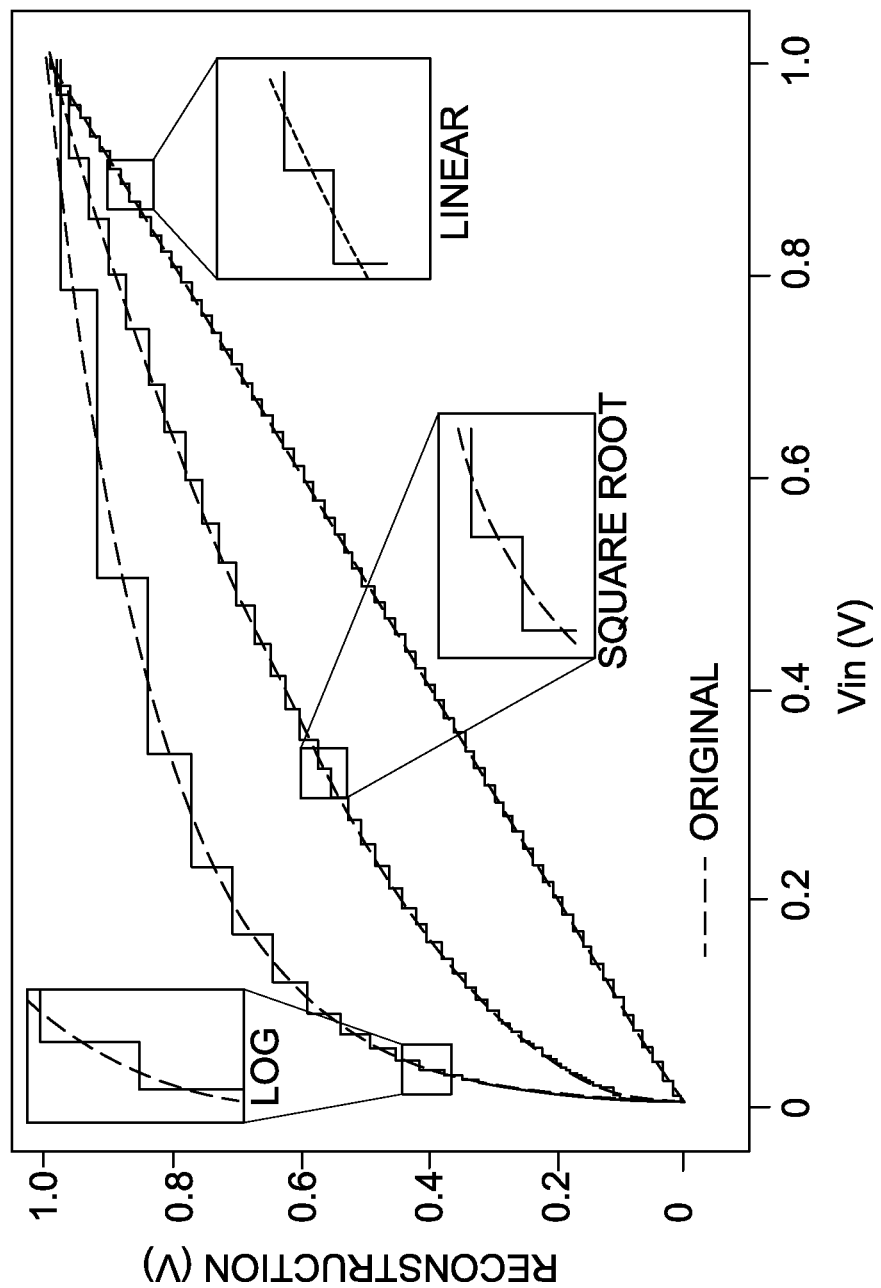
FIG. 21 illustrates an example NeuADC multi-quantization support for different encoding schemes.

FIG. 21 illustrates the reconstruction ability of NeuADC under three different quantization schemes. A NeuADC model (6→8 bits, 12 hidden units) is picked and trained with the three groups of ground truth data in FIG. 14. For each quantization scheme, the signal is reconstructed using the decoding scheme described above. The reconstructed signals (labeled as linear, square-root, and log) match well with the original signal (labeled as original), under different schemes, demonstrating that NeuADC can perform high-fidelity signal reconstruction with multiple reconfigurable quantization support using exactly the same hardware substrate.

Next, the NeuADC is reconstructed based on the reconstruction of a sinusoidal input signal $V_{in}$ in linear uniform encoding at 100 KHz frequency. The ENOB of the reconstructed waveform is reported using its standard definition ENOB=(SNDR−1.76)/6.02, where SNDR is obtained from analyzing NeuADC's output spectrum with fast Fourier transform (FFT). Tables 2 and 3 list the quantization quality measured by ENOB of several NeuADC designs with different number of output bits and hidden neurons using both binary and smooth codes.

TABLE 2

Learned performance of NeuADC with Binary Encodings measured by ENOB

| # Bits | # Hidden | ENOB |
|---|---|---|
| 4 | 16 | 3.46 |
| 4 | 64 | 3.73 |
| 4 | 128 | 3.74 |
| 6 | 24 | 4.01 |
| 6 | 96 | 4.07 |
| 6 | 192 | 4.48 |
| 8 | 32 | 4.76 |
| 8 | 128 | 5.51 |
| 8 | 256 | 5.74 |

TABLE 3

Learned performance of NeuADC with Smooth Encodings measured by ENOB

| # Bits | # Hidden | ENOB |
|---|---|---|
| 6 → 8 | 12 | 5.95 |
| 6 → 8 | 16 | 5.98 |
| 6 → 12 | 12 | 5.99 |
| 7 → 12 | 12 | 5.21 |
| 7 → 15 | 12 | 6.91 |
| 7 → 15 | 16 | 7.00 |
| 8 → 16 | 32 | 4.64 |
| 8 → 16 | 48 | 7.98 |
| 8 → 16 | 64 | 7.99 |

The advantage of smooth encoding is shown in Tables 2 and 3. Binary code requires a large number of hidden neurons and its ENOB plateaus around 5.74 even when the hidden neuron size is increased to 256 for 8-bit digital outputs. Despite its coding redundancy, smooth code can achieve much better ENOB with much fewer number of hidden neurons. For example, the 7→12 smooth code model with 12 hidden neurons exhibits an ENOB of 5.21. However, as the output neurons increase to 15, the ENOB increases rapidly to 6.91, and further increasing the hidden neurons to 16 could recover the ENOB fully to its theoretical upper bound of 7 for a 7-bit ADC. It suggests there exists a relationship between the encoding redundancy and the hidden neuron sizes.

Figure 22B:
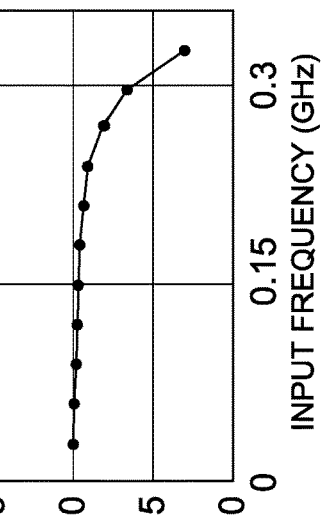
FIGS. 22A-22D illustrate graphs of simulated metrics of an exemplary NeuADC.
Figure 22D:
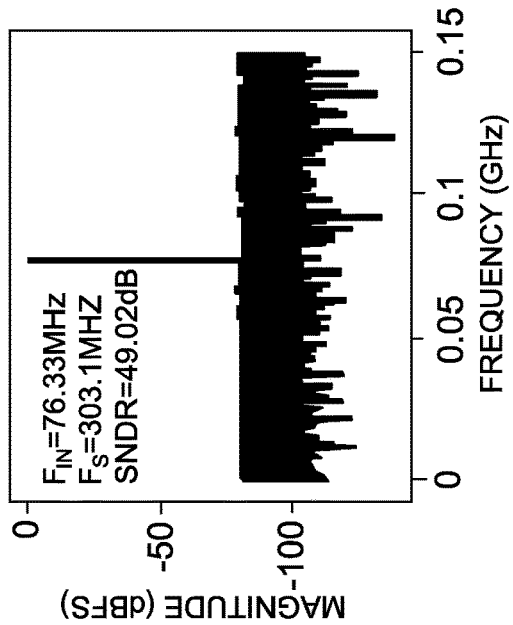
Figure 22A:
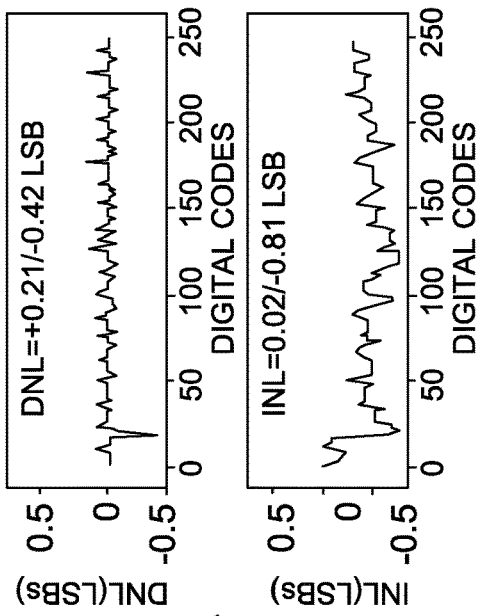
Figure 22C:
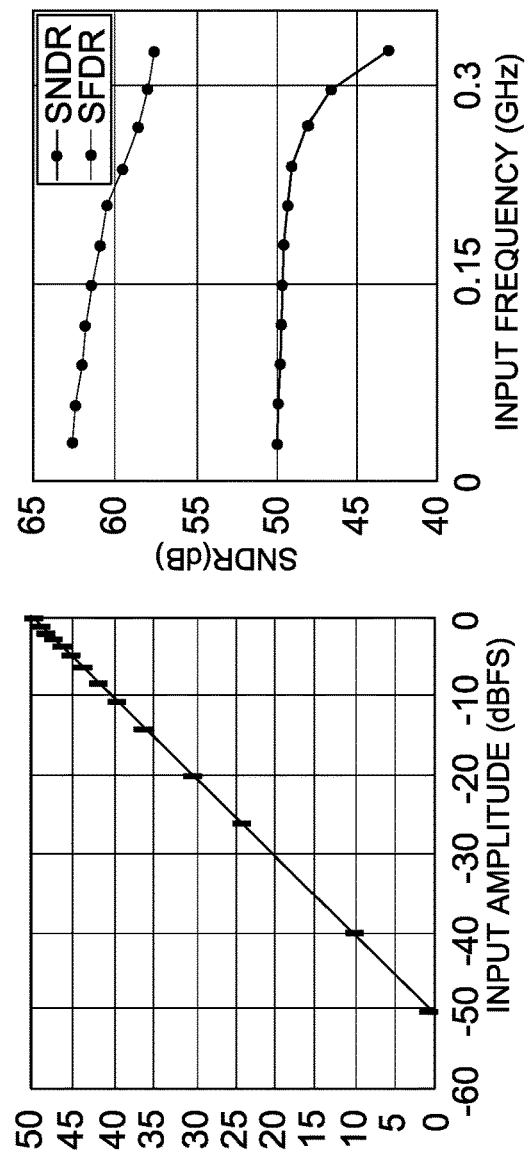

Classic ADC designs are evaluated for a number of different metrics. In this evaluation step, the NeuADC circuits are measured against many established ADC metrics to demonstrate its practical value. For example, a specific NeuADC model (8→16 bits, 48 hidden units) is chosen for evaluation. DNL and INL are typically used to characterize ADC's static performance. FIG. 22(a) shows the DNL and INL of our proposed NeuADC based on simulation. The worst DNL and INL are −0.42LSB and −0.81LSB respectively, well within the range of conventional linearity requirements. The simulated output spectrum is then used to characterize the dynamic performance of the ADC. FIG. 22(b) shows a −0.5 dB to full scale (dBFS) of a 76.33 MHz input. The SNDR is 49.02 dB. The trend of SNDR with changing input amplitude is plotted in FIG. 22(c) and follows a linear relationship. To evaluate the input bandwidth of NeuADC, sinusoidal input signals are applied with different frequencies to the NeuADC circuit. The trend is shown in FIG. 22(d), and we can see that even at 150 MHz, the output SNDR and SFDR only degenerate slightly.

Figure 23:
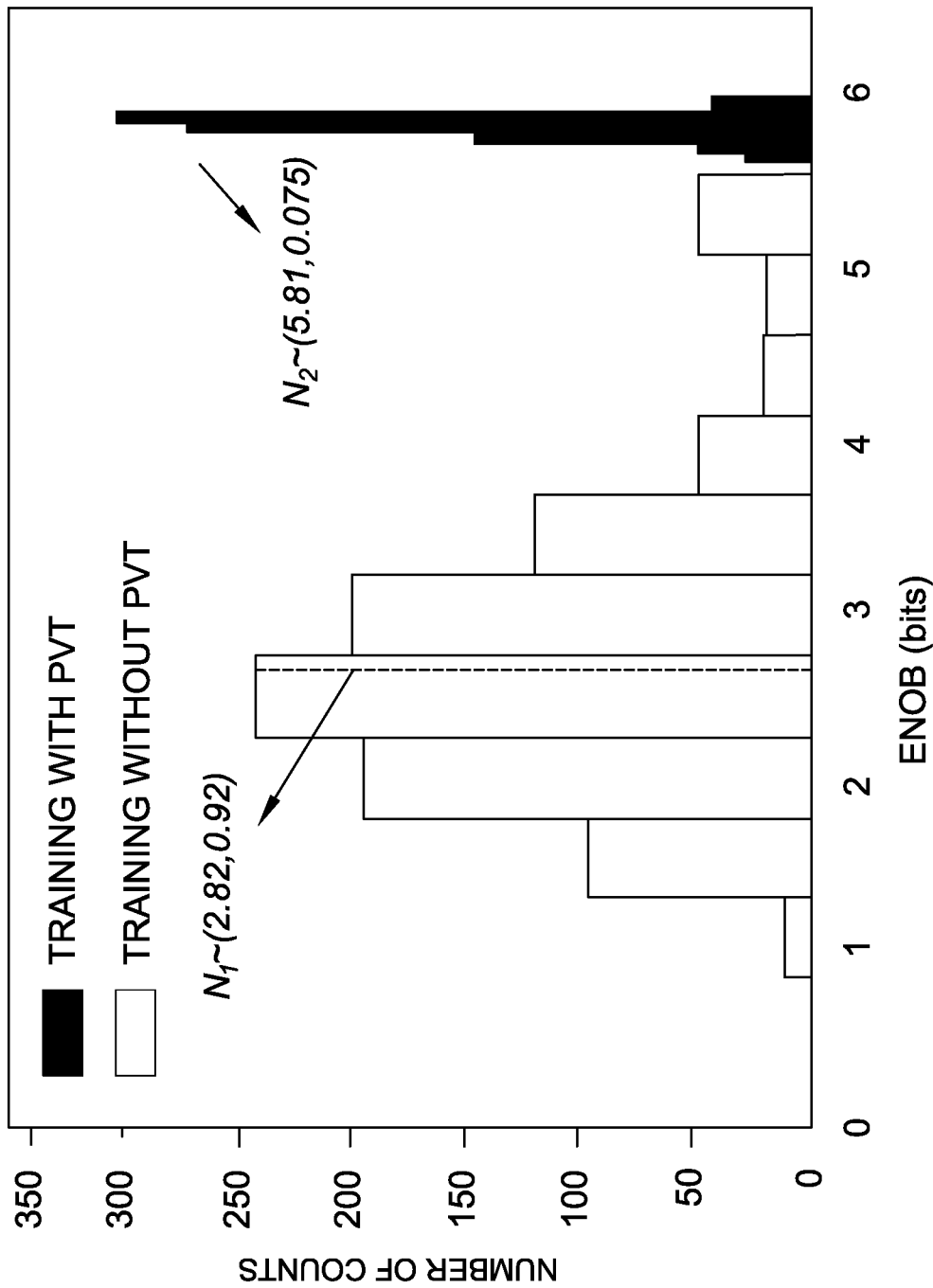
FIG. 23 illustrates a graph of an ENOB distribution comparison with and without incorporating PVT variation into training.

The performance of the NeuADC with the ENOB metric CMOS PVT is examined. The ENOB is compared with and without incorporating PVT variations into training by selecting the 6→8 bits, 12 hidden units NeuADC model at TT corner for illustration. The comparison is illustration FIG. 23. Without incorporating PVT variations into training the distribution of ENOB under 1000 Monte Carlo simulation runs centers around 2.82 with a large standard deviation of 0.92, resulting in poor quantization performance. After incorporating PVT variations of VTC into training, the distribution of ENOB under 1000 Monte Carlo runs is more narrowly centered around 5.81 with merely 0.075 standard variation. The striking contrast shows that variation-aware re-training may greatly improve the robustness of the NeuADC framework.

Figures 24A, 24B, 24C:
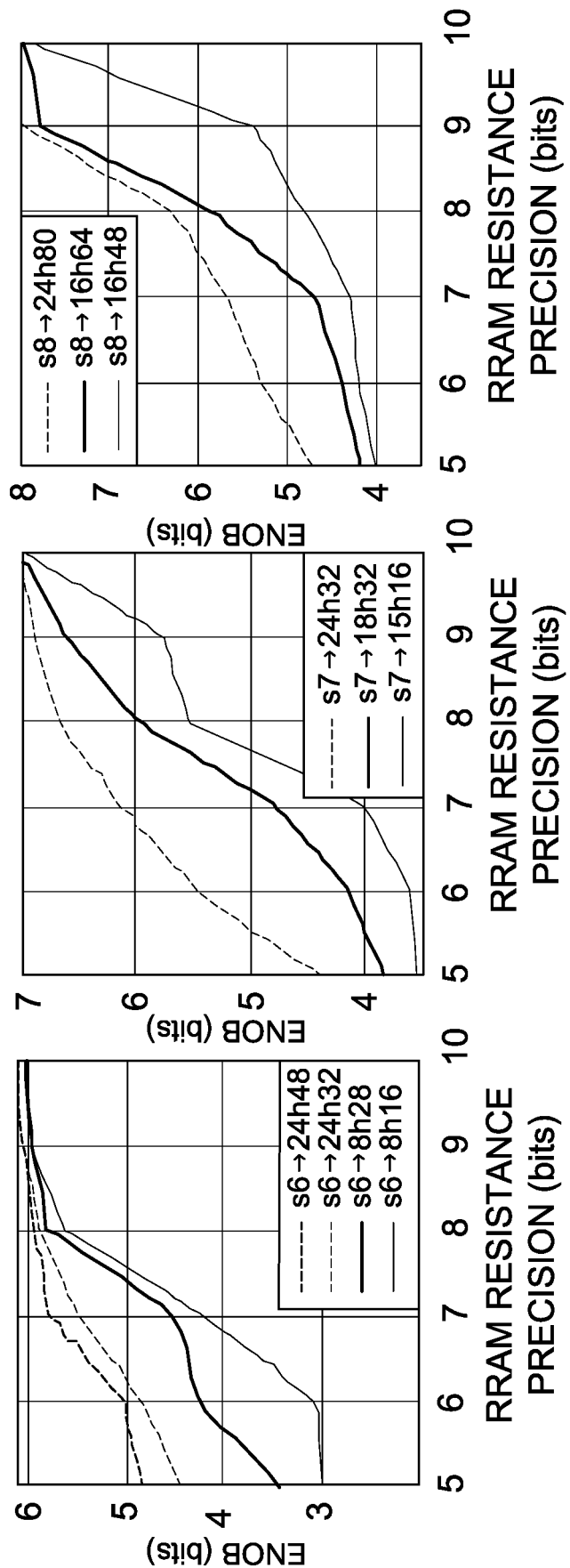
FIGS. 24A-24C illustrate graphs of performance degradation for different NeuADC designs with descreasing RRAM resistance precision.

Next, the performance of the NeuADC is evaluated given realistic considerations of RRAM device non-idealities. The ENOBs of different NeuADC designs are examined to determine variations with RRAM resistance precisions. Both CMOS PVT variation and RRAM limited resistance resolution in the training process are incorporated for this analysis. Example ENOB versus RAM precision curves are presented in FIGS. 24(a)–(c). Each point shown in the figure are obtained from 1000 Monte Carlo simulation runs. Accordingly, to achieve a target resolution of B-bit in NeuADC, a (B+1)-bit RRAM resistance precision is usually sufficient. Among different NeuADC designs for the same target ADC resolution, the one that uses more output bits or hidden neuron tends to exhibit more robustness against RRAM resistance precision degeneration. In some embodiments, this may suggest a trade-off between robustness and resources/redundancy.

Figure 25:
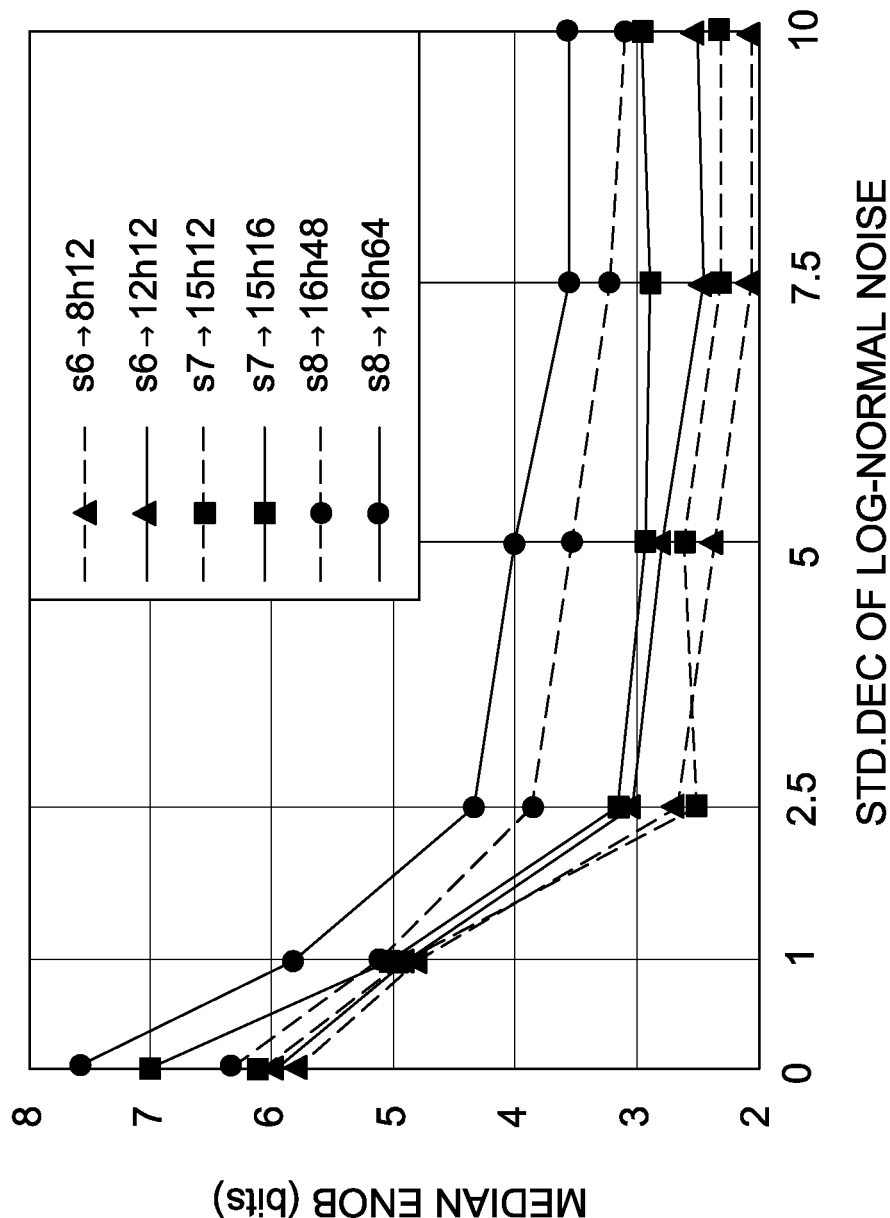
FIG. 25 illustrates a graph of performance degradation for different NeuADC designs with increasing log-normal noise at fixed RRAM resistance of 9-bit.

Finally, the stochastic variation of RRAM is examined by reviewing the median ENOB of different NeuADC models with fixed RRAM precision (9-bit) when perturbing their resistance with log-normal noise of different standard deviations σ. The example results are presented in FIG. 25. For these experiments, both CMOS PVT variation and RRAM limited resistance resolution are incorporated into training and then several batches of 100-run Monte Carlo simulations are instantiated with different level of resistance variations as modeled by the standard deviation of the log normal distribution (σ). Then the median ENOB of each is computed. As shown, the learned NeuADC performs well a moderate levels of noise, which demonstrates robustness against the non-idealities in both CMOS and RRAM devices. Furthermore, when comparing two NeuADC designs with similar performance with process variation, the design that uses more output bits or hidden units tends to exhibit more robustness against variation.

Figure 26:
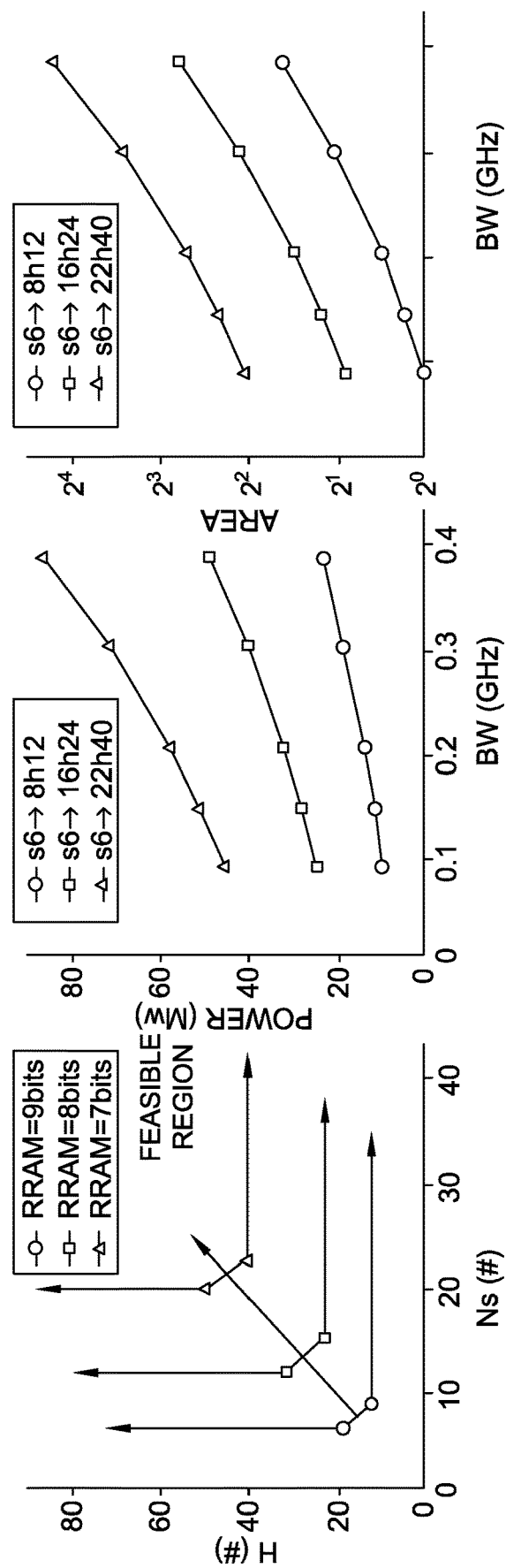
FIGS. 26A-26C illustrate graphs of design trade-offs of NeuADC by comparing 6-bit NeuADC models.

There are several design trade-offs of NeuADC taking 6-bit A/D as an example. As FIG. 26(a) shows, given a specific resolution of RRAM, there exists a lower bound combination of hyper-parameters (H, $N_S$) that converges to an ideal ENOB during training. However, the lower bound shifts towards up, right as the resolution of RRAM decreases. This is because increasing the size of NN can improve the robustness of NeuADC performance. There also exist tradeoffs between bandwidth (BW) and power consumption, as well as bandwidth and area, as display in FIGS. 26(b) and (c). As the BW increases, the power consumption of each model rises. This shows that a wider bandwidth means decreasing the RRAM resistance in the crossbar array, which results in increased power consumption. Also, in order to increase the bandwidth, the inverters need to be sized up to strengthen the driving ability of neurons. Therefore, the area of the NeuADC circuit increases with the bandwidth. The area shown in FIG. 26(c) is normalized to a →8 bits, 12 hidden units NeuADC working at 0.1 GHz input signal frequency.

The NeuADC presented herein is a novel automated design approach for synthesizable A/D conversion with reconfigurable quantization support using the same hardware substrate. The NeuADC is built upon a general NN hardware substrate enabled by a novel dual-path mixed-signal RRAM crossbar architecture. The design parameters are "learned" through NN training. A new smooth encoding scheme to improves the training accuracy and develops hardware-oriented circuit models and constraint formulations in the training process. The non-idealities of devices are incorporated into training to improve the robustness of NeuADC. In some embodiments, the entire synthesis process of NeuADC can be automated without human designers in the loop. Comprehensive ADC performance metrics are evaluated using circuit-level simulation. The automatically-synthesized NeuADC can indeed be reconfigured for different quantization scheme with high-fidelity reconstruction and achieve performance comparable to state-of-the-art ADCs despite limited RRAM resistance precision.

Figure 27:
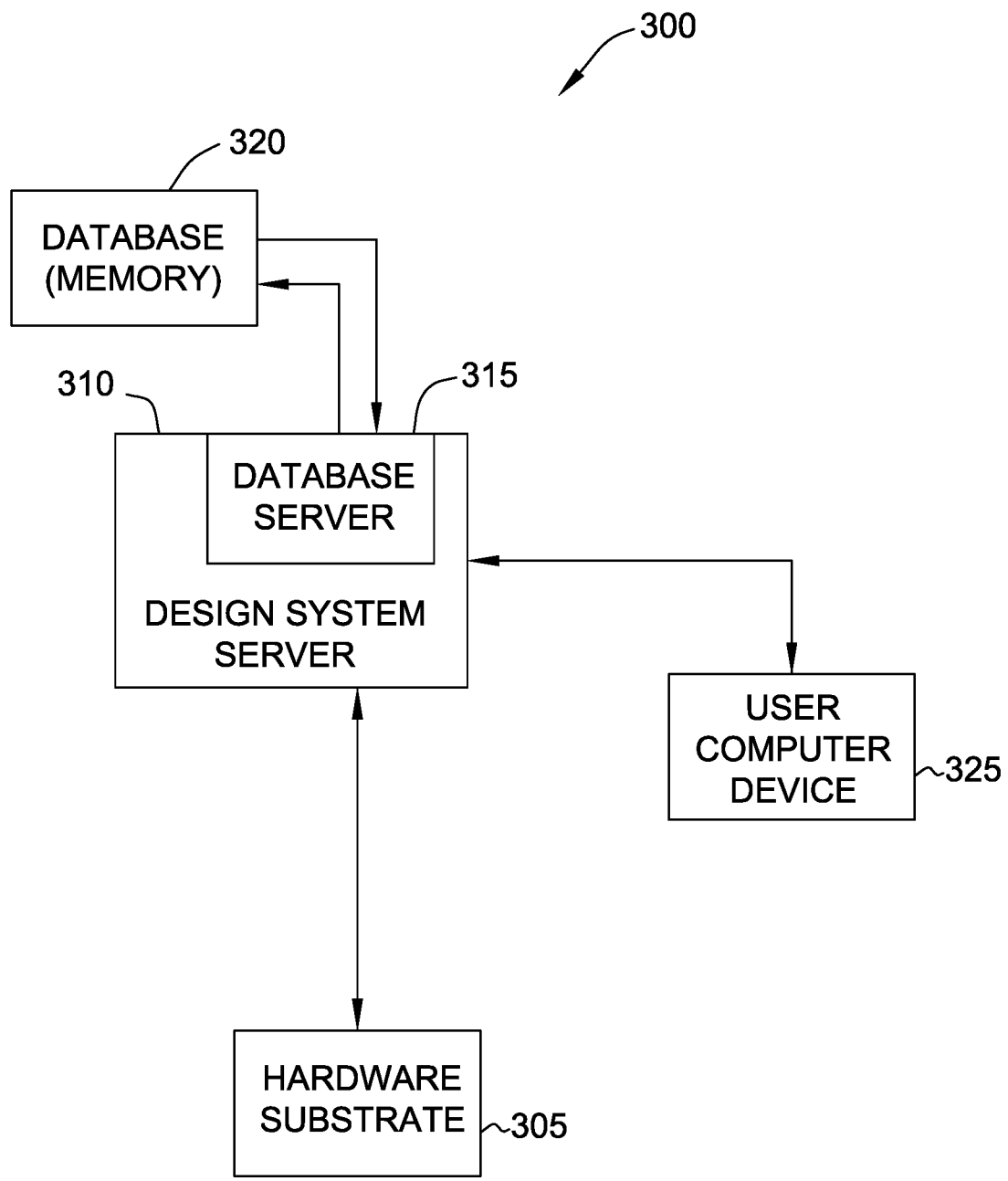
FIG. 27 illustrates a simplified block diagram of an exemplary design system.

FIG. 27 depicts a simplified block diagram of an exemplary design computer system 300 for performing functional and graphical object oriented data analysis of untargeted metabolomics. In the exemplary embodiment, system 300 may be used for designing ADC circuits optimized using neural networks. As described below in more detail, a design system server 310 (also known as a design system computer device 310), may be configured to (i) generate a mathematical model of an desired AMS circuit; (ii) determine a structural definition of the circuit using the mathematical model; (iii) define a mapping of a plurality of components of the circuit to a plurality of neurons representing the plurality of components of the circuit using at least the structural definition; (iv) synthesize, on a hardware substrate, the plurality of neurons; and (v) execute, using the synthesized plurality of neurons on the hardware substrate, at least one test using at least one optimization constraint to determine an optimal arrangement of the plurality of components as described herein.

In the exemplary embodiment, hardware substrate 305 is a configurable circuit platform. Hardware substrate 305 receives configuration information from design system server 310. In the exemplary embodiment, hardware substrate 305 also receives input information from design system server 310 and transmits output signals to design system 310. More specifically, hardware substrate 305 is communicatively coupled to design system server 310 through many interfaces including, but not limited to, at least one of the Internet, a network, such as the Internet, a local area network (LAN), a wide area network (WAN), or an integrated services digital network (ISDN), a dial-up-connection, a digital subscriber line (DSL), a cellular phone connection, and a cable modem. Design system 310 may be any device capable of accessing the Internet including, but not limited to, a desktop computer, a laptop computer, a personal digital assistant (PDA), a cellular phone, a smart-phone, a tablet, a phablet, wearable electronics, smart watch, or other web-based connectable equipment or mobile devices.

In the exemplary embodiment, user computer devices 325 are computers that include a web browser or a software application, which enables user computer devices 325 to access remote computer devices, such as design system server 310, using the Internet or other network. More specifically, user computer devices 325 may be communicatively coupled to the Internet through many interfaces including, but not limited to, at least one of a network, such as the Internet, a local area network (LAN), a wide area network (WAN), or an integrated services digital network (ISDN), a dial-up-connection, a digital subscriber line (DSL), a cellular phone connection, and a cable modem. User computer devices 325 may be any device capable of accessing the Internet including, but not limited to, a desktop computer, a laptop computer, a personal digital assistant (PDA), a cellular phone, a smartphone, a tablet, a phablet, wearable electronics, smart watch, or other web-based connectable equipment or mobile devices.

A database server 315 is communicatively coupled to a database 320 that stores data. In one embodiment, database 320 may include optimization parameters, input and output results, weights, parameters, and hardware substrate specifications. In the exemplary embodiment, database 320 is stored remotely from design system server 310. In some embodiments, database 320 is decentralized. In the exemplary embodiment, a user, may access database 320 via user computer device 325 by logging onto design system server 310, as described herein.

Design system server 310 may be in communication with a plurality of hardware substrates 305 and a plurality of user computer devices 325 to automatically design, synthesize, and optimize AMS circuits.

Figure 28:
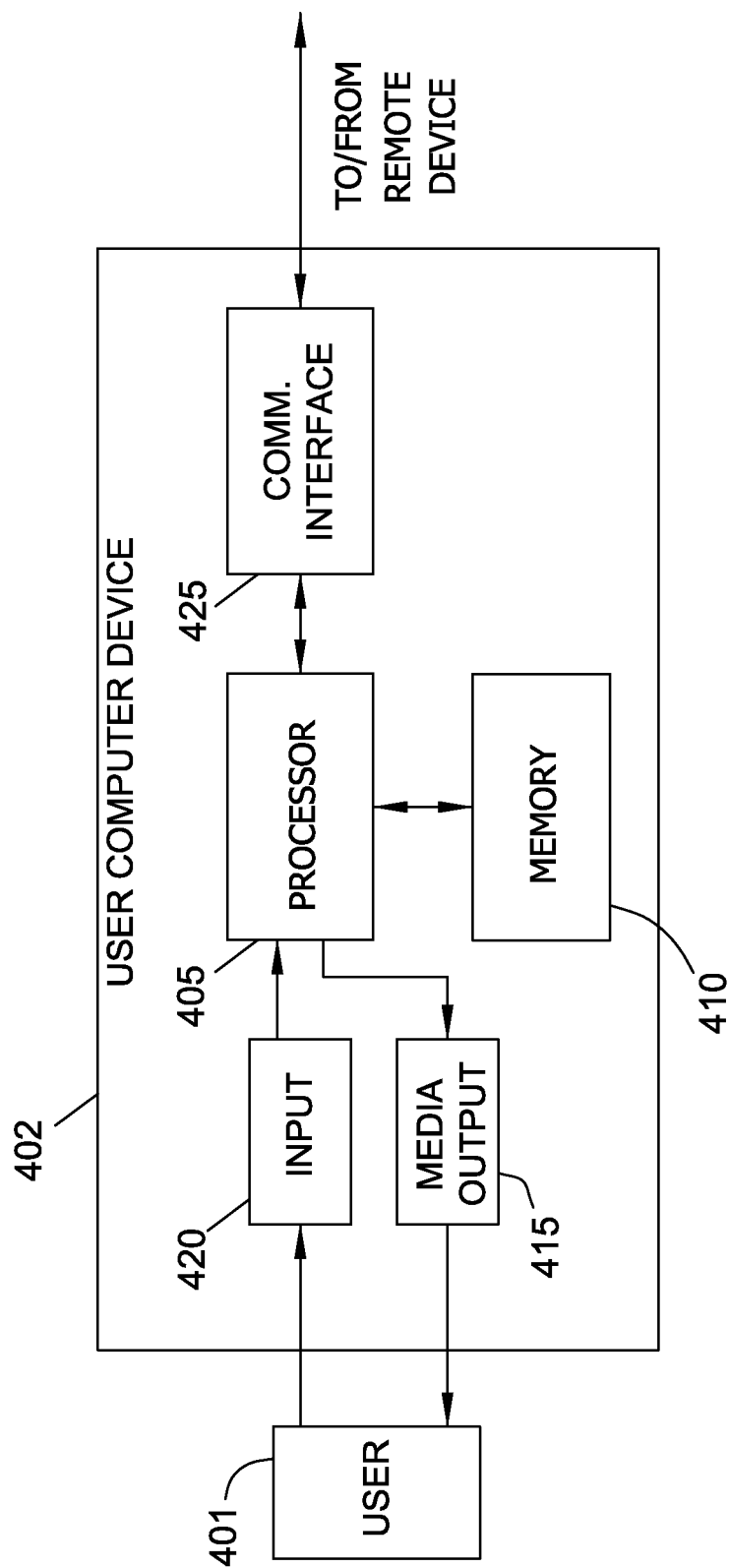
FIG. 28 illustrates an exemplary configuration of a client computer device as shown in FIG. 27, in accordance with one embodiment of the present disclosure.

FIG. 28 depicts an exemplary configuration of client computer device, in accordance with one embodiment of the present disclosure. User computer device 402 may be operated by a user 401. User computer device 402 may include, but is not limited to, hardware substrate 305 and user computer devices 325 (both shown in FIG. 27). User computer device 402 may include a processor 405 for executing instructions. In some embodiments, executable instructions may be stored in a memory area 410. Processor 405 may include one or more processing units (e.g., in a multi-core configuration). Memory area 410 may be any device allowing information such as executable instructions and/or transaction data to be stored and retrieved. Memory area 410 may include one or more computer readable media.

User computer device 402 may also include at least one media output component 415 for presenting information to user 401. Media output component 415 may be any component capable of conveying information to user 401. In some embodiments, media output component 415 may include an output adapter (not shown) such as a video adapter and/or an audio adapter. An output adapter may be operatively coupled to processor 405 and operatively coupleable to an output device such as a display device (e.g., a cathode ray tube (CRT), liquid crystal display (LCD), light emitting diode (LED) display, or "electronic ink" display) or an audio output device (e.g., a speaker or headphones).

In some embodiments, media output component 415 may be configured to present a graphical user interface (e.g., a web browser and/or a client application) to user 401. A graphical user interface may include, for example, an interface for providing desired optimization parameters (e.g., speed, power use, etc.). In some embodiments, user computer device 402 may include an input device 420 for receiving input from user 401. User 401 may use input device 420 to, without limitation, select a particular synthesized circuit for review.

Input device 420 may include, for example, a keyboard, a pointing device, a mouse, a stylus, a touch sensitive panel (e.g., a touch pad or a touch screen), a gyroscope, an accelerometer, a position detector, a biometric input device, and/or an audio input device. A single component such as a touch screen may function as both an output device of media output component 415 and input device 420.

Figure 5:
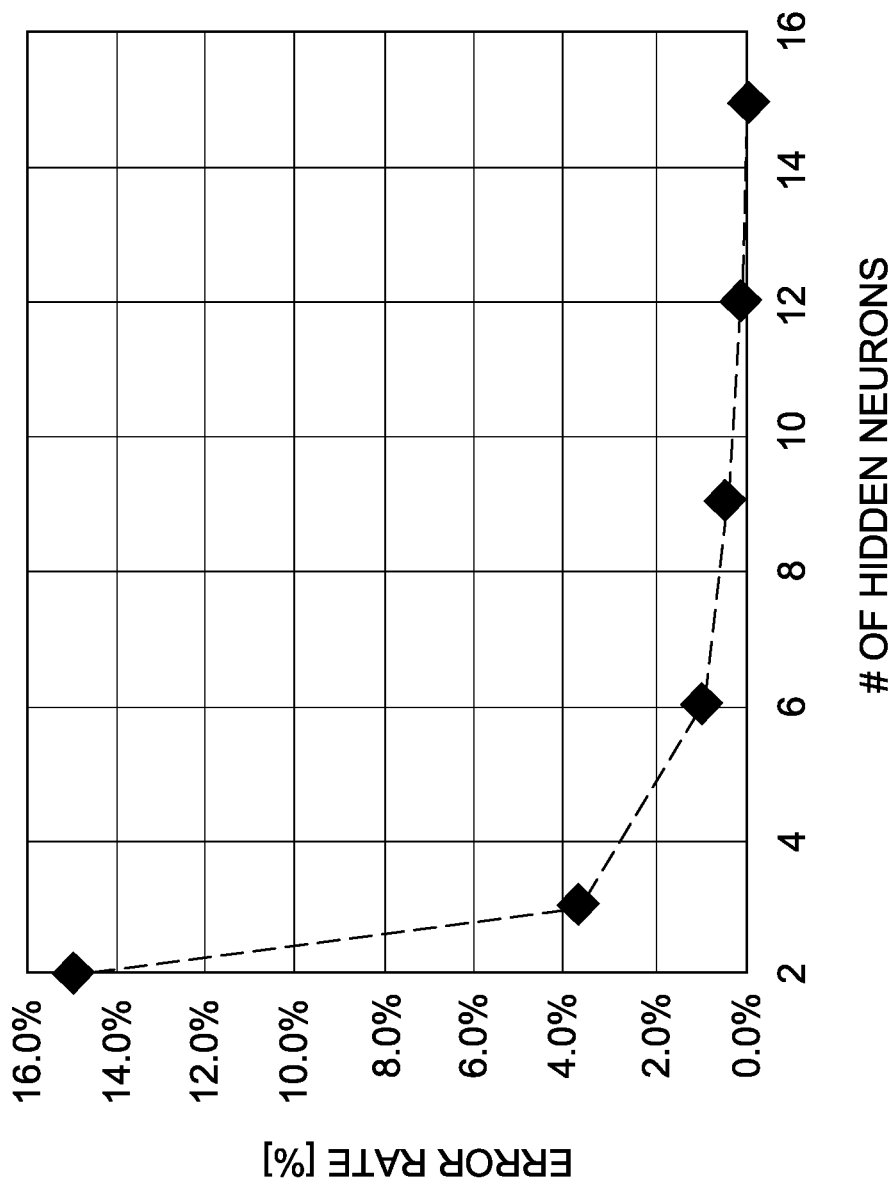
FIG. 5 illustrates a graph of the performance of the design system in relation to number of neurons.
Figure 6:
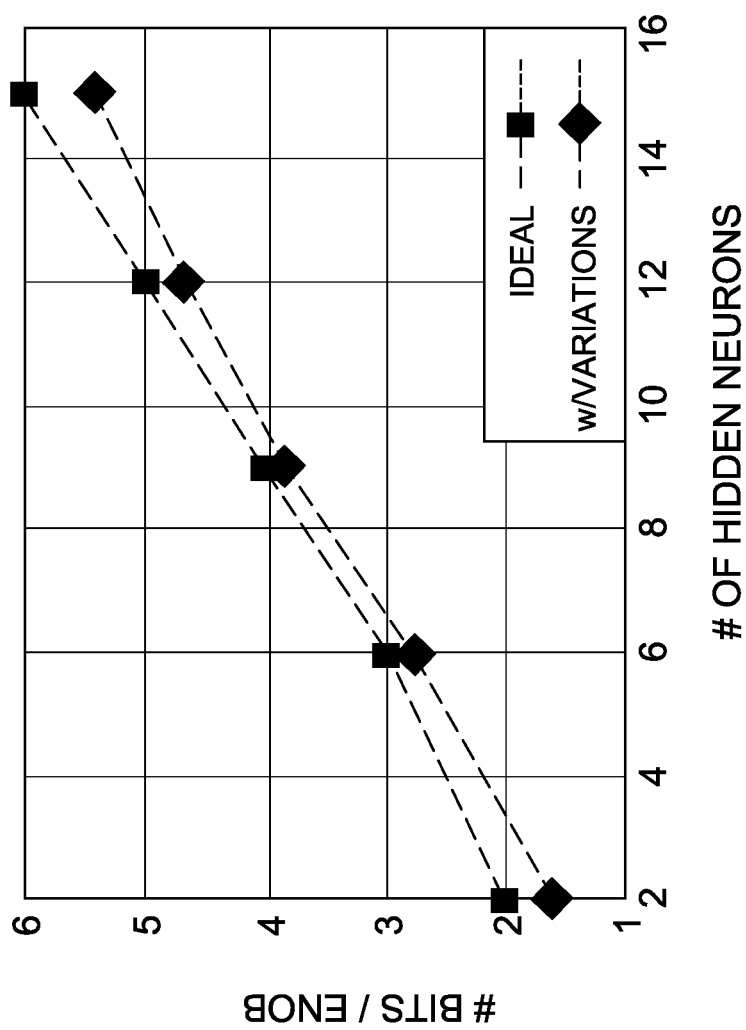
FIG. 6 illustrates a graph of neuron requirements for quantization objectives of the design system.

User computer device 402 may also include a communication interface 425, communicatively coupled to a remote device such as design system server 310 (shown in FIG. 5). Communication interface 425 may include, for example, a wired or wireless network adapter and/or a wireless data transceiver for use with a mobile telecommunications network.

Stored in memory area 410 are, for example, computer readable instructions for providing a user interface to user 401 via media output component 415 and, optionally, receiving and processing input from input device 420. A user interface may include, among other possibilities, a web browser and/or a client application. Web browsers enable users, such as user 401, to display and interact with media and other information typically embedded on a web page or a website from design system server 310. A client application may allow user 401 to interact with, for example, design system server 310. For example, instructions may be stored by a cloud service, and the output of the execution of the instructions sent to the media output component 415.

Figure 29:
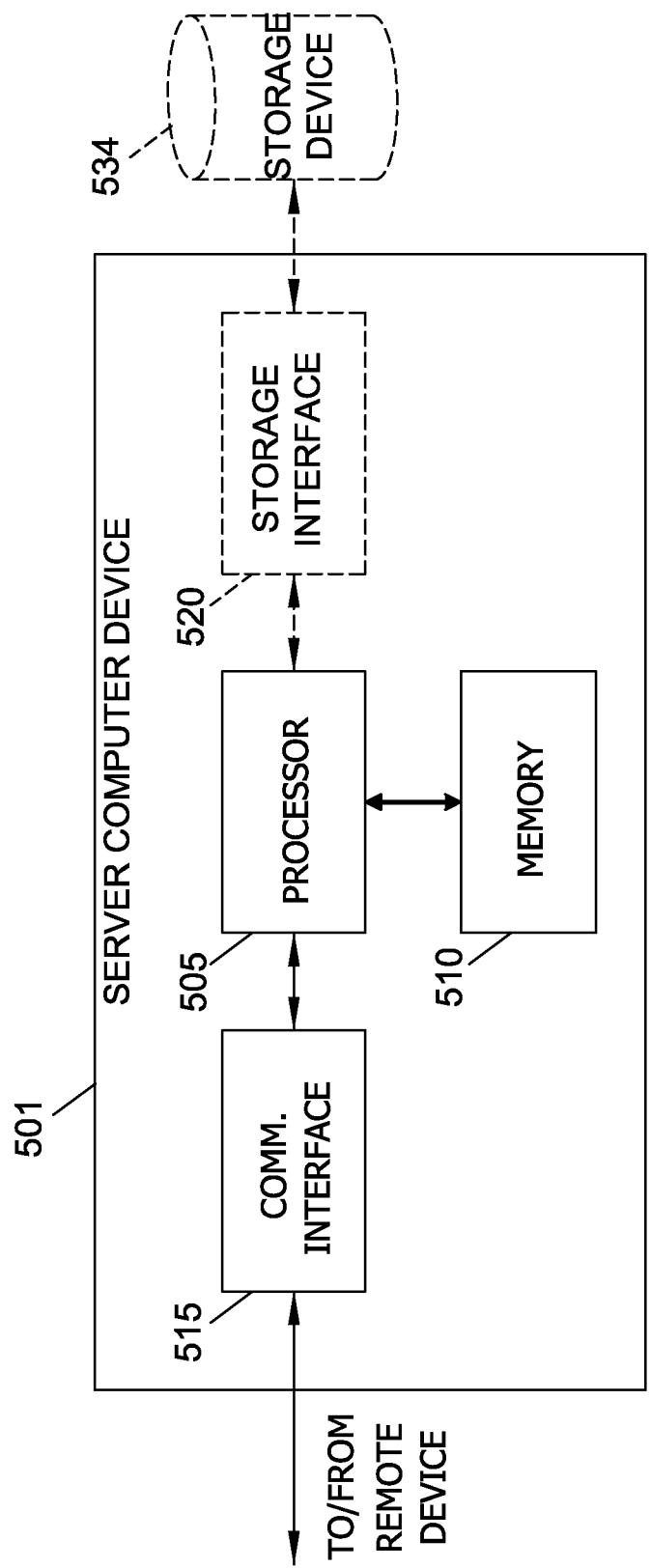
FIG. 29 illustrates an exemplary configuration of a server system as shown in FIG. 27, in accordance with one embodiment of the present disclosure.

FIG. 29 depicts an exemplary configuration of server system, in accordance with one embodiment of the present disclosure. Server computer device 501 may include, but is not limited to, design system server 310 and database server 315 (both shown in FIG. 27). Server computer device 501 may also include a processor 505 for executing instructions. Instructions may be stored in a memory area 510. Processor 505 may include one or more processing units (e.g., in a multi-core configuration).

Processor 505 may be operatively coupled to a communication interface 515 such that server computer device 501 is capable of communicating with a remote device such as another server computer device 501, design system server 310, hardware substrate 305, and user computer device 325 (both shown in FIG. 8) (for example, using wireless communication or data transmission over one or more radio links or digital communication channels). For example, communication interface 515 may receive requests from user computer devices 325 via the Internet, as illustrated in FIG. 27.

Processor 505 may also be operatively coupled to a storage device 534. Storage device 534 may be any computer-operated hardware suitable for storing and/or retrieving data, such as, but not limited to, data associated with database 320 (shown in FIG. 5). In some embodiments, storage device 534 may be integrated in server computer device 501. For example, server computer device 501 may include one or more hard disk drives as storage device 534.

In other embodiments, storage device 534 may be external to server computer device 501 and may be accessed by a plurality of server computer devices 501. For example, storage device 534 may include a storage area network (SAN), a network attached storage (NAS) system, and/or multiple storage units such as hard disks and/or solid state disks in a redundant array of inexpensive disks (RAID) configuration.

In some embodiments, processor 505 may be operatively coupled to storage device 534 via a storage interface 520. Storage interface 520 may be any component capable of providing processor 505 with access to storage device 534. Storage interface 520 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 505 with access to storage device 534.

Processor 505 may execute computer-executable instructions for implementing aspects of the disclosure. In some embodiments, the processor 505 may be transformed into a special purpose microprocessor by executing computer-executable instructions or by otherwise being programmed. For example, the processor 505 may be programmed with the instructions.

The computer systems and computer-implemented methods discussed herein may include additional, less, or alternate actions and/or functionalities, including those discussed elsewhere herein. The computer systems may include or be implemented via computer-executable instructions stored on non-transitory computer-readable media. The methods may be implemented via one or more local or remote processors, transceivers, servers, and/or sensors (such as processors, transceivers, servers, and/or sensors mounted on vehicle or mobile devices, or associated with smart infrastructure or remote servers), and/or via computer executable instructions stored on non-transitory computer-readable media or medium.

In some embodiments, the design system is configured to implement machine learning, such that the neural network "learns" to analyze, organize, and/or process data without being explicitly programmed. Machine learning may be implemented through machine learning (ML) methods and algorithms. In an exemplary embodiment, a machine learning (ML) module is configured to implement ML methods and algorithms. In some embodiments, ML methods and algorithms are applied to data inputs and generate machine learning (ML) outputs. Data inputs may include but are not limited to: analog and digital signals (e.g. sound, light, motion, natural phenomena, etc.) Data inputs may further include: sensor data, image data, video data, telematics data. ML outputs may include but are not limited to: digital signals (e.g. information data converted from natural phenomena). ML outputs may further include: speech recognition, image or video recognition, medical diagnoses, statistical or financial models, autonomous vehicle decision-making models, robotics behavior modeling, fraud detection analysis, user input recommendations and personalization, game AI, skill acquisition, targeted marketing, big data visualization, weather forecasting, and/or information extracted about a computer device, a user, a home, a vehicle, or a party of a transaction. In some embodiments, data inputs may include certain ML outputs.

In some embodiments, at least one of a plurality of ML methods and algorithms may be applied, which may include but are not limited to: linear or logistic regression, instance-based algorithms, regularization algorithms, decision trees, Bayesian networks, cluster analysis, association rule learning, artificial neural networks, deep learning, dimensionality reduction, and support vector machines. In various embodiments, the implemented ML methods and algorithms are directed toward at least one of a plurality of categorizations of machine learning, such as supervised learning, unsupervised learning, and reinforcement learning.

In one embodiment, ML methods and algorithms are directed toward supervised learning, which involves identifying patterns in existing data to make predictions about subsequently received data. Specifically, ML methods and algorithms directed toward supervised learning are "trained" through training data, which includes example inputs and associated example outputs. Based on the training data, the ML methods and algorithms may generate a predictive function which maps outputs to inputs and utilize the predictive function to generate ML outputs based on data inputs. The example inputs and example outputs of the training data may include any of the data inputs or ML outputs described above. For example, a ML module may receive training data comprising customer identification and geographic information and an associated customer category, generate a model which maps customer categories to customer identification and geographic information, and generate a ML output comprising a customer category for subsequently received data inputs including customer identification and geographic information.

In another embodiment, ML methods and algorithms are directed toward unsupervised learning, which involves finding meaningful relationships in unorganized data. Unlike supervised learning, unsupervised learning does not involve user-initiated training based on example inputs with associated outputs. Rather, in unsupervised learning, unlabeled data, which may be any combination of data inputs and/or ML outputs as described above, is organized according to an algorithm-determined relationship. In an exemplary embodiment, a ML module coupled to or in communication with the design system or integrated as a component of the design system receives unlabeled data, and the ML module employs an unsupervised learning method such as "clustering" to identify patterns and organize the unlabeled data into meaningful groups. The newly organized data may be used, for example, to extract further information about the circuit.

In yet another embodiment, ML methods and algorithms are directed toward reinforcement learning, which involves optimizing outputs based on feedback from a reward signal. Specifically ML methods and algorithms directed toward reinforcement learning may receive a user-defined reward signal definition, receive a data input, utilize a decision-making model to generate a ML output based on the data input, receive a reward signal based on the reward signal definition and the ML output, and alter the decision-making model so as to receive a stronger reward signal for subsequently generated ML outputs. The reward signal definition may be based on any of the data inputs or ML outputs described above. In an exemplary embodiment, a ML module implements reinforcement learning in a user recommendation application. The ML module may utilize a decision-making model to generate a ranked list of options based on user information received from the user and may further receive selection data based on a user selection of one of the ranked options. A reward signal may be generated based on comparing the selection data to the ranking of the selected option. The ML module may update the decision-making model such that subsequently generated rankings more accurately predict optimal constraints.

As will be appreciated based upon the foregoing specification, the above-described embodiments of the disclosure may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium, such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps", or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, ORACLE® Database, MySQL, IBM® DB2, MICROSOFT® SQL Server, SYBASE®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

In one embodiment, a computer program is provided, and the program is embodied on a computer readable medium. In an exemplary embodiment, the system is executed on a single computer system, without requiring a connection to a sever computer. In a further embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom), or any other type of operating system environment. The application is flexible and designed to run in various different environments without compromising any major functionality.

In some embodiments, the system includes multiple components distributed among a plurality of computer devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes. The present embodiments may enhance the functionality and functioning of computers and/or computer systems.

As used herein, an element or step recited in the singular and preceded by the word "a" or "an" should be understood as not excluding plural elements or steps, unless such exclusion is explicitly recited. Furthermore, references to "example embodiment," "exemplary embodiment," or "one embodiment" of the present disclosure are not intended to be interpreted as excluding the existence of additional embodiments that also incorporate the recited features.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A neural network based learning system, the system including:
   at least one memory;
   at least one processor in communication with said at least one memory, said at least one processor configured to:
   generate a mathematical model of an analog-to-digital interface for an analog mixed-signal circuit;
   determine a structural definition of a hardware substrate including a plurality of inputs and a plurality of outputs;
   generate a neural network based on the mathematical model of the analog-to-digital interface and the structural definition of the hardware substrate, wherein the neural network includes a plurality of layers and each layer of the plurality of layers includes a plurality of neurons;
   program the hardware substrate with a first plurality of neurons of a first layer of the neural network to simulate the mathematical model of the analog-to-digital interface including one or more learning algorithms, wherein the hardware substrate is programmed with a first plurality of weights, a first input vector, and a first output vector from the first layer of the neural network; and
   subsequently program the hardware substrate with a second plurality of neurons of a second layer of the neural network to simulate the mathematical model of the analog-to-digital interface, wherein the hardware substrate is programmed with a second plurality of weights, a second input vector, and a second output vector from the second layer of the neural network, wherein the second input vector is based on the first output vector.

2. The system in accordance with claim 1, wherein the at least one processor is further programmed to train the neural network based on the structural definition of the hardware substrate and at least one optimization constraint.

3. The system in accordance with claim 1, wherein the hardware substrate includes a resistive random-access memory (RRAM) crossbar array.

4. The system in accordance with claim 1, wherein the plurality of neurons in the hardware substrate are trained using the one or more learning algorithms and at least one optimization constraint.

5. The system in accordance with claim 4, wherein the plurality of neurons is trained based on an ideal quantization function.

6. The system in accordance with claim 4, wherein the training of the plurality of neurons includes adjusting a plurality of weights associated with the plurality of neurons through back-tracking output errors.

7. The system in accordance with claim 4, wherein to train the plurality of neurons the processor is further programmed to train the plurality of neurons to achieve a learned, optimized result based on inputs and outputs.

8. The system in accordance with claim 7, wherein the inputs and outputs are a combination of analog and digital signals.

9. The system in accordance with claim 4, wherein the at least one optimization constraint is at least one of a weight, learning objective, and constraint.

10. The system in accordance with claim 1, wherein the programmed hardware substrate performs matrix multiplication for the plurality of layers to associate network weights with an output from one or more previous layers of the plurality of layers and converts the summation of a current layer of the plurality of layers to an input of one or more subsequent layers of the plurality of layers.

11. The system in accordance with claim 1, wherein the structural definition of the hardware substrate includes at least one of current, capacitance, voltage, and conductance.

12. A neural network based method, the method implemented on a computer device comprising at least one processor in communication with at least one memory device, the method comprising:
   generating a mathematical model of an analog-to-digital interface for an analog mixed-signal circuit;
   determining a structural definition of a hardware substrate including a plurality of inputs and a plurality of outputs;
   generating a neural network based on the mathematical model of the analog-to-digital interface and the structural definition of the hardware substrate, wherein the neural network includes a plurality of layers and each layer of the plurality of layers includes a plurality of neurons;

programing the hardware substrate with a first plurality of neurons of a first layer of the plurality of layers of the neural network to simulate the mathematical model of the analog-to-digital interface including one or more learning algorithms, wherein the hardware substrate is programmed with a first plurality of weights, a first input vector, and a first output vector from the first layer of the neural network; and subsequently programing the hardware substrate with a second plurality of neurons of a second layer of the neural network to simulate the mathematical model of the analog-to-digital interface, wherein the hardware substrate is programmed with a second plurality of weights, a second input vector, and a second output vector from the second layer of the neural network, wherein the second input vector is based on the first output vector.

13. The method in accordance with claim 12 further comprising training the neural network based on the structural definition of the hardware substrate and at least one optimization constraint.

14. The method in accordance with claim 12 further comprising training the plurality of neurons in the hardware substrate using the one or more learning algorithms and at least one optimization constraint.

15. The method in accordance with claim 14 further comprising training the plurality of neurons based on an ideal quantization function.

16. The method in accordance with claim 14, further comprising training the plurality of neurons to achieve a learned, optimized result based on inputs and outputs.

17. The method in accordance with claim 16, wherein the inputs and outputs are a combination of analog and digital signals.

18. The method in accordance with claim 14, wherein the at least one optimization constraint is at least one of a weight, learning objective, and constraint.

* * * * *